United States Patent
Kim et al.

(10) Patent No.: US 9,214,569 B2
(45) Date of Patent: Dec. 15, 2015

(54) MEMORY DEVICE

(71) Applicants: Ki Jeong Kim, Hwaseong-si (KR); Jung Ik Oh, Seongnam-si (KR); Sung Soo Ahn, Yongin-si (KR); Dae Hyun Jang, Suwon-si (KR)

(72) Inventors: Ki Jeong Kim, Hwaseong-si (KR); Jung Ik Oh, Seongnam-si (KR); Sung Soo Ahn, Yongin-si (KR); Dae Hyun Jang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/467,571

(22) Filed: Aug. 25, 2014

(65) Prior Publication Data

US 2015/0137205 A1 May 21, 2015

(30) Foreign Application Priority Data

Nov. 18, 2013 (KR) .................. 10-2013-0140115

(51) Int. Cl.
*H01L 29/72* (2006.01)
*H01L 29/788* (2006.01)
*H01L 27/115* (2006.01)
*H01L 29/792* (2006.01)

(52) U.S. Cl.
CPC ........ *H01L 29/7889* (2013.01); *H01L 27/1157* (2013.01); *H01L 27/11517* (2013.01); *H01L 27/11563* (2013.01); *H01L 27/11575* (2013.01); *H01L 27/11582* (2013.01); *H01L 29/7926* (2013.01)

(58) Field of Classification Search
USPC ........... 257/296, 314, 319, 329, 390, E27.041
See application file for complete search history.

(56) References Cited

U.S. PATENT DOCUMENTS

| | | | |
|---|---|---|---|
| 7,799,672 B2 | 9/2010 | Hashimoto et al. | |
| 7,936,004 B2 | 5/2011 | Kito et al. | |
| 7,989,880 B2 | 8/2011 | Wada et al. | |
| 8,383,512 B2 | 2/2013 | Chen et al. | |
| 2010/0052042 A1 | 3/2010 | Tanaka et al. | |
| 2010/0207186 A1 | 8/2010 | Higashi et al. | |
| 2010/0248439 A1 | 9/2010 | Chung et al. | |
| 2011/0156132 A1 | 6/2011 | Kiyotoshi | |
| 2012/0061743 A1 | 3/2012 | Watanabe et al. | |
| 2012/0211816 A1 | 8/2012 | Yahashi | |
| 2012/0319173 A1 | 12/2012 | Ko et al. | |
| 2013/0009274 A1* | 1/2013 | Lee et al. | 257/499 |
| 2013/0043509 A1 | 2/2013 | Cho et al. | |
| 2013/0181184 A1* | 7/2013 | Sakuma et al. | 257/5 |
| 2014/0054787 A1* | 2/2014 | Eun et al. | 257/773 |

FOREIGN PATENT DOCUMENTS

| | | |
|---|---|---|
| JP | 2011060958 A | 3/2011 |
| JP | 2012186302 A | 9/2012 |
| KR | 20100107661 A | 10/2010 |
| KR | 20110016338 A | 2/2011 |
| KR | 20130005432 A | 1/2013 |

* cited by examiner

*Primary Examiner* — Jasmine Clark
(74) *Attorney, Agent, or Firm* — Harness, Dickey & Pierce, P.L.C.

(57) ABSTRACT

According to example embodiments, a memory device includes a substrate, a channel region on the substrate, a plurality of gate electrode layers stacked on each other on the substrate, and a plurality of contact plugs. The gate electrode layers are adjacent to the channel region and extend in one direction to define a pad region. The gate electrode layers include first and second gate electrode layers. The contact plugs are connected to the gate electrode layers in the pad region. At least one of the contact plugs is electrically insulated from the from the first gate electrode layer and electrically connected to the second gate electrode layer by penetrating through the first gate electrode layer.

20 Claims, 50 Drawing Sheets

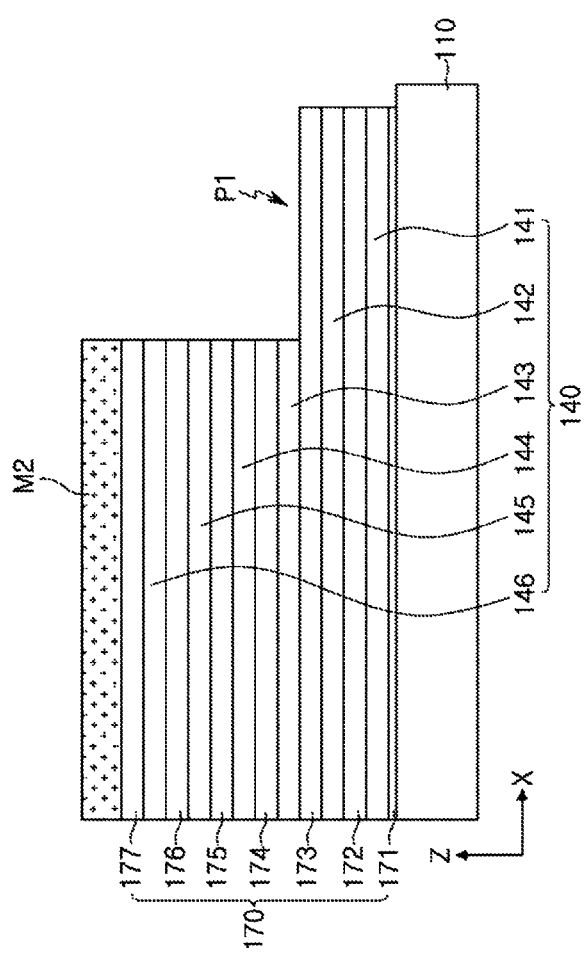

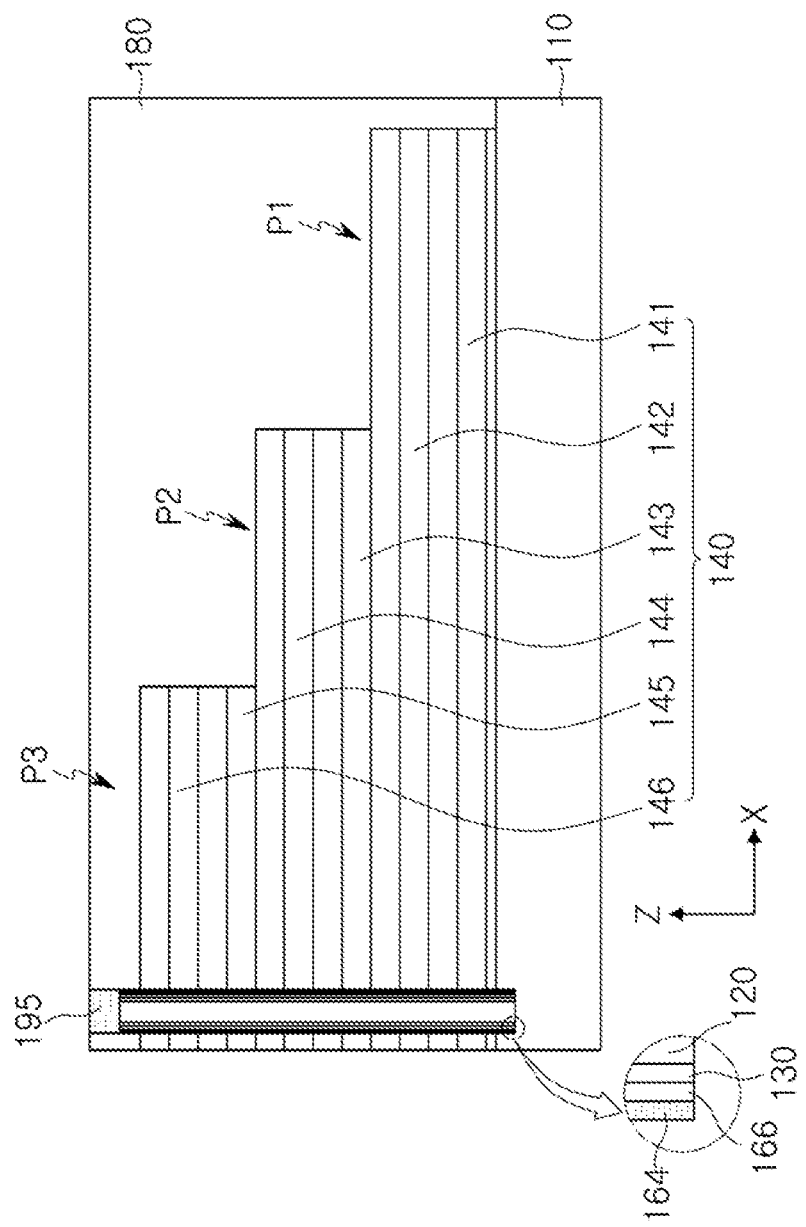

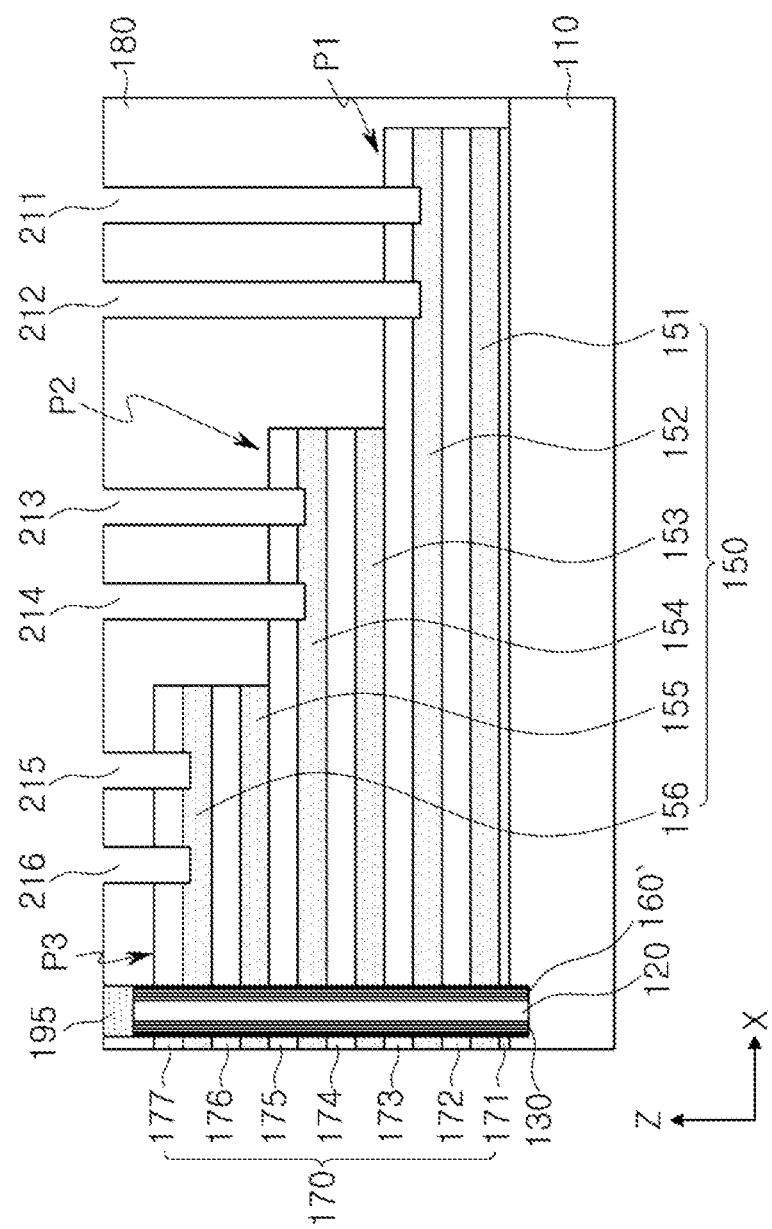

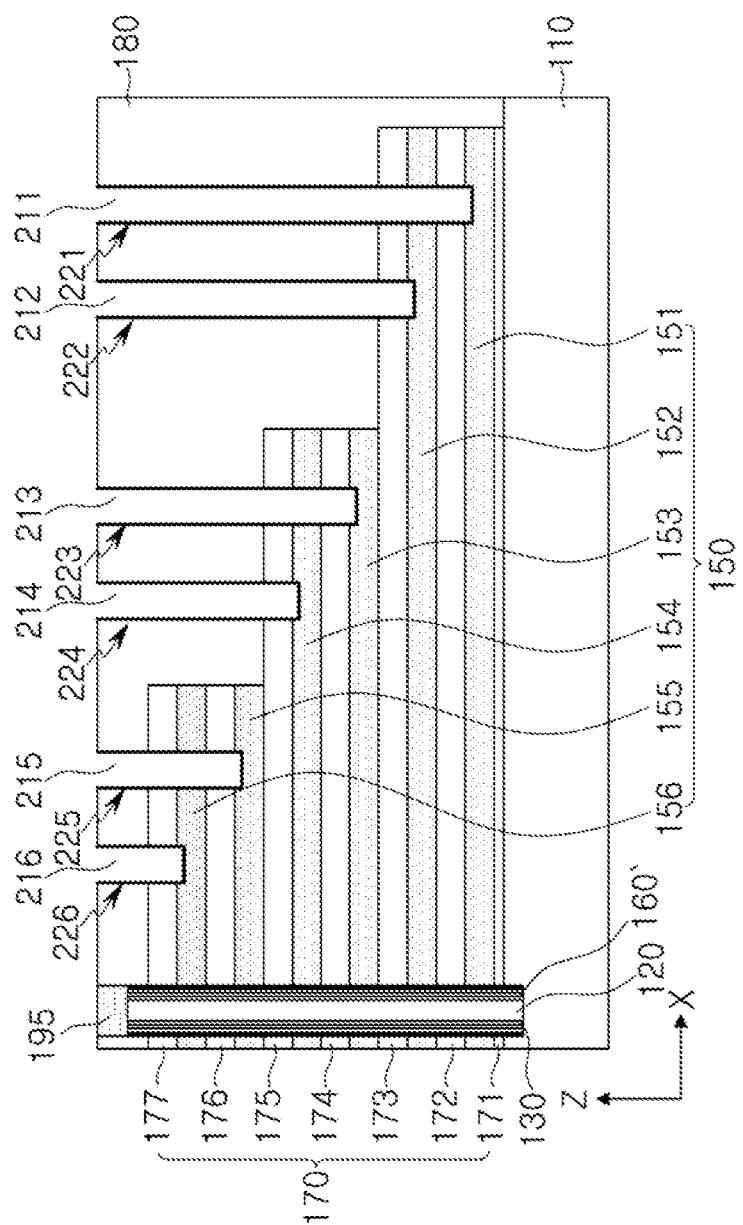

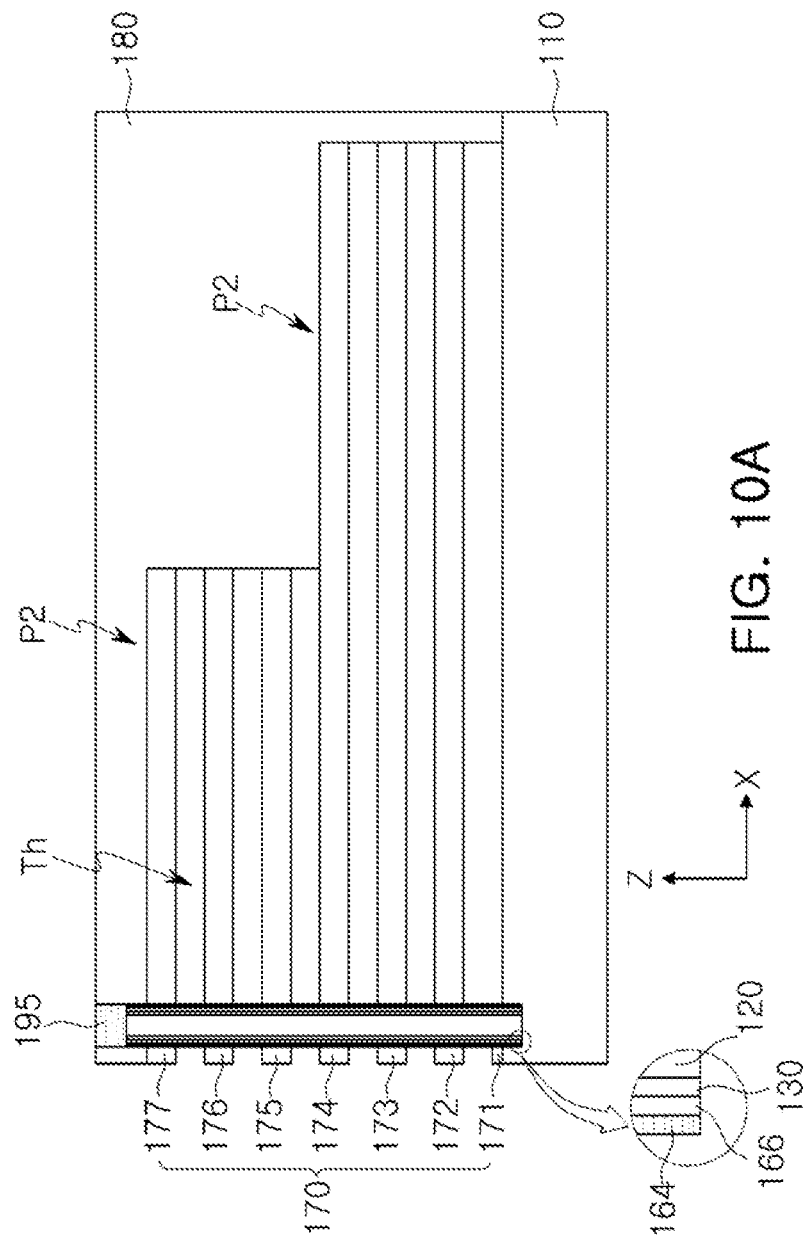

MEMORY DEVICE

CROSS-REFERENCE TO RELATED APPLICATION

This application claims priority under 35 U.S.C. §119 to Korean Patent Application No. 10-2013-0140115 filed on Nov. 18, 2013, with the Korean Intellectual Property Office, the entire disclosure of which is incorporated herein by reference.

BACKGROUND

The present disclosure relates to a memory device.

Electronic products have been miniaturized. In electronic products, high capacity data processing is desirable. Thus, there is a desire to enhance integration of semiconductor memory devices used in electronic products. As one method for enhancing integration of semiconductor memory devices, a memory device may have a vertical transistor structure instead of a planar transistor structure.

SUMMARY

Example embodiments relate to a highly integrated and reliable memory device.

According to example embodiments, a memory device may include: a substrate; a channel region on the substrate, the channel region extending in a direction perpendicular to an upper surface of the substrate; a plurality of gate electrode layers stacked on each other on the substrate, the plurality of gate electrode layers being adjacent to the channel region and extending in one direction to define a pad region, and the plurality of gate electrode layers including first and second gate electrode layers; and a plurality of contact plugs connected to the plurality of gate electrode layers in the pad region. At least one of the plurality of contact plugs is electrically insulated from the first gate electrode layer and electrically connected to the second gate electrode layer by penetrating through the first gate electrode layer.

In example embodiments, the first gate electrode layer may be positioned above the second gate electrode layer.

In example embodiments, the first and second gate electrode layers may extend substantially a same length in the one direction to define the pad region.

In example embodiments, the first and second gate electrode layers may define a single pad region.

In example embodiments, the pad region may include a plurality of pad regions having a stepped structure.

In example embodiments, each of the plurality of pad regions may be defined by a same number of gate electrode layers. The plurality of gate electrode layers in a same pad region may extend substantially a same length in the one direction. The plurality of gate electrode layers in different pad regions may extend different lengths in the one direction.

In example embodiments, an interval between two adjacent contact plugs among the contact plugs connected to the gate electrode layers in a same pad region among the plurality of pad regions may be smaller than an interval between two adjacent contact plugs among the contact plugs connected to the gate electrode layers in different pad regions among the plurality of pad regions.

In example embodiments, the memory device may further include a plug insulating layer surrounding the plurality of contact plugs.

In example embodiments, each one of the plug insulating layers may only surround a lateral surface of a corresponding one of the plurality of contact plugs.

In example embodiments, one of the plug insulating layers may be between the at least one contact plugs and the first gate electrode layer penetrated by the at least one contact plugs.

According to example embodiments, a memory device may include: a substrate; a channel region on a cell array region of the substrate, the channel region extending in a direction perpendicular to an upper surface of a substrate; a plurality of gate electrode layers stacked on each other on the substrate, the plurality of gate electrode layers being adjacent to the channel region, the plurality of gate electrode layers extending one direction over the cell array region to above a connection region of the substrate; and a plurality of pad regions having a stepped structure, the plurality of pad regions being defined by end portions of the plurality of gate electrodes that extend in the one direction above the connection region, each one of the plurality of pad regions being defined by the end portions of the gate electrode layers that are adjacent to each other in the direction perpendicular to the upper surface of the substrate and extend substantially a same length in the one direction; and a plurality of contact plugs connected to the plurality of pad regions of the plurality of gate electrode layers.

In example embodiments, at least two steps in the stepped structure of the plurality of pad regions may have substantially a same height.

In example embodiments, each of the plurality of pad regions may be defined by a same number of the end portions of the plurality of gate electrode layers extending in the one direction.

In example embodiments, steps in the stepped structure of the plurality of pad regions may have different heights.

In example embodiments, each of the plurality of pad regions may be defined by a different number of the end portions of the plurality of gate electrode layers extending in the one direction.

According to example embodiments, a memory device includes: a substrate; channel regions extending vertically on the substrate; gate electrode layers stacked on top of each other on the substrate; and conductive plugs on the substrate. The gate electrode layers are insulated from each other. The gate electrode layers define openings through which the channel regions extend. The gate electrode layers include a first gate electrode layer and a second gate electrode layer that have portions extending a first distance from a same one of the channel regions. The conductive plugs include a first conductive plug electrically connected to the portion of the first gate electrode layer. The first conductive plug extends vertically through the portion of the second gate electrode layer. The first conductive plug is insulated from the second gate electrode layer.

In example embodiments, the memory device may further include bit lines connected to the channel regions and crossing over the gate electrode layers, connection lines connected to the conductive plugs and crossing over the gate electrode layers, tunneling layers surrounding the channel regions, electric charge storage layers surrounding the tunneling layers in the openings defined by the gate electrode layers, and blocking layers surrounding the electric charge storage layers or the gate electrode layers.

In example embodiments, the gate electrode layer may further include a third gate electrode layer on the second gate electrode layer and a fourth gate electrode layer on the third gate electrode layer. A portion of the fourth gate electrode layer may extend a second distance from the same one of the channel regions. A portion of the third gate electrode layer may extend one of the first and second distances from the same one of the channel regions. The second distance may be less than the first distance. The conductive plugs may include second to fourth conductive plugs electrically connected to the portions of the second to fourth gate electrode layers, respectively.

In example embodiments, the portion of the third gate electrode layer may extend the second distance from the same one of the channel regions. The third conductive plug may extend vertically through the portion of the fourth gate electrode layer. The third conductive plug may be electrically insulated from the fourth gate electrode layer.

In example embodiments, the gate electrode layers may include a lowermost gate electrode layer between the first gate electrode layer and the substrate. The lowermost gate electrode layer may extend further from the same one of the channel regions than the first distance.

BRIEF DESCRIPTION OF DRAWINGS

The above and other aspects, features and other advantages of example embodiments will be more clearly understood from the following detailed description of non-limiting embodiments, as illustrated in the accompanying drawings, in which like reference parts refer to like parts throughout the different views. The drawings are not necessarily to scale, emphasis instead being placed upon illustrating principles of inventive concepts. In the drawings:

FIGS. 10A through 10J are cross-sectional views illustrating a method of manufacturing the memory device illustrated in FIG. 6 according to example embodiments;

DETAILED DESCRIPTION

Figure 1:
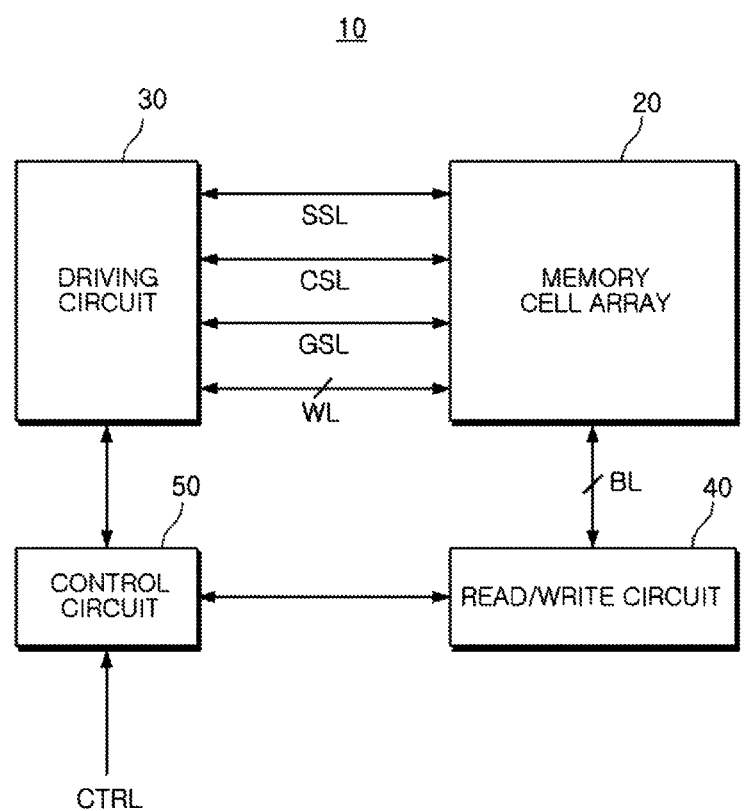
FIG. 1 is a block diagram schematically illustrating a memory device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram schematically illustrating a memory device according to example embodiments.

Referring to FIG. 1, a memory device 10 according to example embodiments may include a memory cell array 20, a driving circuit 30, a read/write circuit 40, and a control circuit 50. For example, the memory device 10 may be a non-volatile memory device.

The memory cell array 20 may include a plurality of memory cells, and the plurality of memory cells may be arranged in a plurality of columns and rows. The plurality of memory cells included in the memory cell array 20 may be connected to the driving circuit 30 through at least one common source line CSL, at least one string select line SSL, at least one ground select line GSL, or the like, and may be connected to the read/write circuit 40 through at least one bit line BL. In example embodiments, a plurality of memory cells arranged in the same row may be connected to the same word line WL, and a plurality of memory cells arranged in the same column may be connected to the same bit line BL.

The plurality of memory cells included in the memory cell array 20 may be divided into a plurality of memory blocks. Each of the memory blocks may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. In example embodiments, the driving circuit 30 may receive address information from the outside, decode the received address information, and select at least a portion of word lines WL, common source lines CSL, string source lines SSL, and ground select lines GSL connected to the memory cell array 20. The driving circuit 30 may include a driving circuit with respect to each of the word line WL, the string select line SSL, and the common source line CSL.

The read/write circuit 40 may select a bit line BL connected to the memory cell array 20 according to a command received from the control circuit 50. The read/write circuit 40 may read out data stored in a memory cell connected to the selected bit line BL or write data into the memory cell connected to the selected bit line BL. In order to perform the foregoing operation, the read/write circuit 40 may include circuits such as a page buffer, an input/output buffer, a data latch, and the like.

The control circuit 50 may control operations of the driving circuit 30 and the read/write circuit 40 in response to a control signal CTRL transmitted from the outside. In case of reading data stored in the memory cell array 20, the control circuit 50 may drive an operation of the driving circuit 30 to supply a voltage for a reading operation to a word line storing data desired to be read. When the voltage for a reading operation is supplied to a particular word line WL, the control circuit 50 may control the read/write circuit 40 to read out data stored in a memory cell connected to the word line WL to which the voltage for a reading operation has been supplied.

Meanwhile, in case of writing data to the memory cell array 20, the control circuit 50 may control an operation of the driving circuit 30 to supply a voltage for a write operation to a word line in which data is desired to be written. When the voltage for a write operation is supplied to a particular word line WL, the control circuit 50 may control the read/write circuit 40 to write data to a memory cell connected to the word line WL to which the voltage for a write operation has been applied.

Figure 2:
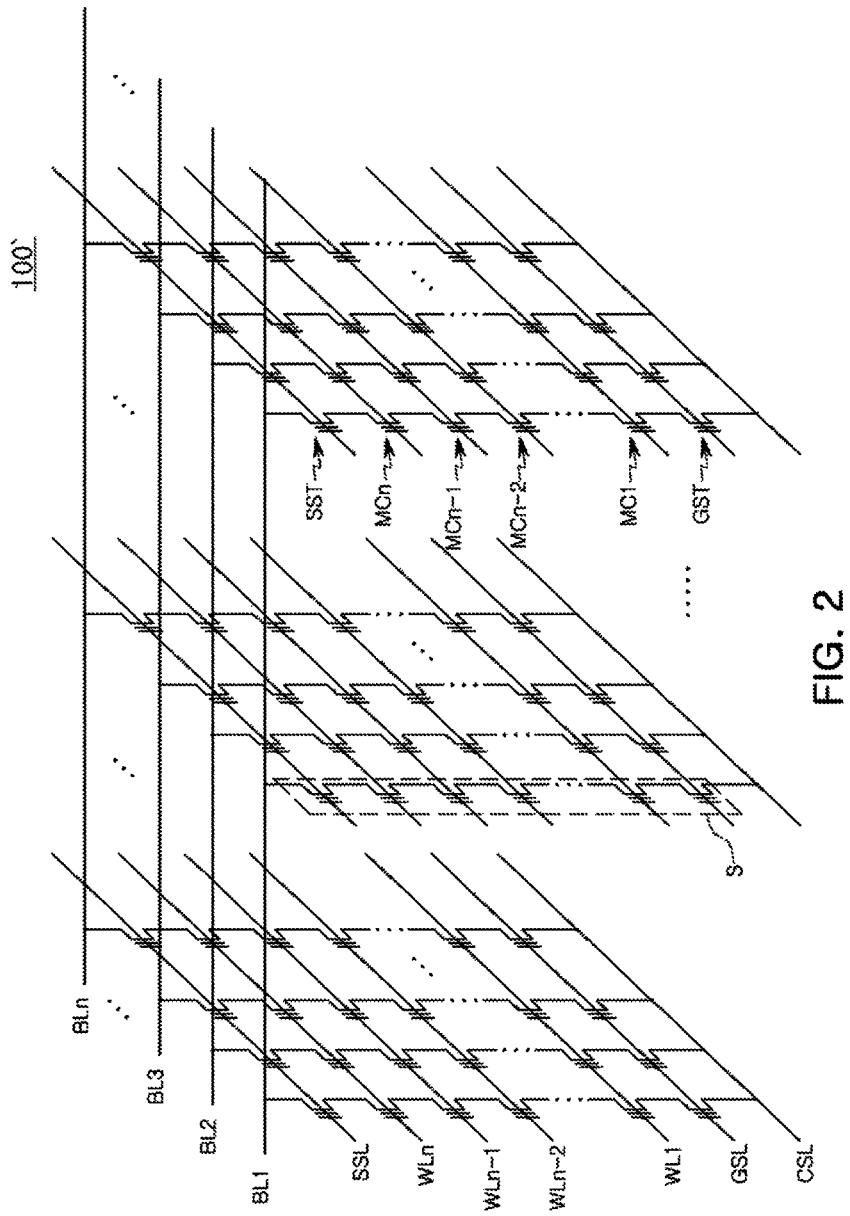
FIG. 2 is a circuit diagram illustrating a memory cell array of a memory device according to example embodiments.

FIG. 2 is an equivalent circuit diagram illustrating a three-dimensional (3D) structure of a memory cell array included in a memory device 100' according to example embodiments. Referring to FIG. 2, in example embodiments, the memory cell array may include a plurality of memory cell strings. Each string may include n number of memory cells MC1 to MCn connected in series, and a ground select transistor GST and a string select transistor SST connected to both ends of the memory cells MC1 to MCn. In each string S, the memory cells MC1 to MCn may be stacked on top of each other between the ground select transistor GST and the string select transistor SST.

The n number of memory cells MC1 to MCn may each be connected to a corresponding one of the word lines WL1 to WLn, respectively, for selecting the memory cells MC1 to MCn.

A gate terminal of the ground select transistor GST may be connected to the ground select line GSL, and a source terminal thereof may be connected to the common source line CSL. Meanwhile, a gate terminal of the string select transistor SST may be connected to the string select line SSL, and a source terminal thereof may be connected to a drain terminal of the memory cell MCn. In FIG. 2, a structure in which the single ground select transistor GST and the single string select transistor SST are connected to the n number of memory cells MC1 to MCn connected in series is illustrated, but alternatively, a plurality of ground select transistors GST and/or a plurality of string select transistors SST may be connected to the n number of memory cells MC1 to MCn. Additionally, although FIG. 2 illustrates four memory cells MC1 to MCn in each string S, example embodiments are not limited thereto. The number of memory cells MC1 to MCn may alternatively be greater or less than four.

Drain terminals of the string select transistors SST may be connected to the bit lines BL1 to BLm. When a signal is applied to the gate terminal of a selected string select transistor SST through a selected string select line SSL, a signal applied through the selected bit line (e.g., one of BL1 to BLm) may be delivered to the n number of memory cells MC1 to MCn connected in series to execute a data read or write operation. Also, the ground select transistors GST may have source terminals connected to the common source line CSL. By applying a signal to the gate terminals of the ground select transistor GSTs, an erase operation to remove all of electric charges stored in the n number of memory cells MC1 to MCn may be executed.

Figure 3:
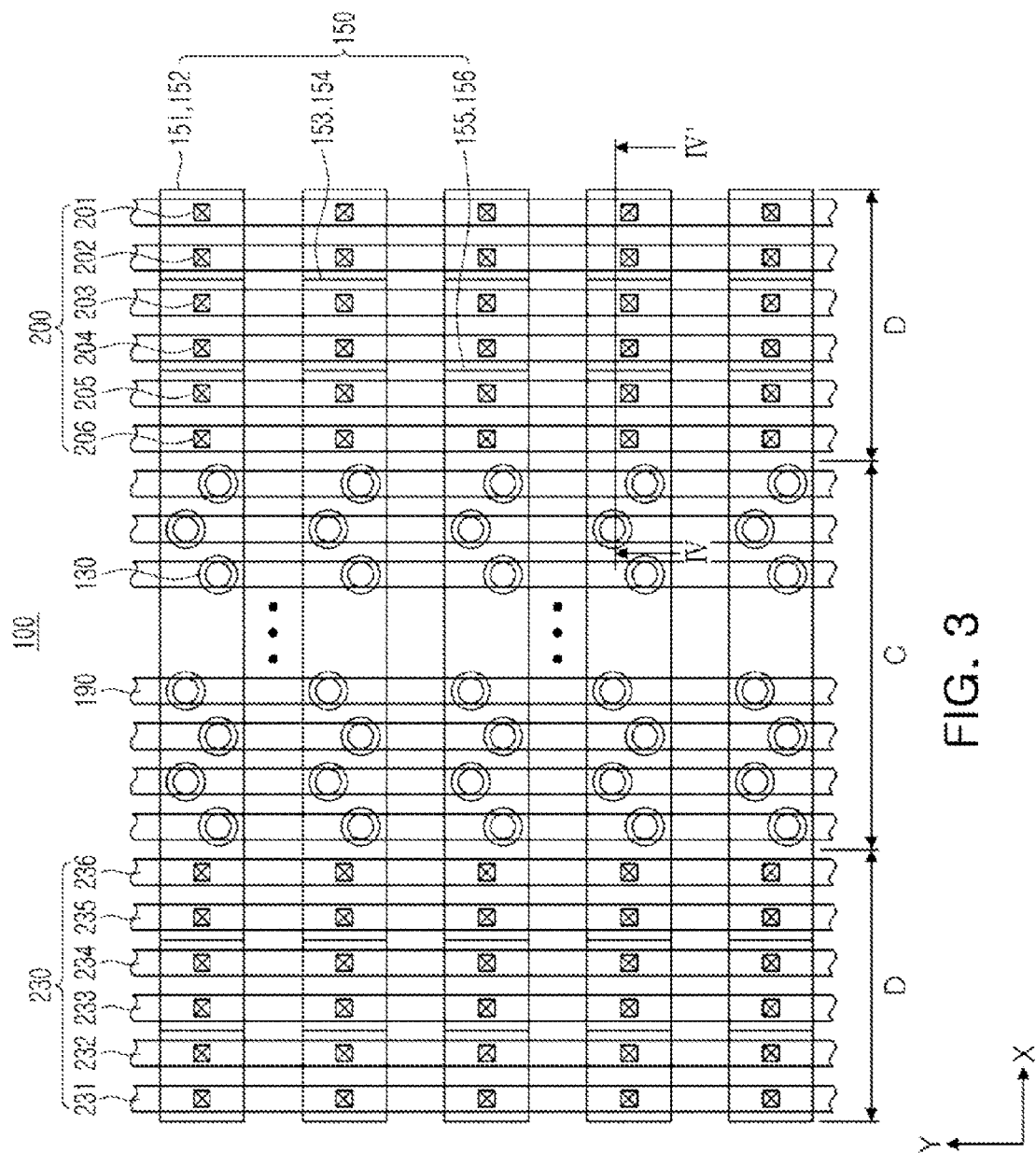
FIG. 3 is a plan view illustrating a structure of a memory device according to example embodiments.

FIG. 3 is a plan view illustrating a structure of a memory device according to example embodiments.

Referring to FIG. 3, a memory device 100 according to example embodiments may include a cell array region C and connection regions D, and peripheral circuit regions may be provided on the outside of the connection regions D.

In the cell array region C, a plurality of memory cells, a plurality of bit lines 190 electrically connected to the memory cells, and a plurality of gate electrode layers 151 to 156 (150) may be disposed. The plurality of gate electrode layers 150 include a conductive material, so the plurality of gate electrode layers 150 may also be referred to as conductive lines in the present disclosure. The plurality of gate electrode layers 150 may extend in one direction, and, in FIG. 3, the plurality of gate electrode layers 150 are illustrated as extending in an x-axis direction. The plurality of bit lines 190 may extend in a different direction perpendicular to the one direction in which the plurality of gate electrode layers 150 extend, and in FIG. 3, the plurality of bit lines 190 are illustrated as extending in a y-axis direction perpendicular to the x-axis direction.

The plurality of gate electrode layers 150 may be stacked in a z-axis direction perpendicular to an x-y plane to form word lines. A portion of gate electrode layers 150 disposed at the same height in the z-axis direction may be electrically connected to each other by a plurality of connection lines 231 to 236 (230). In order to connect a portion of the gate electrode layers 150 disposed at the same height in the z-axis direction by the connection lines 230, a plurality of contact plugs 201 to 206 (200) extending in the z-axis direction may be provided.

A plurality of channel regions 130 may be disposed in the plurality of gate electrode layers 150 in a zigzag form, and each channel region 130 may be electrically connected to a corresponding one of the bit lines 190. By disposing the plurality of channel regions 130 in the gate electrode layer 150 in a zigzag form, the number of channel regions 130 disposed in the gate electrode layer 150 may be increased.

The connection region D is disposed between the cell array region C and a peripheral circuit region. A plurality of gate electrode layers 150 extending in one direction (x-axis direction) may be disposed in the connection region D. Lengths of the plurality of gate electrode layers 150 extending in one direction may be gradually decreased by a desired (and/or alternatively predetermined) amount progressing from a group of gate electrode layers 151 and 152 positioned at a lowermost portion in the z-axis direction perpendicular to the x-y plane toward a group of gate electrode layers 155 and 156 at an uppermost portion therein. Since the gate electrode layers 150 are gradually decreased in length from the group of the lowermost gate electrode layers 151 and 152 to the group of the uppermost gate electrode layers 155 and 156 in one direction, each group of the gate electrode layers 150 may form a step with an adjacent group of gate electrode layers 150. The number of gate electrode layers 150 included in a group in which the gate electrode layer 150 have the same length may be varied.

Namely, portions of the plurality of gate electrode layers 150 may each extend in one direction (x-axis direction) at a substantially same length, and form steps. As illustrated in FIG. 3, the first and second gate electrode layers 151 and 152 may extend in one direction at the substantially same length, the third and fourth gate electrode layers 153 and 154 may extend in one direction at the substantially same length, and the fifth and sixth gate electrode layers 155 and 156 may extend in one direction at the substantially same length.

A peripheral circuit region is disposed outside of the connection region D. Circuits for driving the memory cells, circuits for reading information stored in the memory cells, and the like, may be disposed in the peripheral circuit region.

FIGS. 4 through 7 are perspective views illustrating structures of a memory device according to example embodiments.

Figure 4:
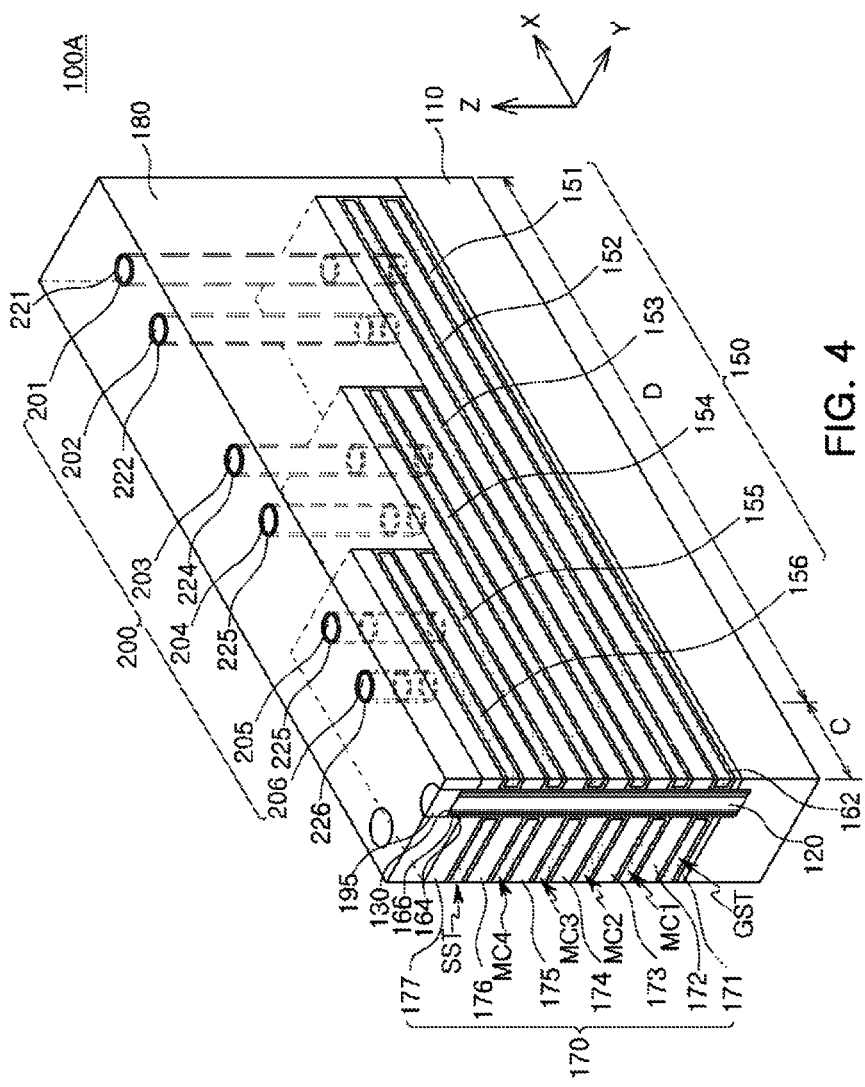
FIGS. 4 through 7 are perspective views illustrating structures of a memory device according to example embodiments.

FIG. 4 is a perspective view illustrating a memory device 100A. For example, FIG. 4 is a view illustrating a portion taken along line IV-IV' in FIG. 3. A portion of the components included in the memory cell of FIG. 3 may be omitted in FIG. 4. For example, the bit lines 190 and the connection lines 230 are omitted in FIG. 4.

Referring to FIG. 4, the memory device 100A may include a plurality of gate electrode layers 151 to 156 (150) stacked on an upper surface of the substrate 110 in the z-axis direction and a plurality of insulating layers 171 to 177 (170) disposed between gate electrode layers 150. The plurality of gate electrode layers 150 and the plurality of insulating layers 170 may extend in one direction (x-axis direction). The cell array region C may further include a channel region 130 extending in the z-axis direction, in addition to the plurality of gate electrode layers 150 and the plurality of insulating layers 170. The channel region 130 may be formed within a cavity having a circular cross-section, and a buried insulating layer 120 may be disposed within the channel region 130. A conductive layer 195 may be provided on the channel region, and the bit lines 190 (please refer to FIG. 3) and the channel region 130 may be connected through the conductive layer 195.

A gate insulating layer may be disposed between the channel region 130 and the gate electrode layers 150. The gate insulating layer may include a tunneling layer 166, an electric charge storage layer 164, a blocking layer 162, and the like. According to a structure of the memory device 100, all of the tunneling layer 166, the electric charge storage layer 164, and the blocking layer 162 may be disposed to surround the gate electrode layer 150, or a portion thereof may be disposed outside of the channel region 130 and the rest may be disposed to surround the gate electrode layers 150. In FIG. 4, it is illustrated that the tunneling layer 166 and the electric charge storage layer 164 are disposed outside of the channel region 130 and that the blocking layer 162 is disposed to surround the gate electrode layers 150. The tunneling layer 166 may be between the channel region 130 and the electric charge storage layer 164.

The tunneling layer 166 may include a dielectric material. The tunneling layer 166 may include at least one of a silicon oxide ($SiO_2$), a silicon nitride ($Si_3N_4$), a silicon oxynitride (SiON), a hafnium oxide ($HfO_2$), a hafnium silicon oxide ($HfSi_xO_y$), an aluminum oxide ($Al_2O_3$), and a zirconium oxide ($ZrO_2$).

The electric charge storage layer 164 may be an electric charge trap layer or a floating gate conductive film. In the case in which the electric charge storage layer 164 is a floating gate conductive film, it may be formed by depositing polysilicon through low pressure chemical vapor deposition (LPCVD), for example. In the case in which the electric charge storage layer 164 is an electric charge trap layer, the electric charge trap layer may include an insulating material such as at least one of a silicon oxide ($SiO_2$), a silicon nitride ($Si_3N_4$), a silicon oxynitride (SiON), a hafnium oxide (HfO$_2$), a zirconium oxide (ZrO$_2$), a tantalum oxide (Ta$_2$O$_3$), a titanium oxide (TiO$_2$), a hafnium aluminum oxide (HfAl$_x$O$_y$), a hafnium tantalum oxide (HfTa$_x$O$_y$), a hafnium silicon oxide (HfSi$_x$O$_y$), an aluminum nitride (Al$_x$N$_y$), and an aluminum gallium nitride (AlGa$_x$N$_y$).

The blocking layer 162 may be a dielectric layer that includes at least one of a silicon oxide (SiO$_2$), a silicon nitride (Si$_3$N$_4$), a silicon oxynitride (SiON), and a high-k dielectric material. The high-k dielectric material may be any one of an aluminum oxide (Al$_2$O$_3$), a tantalum oxide (Ta$_2$O$_3$), a titanium oxide (TiO$_2$), an yttrium oxide(Y$_2$O$_3$), a zirconium oxide (ZrO$_2$), a zirconium silicon oxide (ZrSi$_x$O$_y$), a hafnium oxide (HfO$_2$), a hafnium silicon oxide (HfSi$_x$O$_y$), a lanthanum oxide (La$_2$O$_3$), a lanthanum aluminum oxide (LaAl$_x$O$_y$), a lanthanum hafnium oxide (LaHf$_x$O$_y$), a hafnium aluminum oxide (HfAl$_x$O$_y$), and a praseodymium oxide (Pr$_2$O$_3$). A material included in the blocking layer 162 may have high dielectric constant k compared to the tunneling layer 166, and the blocking layer 162 may selectively include a plurality of layers having different dielectric constants. In this case, by disposing a layer having relatively low dielectric constant k such that it is closer to the channel region 130 than a layer having high dielectric constant k is, an energy band having a height as high as that of a barrier may be adjusted to improve the characteristics (e.g., erase characteristics) of the memory device.

The gate electrode layers 150 and insulating layers 170 stacked at different positions in the z-axis direction have different lengths in the x-axis direction, forming a plurality of steps having a stair shape in the connection region D. Due to the steps formed as the plurality of gate electrode layers 150 extend to have different lengths in the x-axis direction, a plurality of pad regions may be provided in the connection region D. In FIG. 4, it is illustrated that the insulating layers 170 are positioned above the gate electrode layers 150 in the z-axis direction in each pad region, but, conversely, the gate electrode layers 150 may be positioned above the insulating layers 170.

In example embodiments, a portion of the gate electrode layers 150 adjacent in the direction (z-axis direction) in which the channel region 130 extends may extend to have the same length in one direction (x-axis direction) to provide one of a plurality of pad regions. As illustrated in FIG. 4, the lowermost pad region in the z-axis direction may be provided by the mutually adjacent first and second gate electrode layers 151 and 152 extending to have the same length in one direction, a middle pad region may be provided by the third and fourth gate electrode layers 153 and 154 extending to have the same length in one direction, and the uppermost pad region may be provided by the fifth and sixth gate electrode layers 155 and 156 extending to have the same length in one direction. Namely, since the same number of gate electrode layers (two gate electrode layers in FIG. 4) 150 extend in one direction to provide the pad regions, steps between the respective pad regions may have the substantially same height.

A plurality of contact plugs 201 to 206 (200) may be provided in respective pad regions. The plurality of contact plugs 200 may penetrate through connection region insulating layers 180 and the insulating layers 170 to be electrically connected to the gate electrode layers 150. The plurality of contact plugs 200 may extend in the z-axis direction and may include a material having excellent conductivity, like the gate electric layers 150. For example, the plurality of contact plugs 200 may include a material identical to that of the gate electrode layers 150, and the plurality of contact plugs 200 formed in the same positions in the x-axis direction may be electrically connected by the connection lines 231 to 236 (230) illustrated in FIG. 3.

In order to form the plurality of contact plugs 200 in the connection region D, an etching process needs to be performed on the plurality of insulating layers 170 and the connection region insulating layers 180 after the formation of the plurality of pad regions. A plurality of vertical openings are formed to extend in the z-axis direction through the etching process, and the contact plugs 200 may be formed by filling up the plurality of vertical openings with a conductive material.

Figure 8A:
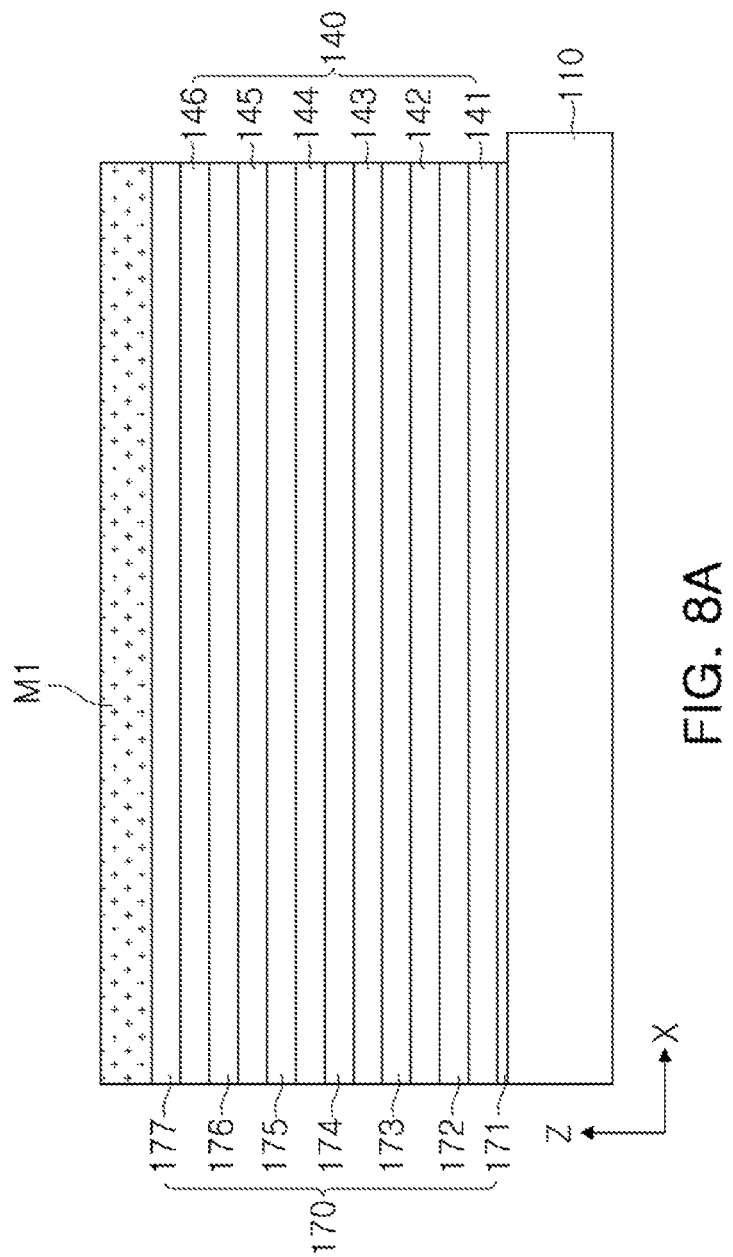
FIGS. 8A through 8O are cross-sectional views illustrating a method of manufacturing the memory device illustrated in FIG. 4 according to example embodiments.

Unlike a general case in which each pad region is provided by a step between one gate electrode layer and another gate electrode layer adjacent thereto, in example embodiments, at least one of the plurality of pad regions may be provided by a plurality of gate electrode layers. Thus, in forming the contact plugs 200, a process to form the contact plugs 200 such that they have different lengths in the z-axis direction may be used. FIGS. 8A through 8O are cross-sectional views illustrating a method of manufacturing the memory device in FIG. 4 according to example embodiments.

Also, in example embodiments, since one pad region is provided by two or more gate electrode layers 150 extending in one direction to have the same length, two or more contact plugs 200 may be connected to two or more gate electrode layer 150, respectively, in one pad region. Referring to FIG. 4, two contact plugs 200 may be electrically connected to two gate electrode layers 150 in each pad region. As illustrated in FIG. 4, contact plugs 201, 203, and 205 may penetrate through gate electrode layers 152, 154, and 156. In order to insulate the contact plugs 201, 203, and 205 from the gate electrode layer 152, 154, and 156, plug insulating layers 221 to 226 may be disposed in the connection region D. The plug insulating layers 221-226 may be disposed to surround the entirety or a portion of outer circumferential surfaces of the contact plugs 200, and may be disposed to expose lower surfaces of the contact plugs 200. According to example embodiments, the plug insulating layers 221-226 may be disposed only between the partial gate electrode layers 152, 154, and 156 and the partial contact plugs 201, 203, and 205 penetrating through the partial gate electrode layers 152, 154, and 156.

Figure 13:
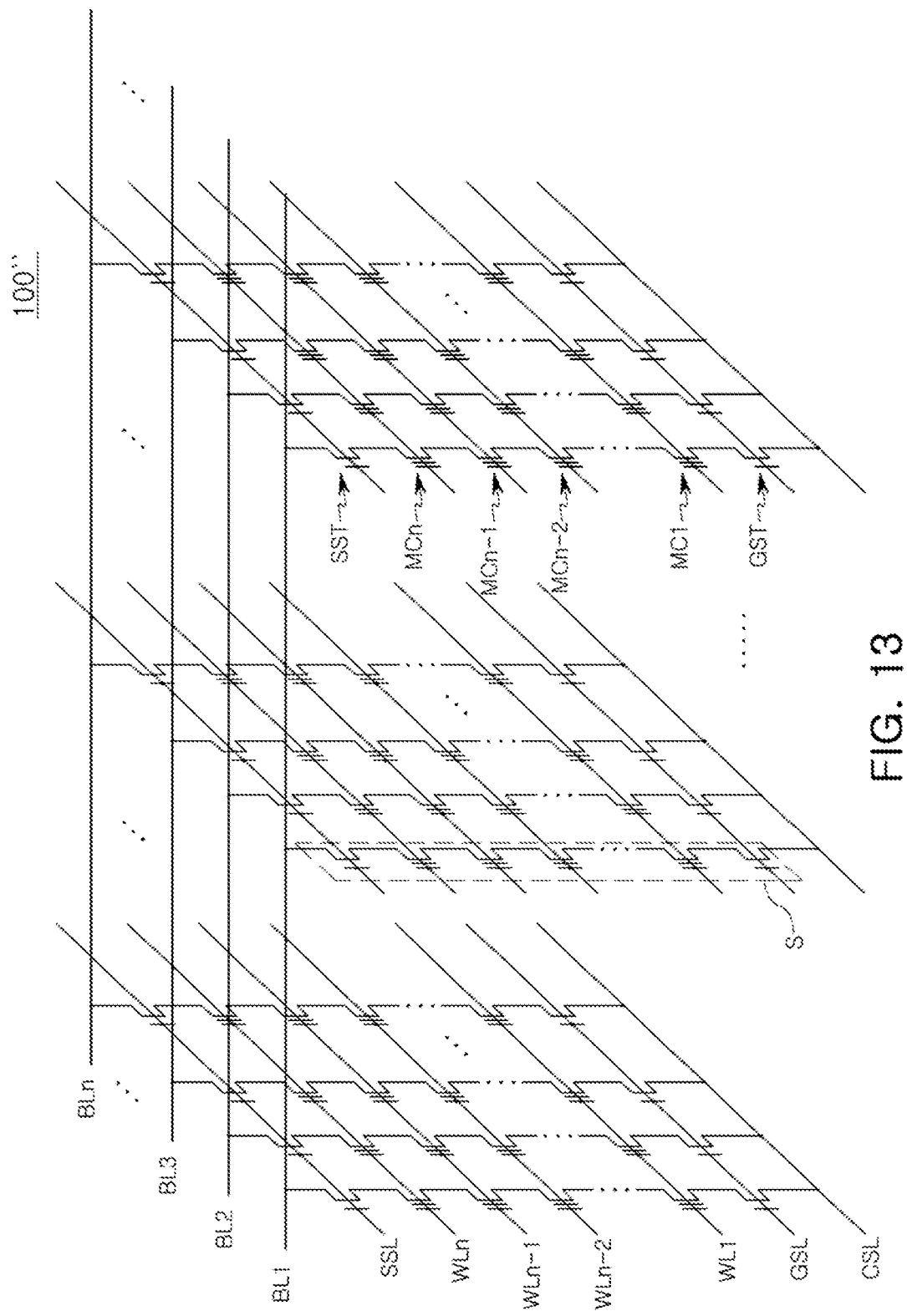
FIG. 13 is a circuit diagram illustrating a memory cell array of a memory device according to example embodiments.
Figure 14:
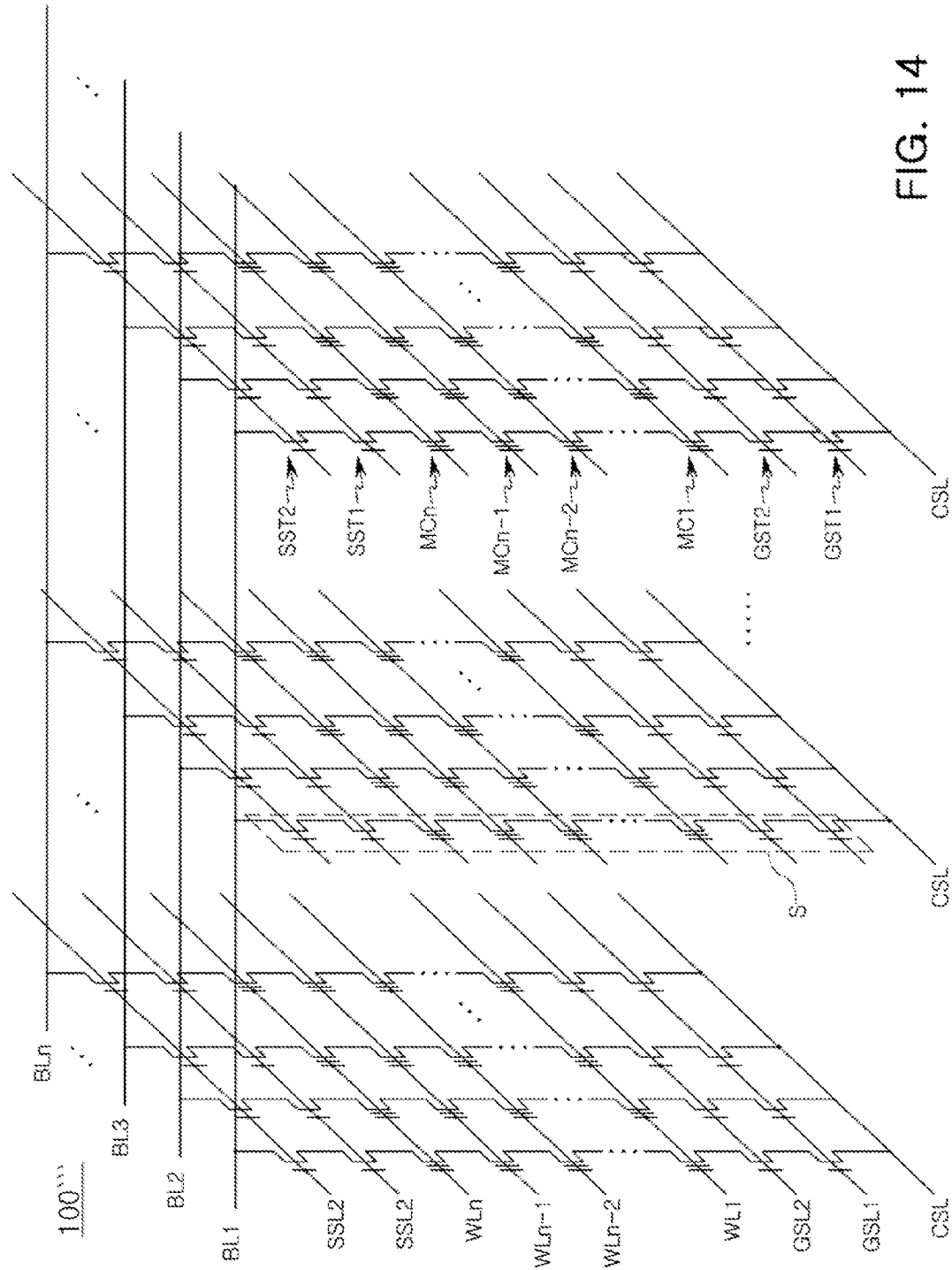
FIG. 14 is a circuit diagram illustrating a memory cell array of a memory device according to example embodiments.

Meanwhile, in FIG. 4, it is illustrated that four memory cells MC1 to MC4, a single string select transistor SST, and a ground select transistor GST are provided, but this is merely a non-limiting example and the number of memory cells and the number of the string select transistors SST and the ground select transistors GST may be greater or fewer. For example, FIG. 14 is a circuit diagram illustrating a memory cell array 100''' of a memory device according to example embodiments. For example, as shown in FIG. 14, each string S may include a first ground select transistor GST1, a second ground select transistor GST2, and first string select transistor SST1 and a second string select transistor SST2. The first and second ground select transistors GST1 and GST2 may have the same structure or different structure than the memory cells MC1 to MCn. Similarly, the first and second string select transistors SST1 and SST2 may have the same structure or different structure than the memory cells MC1 to MCn Also, in FIGS. 2 and 4, it is illustrated that the memory cells MC1 to MC4, the string select transistor SST, and the ground select transistor GST have the same structure, but the string select transistor SST and the ground select transistor GST may have different structures than the memory cells MC1 to MC4. For example, FIG. 13 is a circuit diagram illustrating a memory cell array 100'' of a memory device according to example embodiments. As shown in FIG. 13, the ground select transistor GST and string select transistor GST may have structures without the floating gate in the memory cells MC1 to MCn. In other words, in example embodiments, the tunneling layer 166 and the electric charge storage layer 164 may be arranged to not extend between the channel region 130 and the gate electrode layers (e.g., 151 and 156) of the ground select transistor GST and string select transistor GST.

Figure 5:
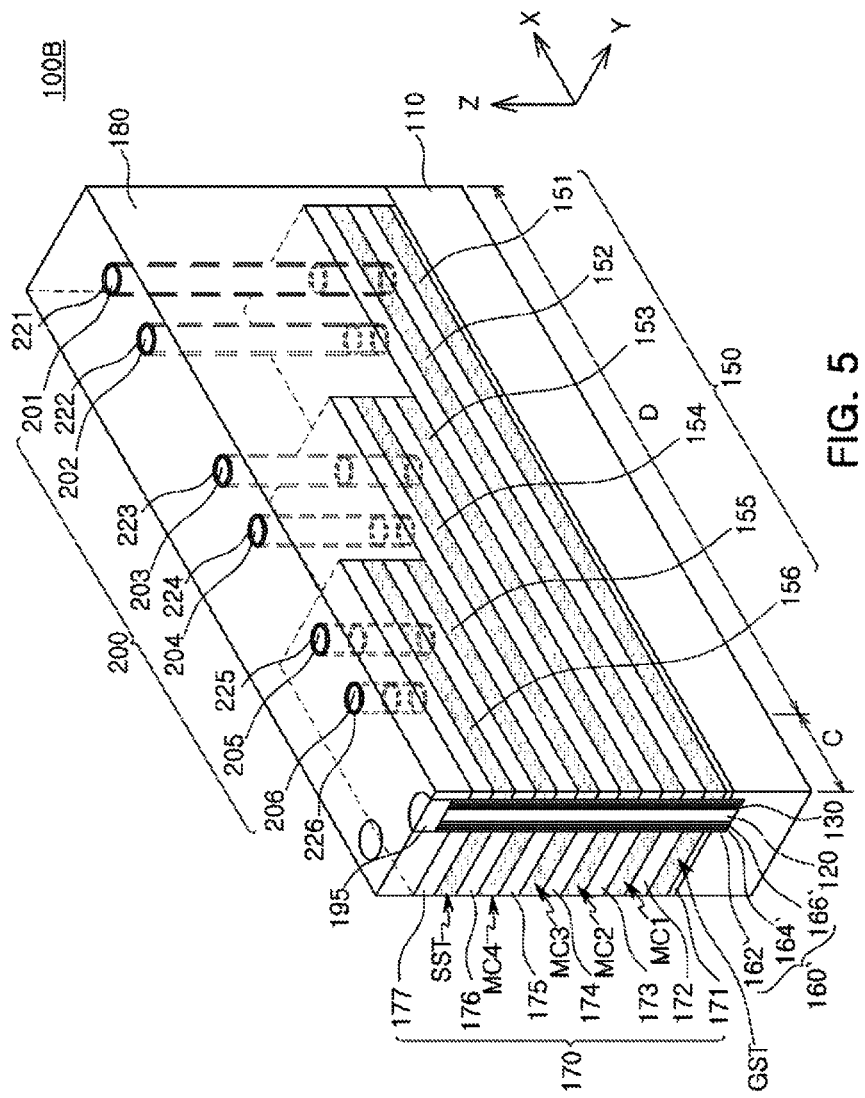

FIG. 5 is a perspective view illustrating a memory device 100B according to example embodiments, different from that of FIG. 4. Referring to FIG. 5, in the memory device 100B, a channel region 130, memory cells MC1 to MC4, a string select transistor SST, a ground select transistor GST, and steps, a plurality of pad regions and a plurality of contact plugs 200 connected to a plurality of gate electrode layers 150 in a connection region D, are identical to those of FIG. 4. However, in FIG. 5, all of a blocking layer 162', an electric charge storage layer 164', and a tunneling layer 166' included in a gate insulating layer 160' may extend in the z-axis direction parallel to the channel region 130. Also, the plurality of gate electrode layers 150 are stacked with a plurality of insulating layers 170 during a manufacturing process, and thus, a process such as removing a sacrificial layer after the formation of the channel region 130, or the like, may be omitted. The difference in the manufacturing processes will be described in detail with reference to FIGS. 9A through 9N.

Similar to FIG. 4, referring to FIG. 5, a portion of gate electrode layers 150 adjacent to each other in the z-axis direction may extend to have the same length in the x-axis direction in order to provide a plurality of pad regions in the connection region D. Namely, the first and second gate electrode layers 151 and 152 may extend in the x-axis direction to have the same length to provide a pad region, the third and fourth gate electrode layers 153 and 154 may extend in the x-axis direction to have the same length to provide a pad region, and the fifth and sixth gate electrode layers 155 and 156 may extend in the x-axis direction to have the same length to provide a pad region. Two gate electrode layers 150 may be electrically connected to two contact plugs 200 in each pad region.

As described above with reference to FIG. 4, the contact plugs 201, 203, and 205 may penetrate through the gate electrode layers 152, 154, and 156. Thus, in order to insulate the contact plugs 201, 203, and 205 from the gate electrode layer 152, 154, and 156, plug insulating layers 221-226 may be disposed in the connection region D. The plug insulating layers 221-226 may be disposed on all of outer circumferential surfaces of the contact plugs 200. According to example embodiments, the plug insulating layers 221-226 may be disposed only on outer circumferential surfaces of the partial contact plugs 201, 203, and 205 penetrating through the partial gate electrode layers 152, 154, and 156. Alternatively, the plug insulating layers 221-226 may be formed only in a partial region between the partial contact plugs 201, 203, and 205 and the partial gate electrode layers 152, 154, and 156.

Figure 6:
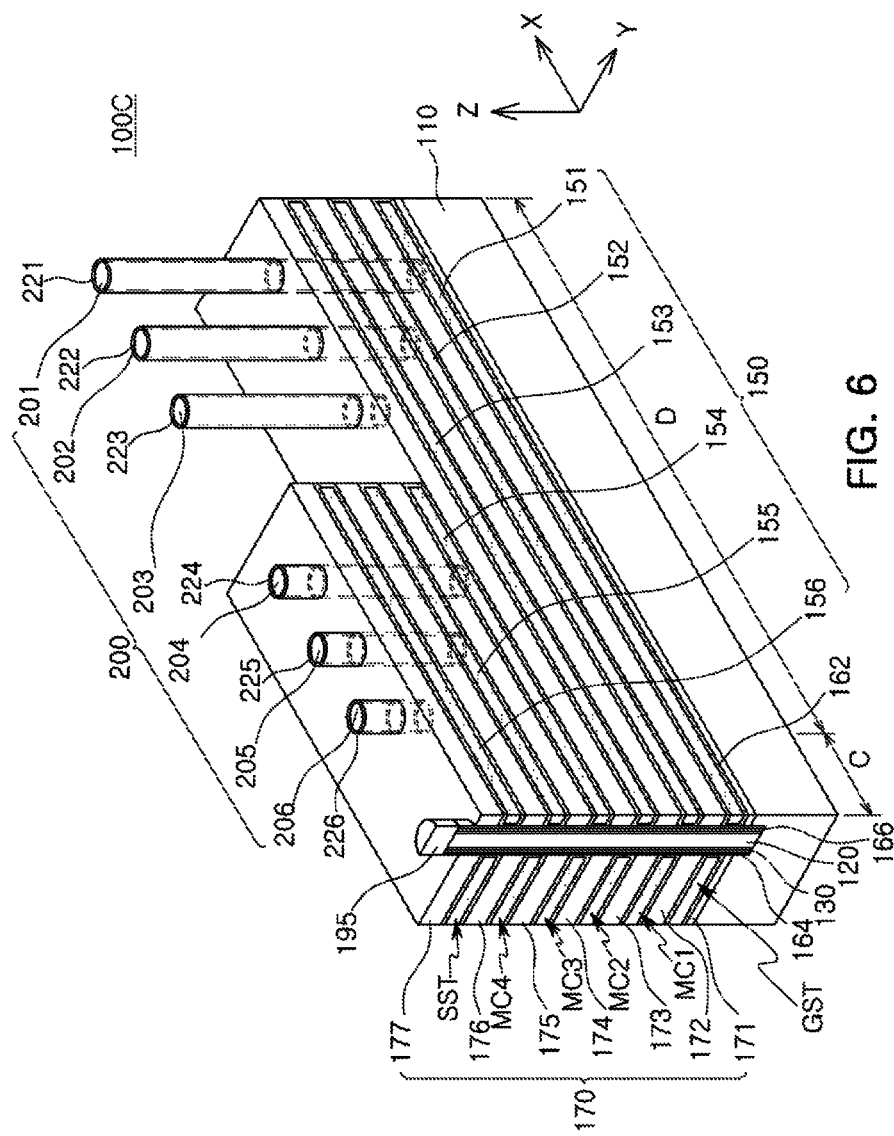

FIG. 6 is a perspective view illustrating a memory device 100C according to example embodiments. In FIG. 6, the connection region insulating layer 180 illustrated in FIGS. 4 and 5 is omitted to clarify a connection structure between a plurality of contact plugs 200 and a plurality of gate electrode layers 150.

Referring to FIG. 6, the memory device 100C according to example embodiments may include the plurality of gate electrode layers 150 and the plurality of insulating layers 170 alternately stacked on an upper surface of a substrate 100 in the z-axis direction. A cavity penetrating through the plurality of gate electrode layers 150 and the insulating layers 170 to reach the substrate 110 within the cell array region C may be provided in the z-axis direction, and a channel region 130 may be provided within the penetrating cavity.

Each of the plurality of gate electrode layers 150 and the insulating layers 170 may extend to have different lengths in the x-axis direction to form a step. In example embodiments, a portion of the gate electrode layers 150 adjacent to each other in the z-axis direction may extend to have the same length in the x-axis direction. Namely, first to third gate electrode layers 151, 152, and 153 may extend to have the same length in the x-axis direction, and fourth to sixth gate electrode layers 154, 155, and 156 may extend to have the same length in the x-axis direction, forming two pad regions.

Since one pad region is formed by three gate electrode layers 150, three gate electrode layers 150 and three contact plugs 200 may be electrically connected in one pad region. The second contact plug 202 may be connected to the second gate electrode layer 152 by penetrating through the third gate electrode layer 153, and the first contact plug 201 may be connected to the first gate electrode layer 151 by penetrating through the second and third gate electrode layers 152 and 153. Similarly, the fifth contact plug 205 may be connected to the fifth gate electrode layer 155 by penetrating through the sixth gate electrode layer 156, and the fourth contact plug 204 may be connected to the fourth gate electrode layer 154 by penetrating through the fifth and sixth gate electrode layers 155 and 156.

Thus, the plug insulating layers 221-226 for insulation may be disposed between the second contact plug 202 and the third gate electrode layer 153, between the first contact plug 201 and the second and third gate electrode layers 152 and 153, between the fifth contact plug 205 and the sixth gate electrode layer 156, and between the fourth contact plug 204 and the fifth and sixth gate electrode layers 155 and 156. However, according to example embodiments, the plug insulating layers 221-226 may be disposed between all of the contact plugs 200 and gate electrode layers 150 in the z-axis direction, or plug insulating layers 221, 222, 224, and 225 may be disposed only on outer circumferential surfaces of the partial contact plugs 201, 202, 204, and 205.

Figure 7:
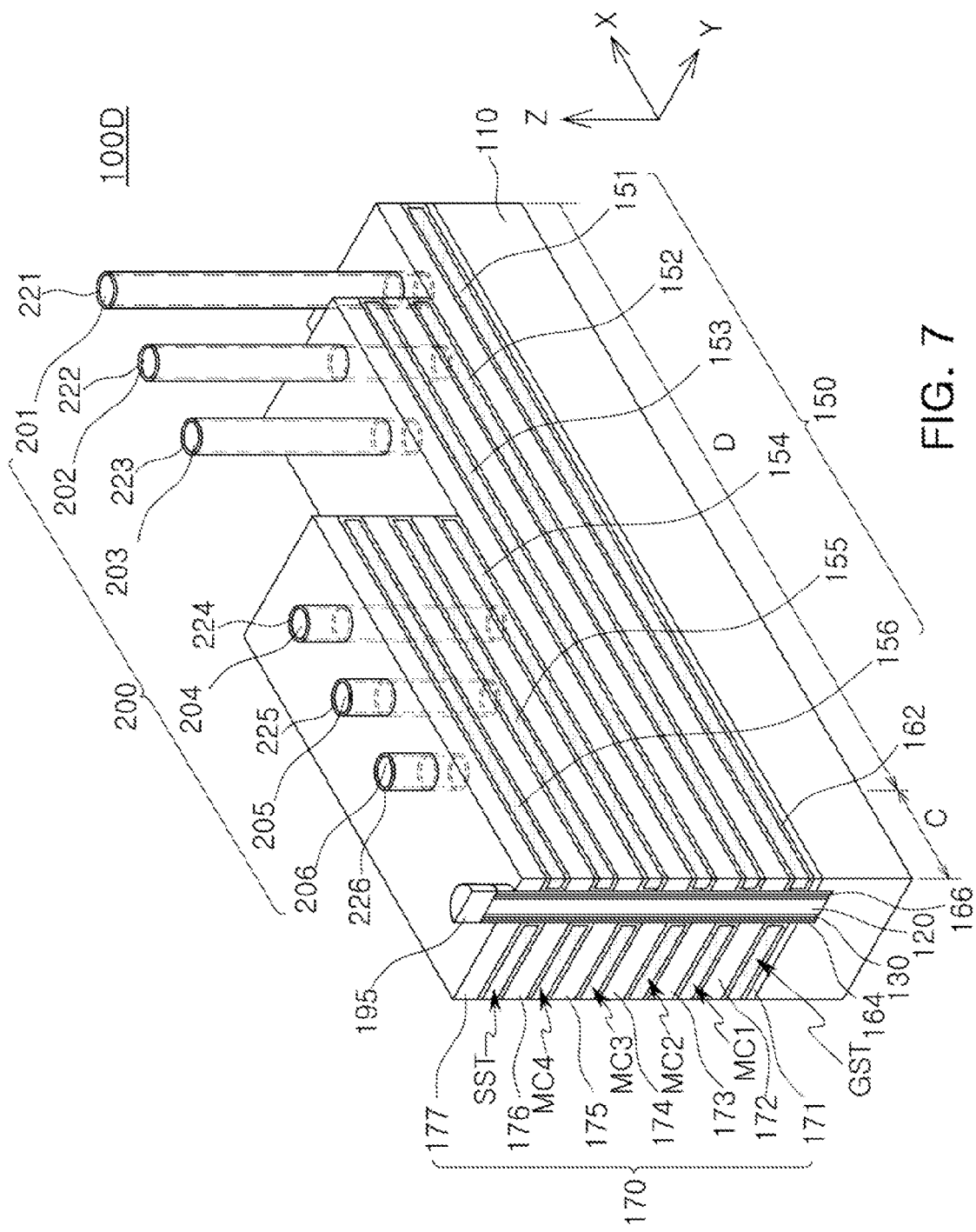

FIG. 7 is a perspective view illustrating a memory device 100D according to example embodiments different from those of FIGS. 4 through 6. Like in the case of FIG. 6, in FIG. 7, the connection region insulating layer 180 illustrated in FIGS. 4 and 5 is omitted to clarify a connection structure between a plurality of contact plugs 200 and a plurality of gate electrode layers 150.

Referring to FIG. 7, the memory device 100D according to example embodiments may include the plurality of gate electrode layers 150 and the plurality of insulating layers 170 alternately stacked on an upper surface of a substrate 100 in the z-axis direction. A cavity penetrating through the plurality of gate electrode layers 150 and the insulating layers 170 to reach the substrate 110 within the cell array region C may be provided in the z-axis direction, and a channel region 130 may be provided within the penetrating cavity.

Each of the plurality of gate electrode layers 150 and the insulating layers 170 may extend to have different lengths in the x-axis direction to form a step. In example embodiments, a portion of the gate electrode layers 150 adjacent to each other in the z-axis direction may extend to have the same length in the x-axis direction. Namely, second and third gate electrode layers 152 and 153 may extend to have the same length in the x-axis direction, and fourth to sixth gate electrode layers 154, 155, and 156 may extend to have the same length in the x-axis direction, forming three pad regions. Thus, in FIG. 7, steps between the respective pad regions may have different heights.

A second contact plug 202 connected to the second gate electrode 152 may penetrate through the third gate electrode layer 153. Similarly, a fourth contact plug 204 may penetrate through the fifth and sixth gate electrode layers 155 and 156, and a fifth contact plug 205 may penetrate through the sixth gate electrode layer 156. Thus, plug insulating layers 221-226 insulating the respective contact plugs 200 and the gate electrode layers 150 penetrated by the respective contact plugs 200 may be disposed in the connection region D. Meanwhile, unlike FIG. 7, the first to third gate electrode layers 151, 152, and 153 may extend to have the same length in the x-axis direction and the fourth and fifth gate electrode layers 154 and 155 may extend to have the same length in the x-axis direction, providing three pad regions.

Even though FIG. 7 illustrates the blocking layer 162 surrounding the gate electrode layers 150, example embodiments are not limited thereto. For example, the blocking layer 162 may alternatively be arranged to surround the electric charge storage layer 164 and the channel regions 130 as shown in FIG. 5.

Hereinafter, methods of manufacturing memory devices according to example embodiments will be described.

FIGS. 8A through 8O are cross-sectional views illustrating a method of manufacturing the memory device illustrated in FIG. 4 according to example embodiments. For example, FIGS. 8A through 8O are cross-sectional views of FIG. 4 viewed in the y-axis direction according to a processing order.

Referring to FIG. 8A, a plurality of insulating layers 171 to 177 (170) and a plurality of sacrificial layers 141 to 146 (140) may be alternatively stacked on a substrate 110. The sacrificial layers 140 may be formed of a material that may be etched with etch selectivity with respect to the insulating layers 170. Namely, the sacrificial layers 140 may be formed of a material that may be etched, during a process of etching the sacrificial layers 140, while limiting and/or minimizing etching of the insulating layer 170. Etch selectivity may be expressed quantitatively by a ratio of an etch rate of the sacrificial layers 140 to that of the insulating layers 170. For example, the insulating layers 170 may be at least one of silicon oxide films, silicon oxynitride, and silicon nitride films, and the sacrificial layers 140 may be formed of a material different from that of the insulating layers 170, selected from among a silicon film, a silicon oxide film, a silicon carbide film, and a silicon nitride film.

In FIG. 8A, portions of the plurality of insulating layers 170 may have different thicknesses according to example embodiments. For example, an insulating layer 171 positioned in the lowermost portion, among the plurality of insulating layers 170 in the z-axis direction, may have a small thickness, compared to other insulating layers 172 to 177, and the insulating layer 177 positioned in the uppermost portion may be thicker than the other insulating layers 171 to 176. Namely, thicknesses of the insulating layer 170 and the sacrificial layers 140 may be varied without being limited to that illustrated in FIG. 8A, and the number of layers of the films constituting the insulating layers 170 and the sacrificial layers 140 may also be varied.

A first mask layer M1 may be formed on the plurality of alternately stacked insulating layers 170 and sacrificial layers 140. The first mask layer M1 may include photoresist and may be formed as a composite layer of a photosensitive material and a non-photosensitive material.

In FIG. 8A, the plurality of insulating layers 170 and sacrificial layers 140 exposed by the first mask layer M1 may be etched to be removed. The etching process may be an anisotropic etching process. The etching process may be performed using a dry etching method or a wet etching method.

In the case of using the dry etching method, the removal process may be performed in a plurality of stages to sequentially etch the stacked insulating layers 170 and sacrificial layers 140.

Figure 8B:
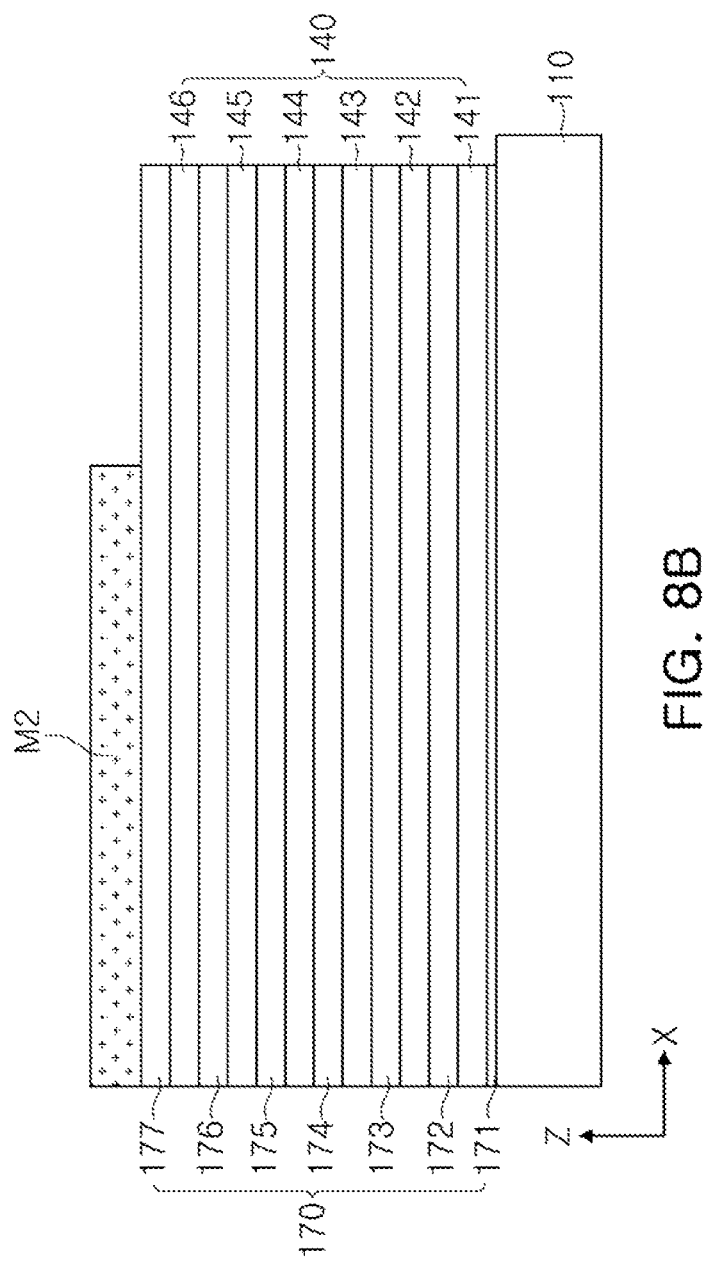

After the portions of the plurality of insulating layers 170 and sacrificial layers 140 exposed by the first mask layer M1 are etched to be removed, the first mask layer M1 may be trimmed. A dry etching method or a wet etching method may be applied to the trimming process, and a second mask layer M2 may be formed by removing a portion of edge of the first mask layer M1 through the trimming process, as illustrated in FIG. 8B. Here, a height of the first mask layer M1 in the z-axis direction, as well as a length thereof in the x-axis direction, may be reduced through the trimming process.

Figure 8D:
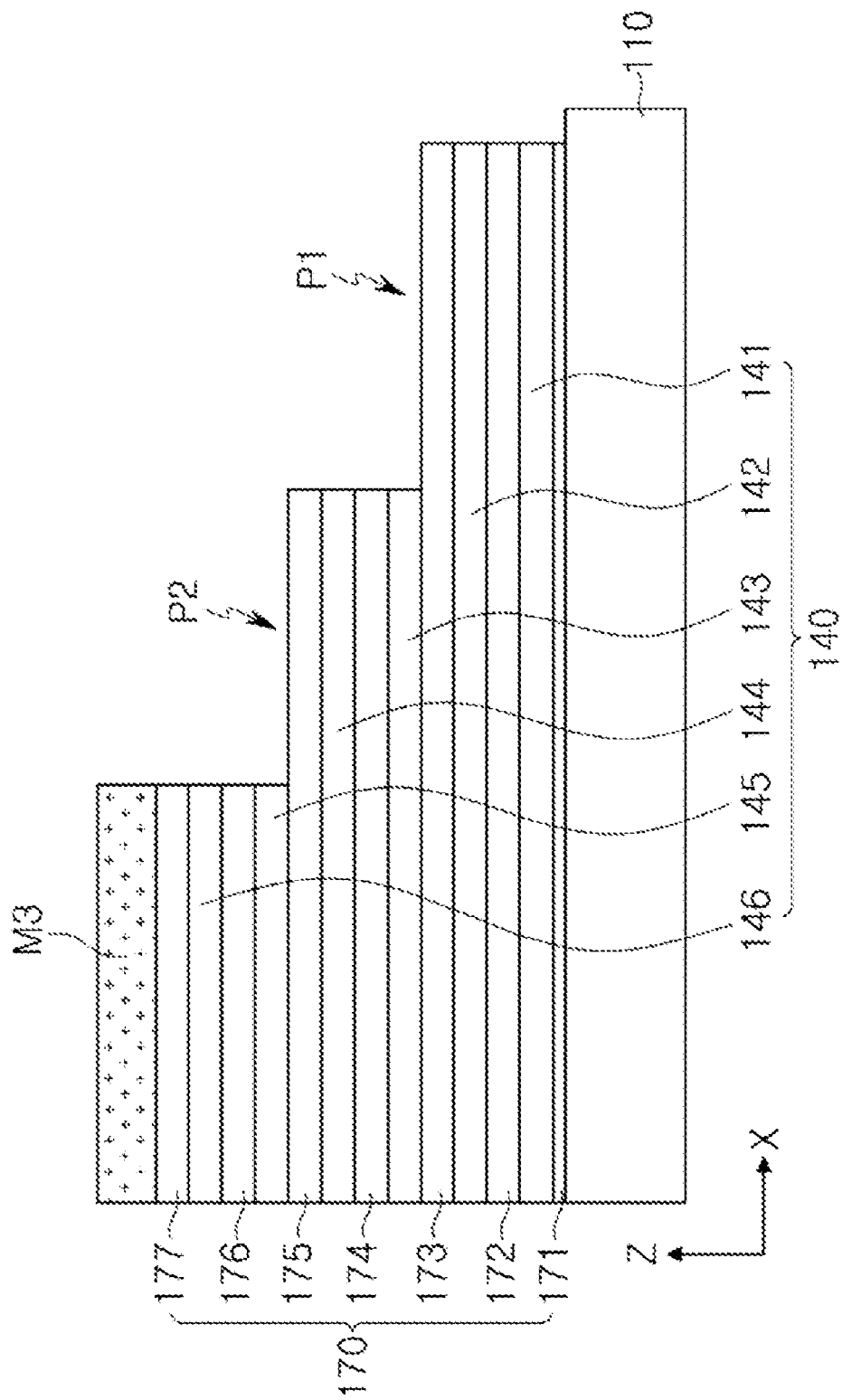

Referring to FIG. 8C, a plurality of insulating layers 170 and a plurality of sacrificial layers 140 exposed by the second mask layer M2 may be etched in the same manner as that of FIG. 8B. Here, an etching process may be performed from the uppermost insulating layer 177 to an upper surface of the third insulating layer 173, thus forming a first pad region P1. When the etching process is completed, a trimming process may be performed on the second mask layer M2 to form a third mask layer M3 covering an area smaller than that of the second mask layer M2. Subsequently, as illustrated in FIG. 8D, a plurality of insulating layers 176 and 177 and a plurality of sacrificial layers 145 and 146 exposed by the third mask layer M3 may be etched to form a second pad region P2.

Figure 8E:
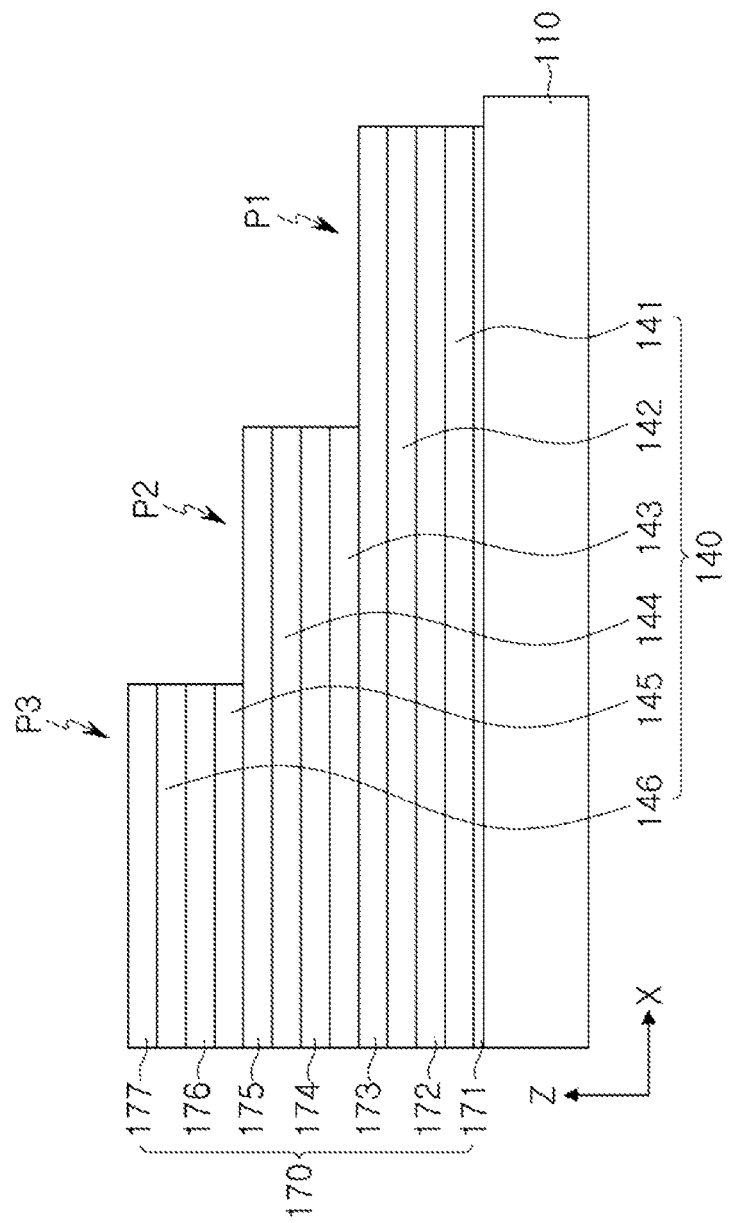

By repeatedly performing the etching process on the plurality of insulating layers 170 and the plurality of sacrificial layers 140 and the trimming process on the mask layers M1 to M3 in the manner as described above with reference to FIGS. 8B through 8D, a structure as illustrated in FIG. 8E may finally be obtained. In example embodiments, the insulating layers 170 and the sacrificial layers 140 may be paired, and the insulating layers 170 and the sacrificial layers 140 included in the plurality of pairs may extend to have the substantially same length in one direction, for example, in the x-axis direction. As an exception, an insulating layer 171 may be disposed below the sacrificial layer 141 positioned in the lowermost portion in the z-axis direction such that it extends to have the substantially same length.

Referring to FIG. 8E, a pair of insulating layer 170 and sacrificial layer 140 may extend in one direction (x-axis direction) to have a length substantially equal to that of another pair of insulating layer 170 and sacrificial layer 140 adjacent thereto in the z-axis direction, a direction in which the insulating layers 170 and the sacrificial layers 140 are stacked. Namely, the first and second sacrificial layers 141 and 142 may extend to have the substantially same length in the x-axis direction, and the third and fourth sacrificial layers 143 and 144 and the fifth and sixth sacrificial layers 145 and 146 may also extend to have the substantially same length in the x-axis direction, respectively.

Thus, each step structure of the plurality of pad regions P1 to P3 may correspond to the sum of thicknesses of two sacrificial layers 140 and two insulating layers 170. The step between the first and second pad regions P1 and P2 may be determined by the sum of the thicknesses of the third and fourth sacrificial layers 143 and 144 and the thicknesses of the fourth and fifth insulating layers 174 and 175. Similarly, the step between the second and third pad regions P2 and P3 may be determined by the sum of the thicknesses of the fifth and sixth sacrificial layers 145 and 146 and the sixth and seventh insulating layers 176 and 177. As a result, in FIG. 8E, the step between the first and second pad regions P1 and P2 and the step between the second and third pad regions P2 and P3 may have substantially the same heights.

Meanwhile, since the plurality of sacrificial layers 140 and the plurality of insulating layers 170 extend to have the substantially same length in the x-axis direction as illustrated in FIG. 8E, the number of times an etching process needs to be performed to form the plurality of pad regions P1 to P3 may be reduced. Accordingly, the number of times the mask layers M1 to M3 applied to form the plurality of pad regions P1 to P3 need to be trimmed is reduced as well, and after forming the mask layers M1 having the same volume, a larger number of pad regions P1 to P3 may be formed by using the mask layer M1, thus enhancing process efficiency.

Figure 8F:
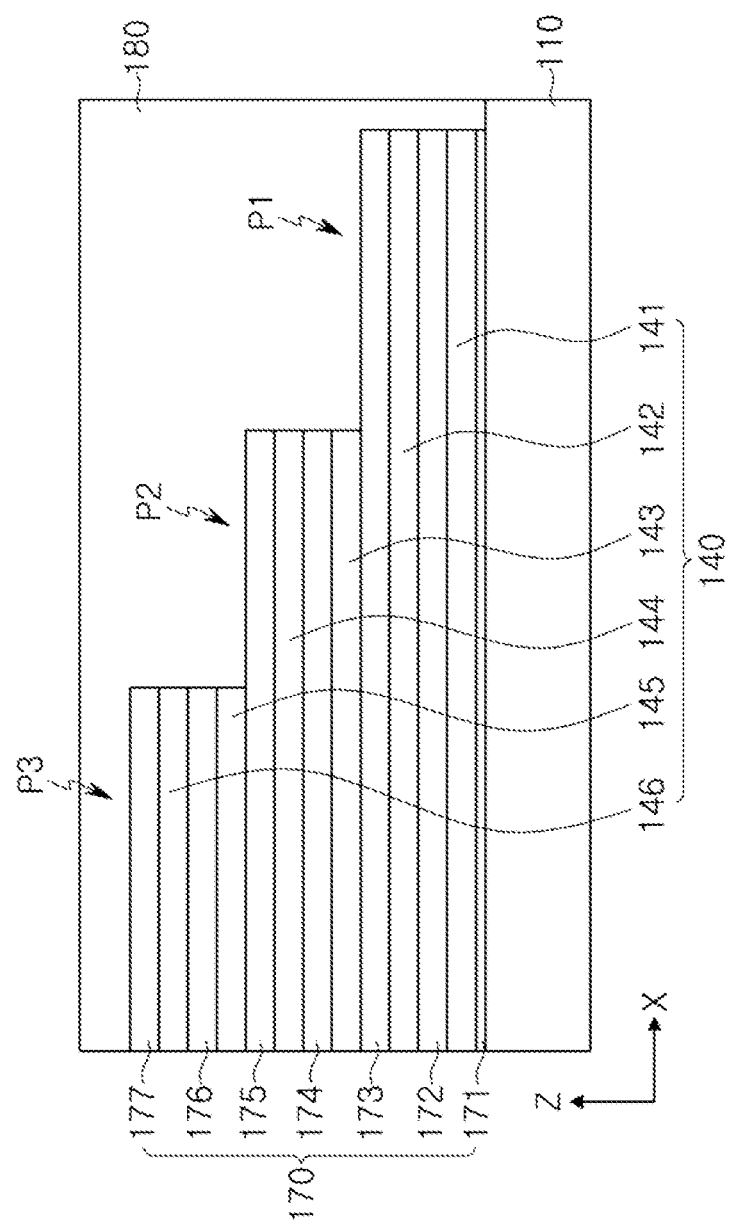

After the plurality of pad regions P1 to P3 are formed, a connection region insulating layer 180 may be formed on the plurality of pad regions P1 to P3 as illustrated in FIG. 8F. The connection region insulating layer 180 may include a material identical to that of the plurality of insulating layers 170. In the method of manufacturing the memory device 100A according to example embodiments, after a peripheral circuit region is formed, the cell array region C and the connection region D may be subsequently formed. In this case, heights of the cell array region C, the connection region D, and the peripheral circuit region may become equal through a process of forming and planarizing the connection region insulating layer 180.

After the connection region insulating layer 180 is formed, a channel region 130 may be formed as illustrated in FIG. 8G. In order to form the channel region 130, an opening may be formed to penetrate through the plurality of insulating layers 170 and the plurality of sacrificial layers 140 in the z-axis direction. A plurality of openings may be provided, and the plurality of openings may be disposed in a zigzag form to be spaced apart from one another on the x-y plane perpendicular to the z-axis. The plurality of openings may be formed by only exposing a region in which a plurality of openings are to be formed by a mask layer, and anisotropic-etching the exposed region, similar to the method of forming the plurality of pad regions P1 to P3. Each of the plurality of openings may expose an upper surface of the substrate 110 or have a desired (and/or alternatively predetermined) depth in the substrate 110.

An electric charge layer 164 and a tunneling layer 166 may be formed on inner and lower surfaces of each of the plurality of openings by using atomic layer deposition (ALD) or chemical vapor deposition (CVD). Here, the electric charge storage layer 164 and the tunneling layer 166 may be sequentially stacked on regions adjacent to the plurality of sacrificial layers 140 and the plurality of insulating layers 170, and the channel region 130 may be formed at an inner side of the tunneling layer 166. The channel region 130 may be formed to have a desired (and/or alternatively predetermined) thickness, For example, the channel region 130 may have a thickness ranging from 1/50 to 1/5 of a width of each of the plurality of openings, and may be formed through ALD or CVD in a manner similar to that of the electric charge storage layer 164 and the tunneling layer 166. Meanwhile, at a bottom of each of the openings, the channel region 130 may be in direct contact with the substrate 110 and may be electrically connected thereto.

The interior of the channel region 130 may be filled with a buried insulating layer 120. Optionally, before forming the buried insulating layer 120, hydrogen annealing may be performed to heat-treat the structure of the channel region 130 under a gas atmosphere including hydrogen or heavy hydrogen. A large portion of crystal defects existing in the channel region 130 may be reduced and/or eliminated by the hydrogen annealing process.

The structure of the channel region 130 is based on FIG. 4, but the channel region 130 may also be formed to have other structures. For example, after forming the plurality of openings, the channel region 130 may be formed immediately without performing a process to form the electric charge storage layer 164 and the tunneling layer 166, and the buried insulating layer 120 may be formed within the channel region 130. In this case, like the blocking layer 162, the tunneling layer 166 and the electric charge storage layer 164 may be formed before a process to form the gate electrode layers 150 so as to be disposed outside of the blocking layer 162 to surround the gate electrode layers 150.

A planarization process may be performed to remove an unnecessary semiconductor material and an insulating material covering the connection region insulating layer 180 in the uppermost portion. An upper portion of the buried insulating layer 120 may be removed by using an etching process, or the like, and a material for forming a conductive layer 195 may be deposited in a position corresponding to the upper portion of the buried insulating layer 120 which has been removed. A planarization process may be performed again to form the conductive layer 195.

Figure 8H:
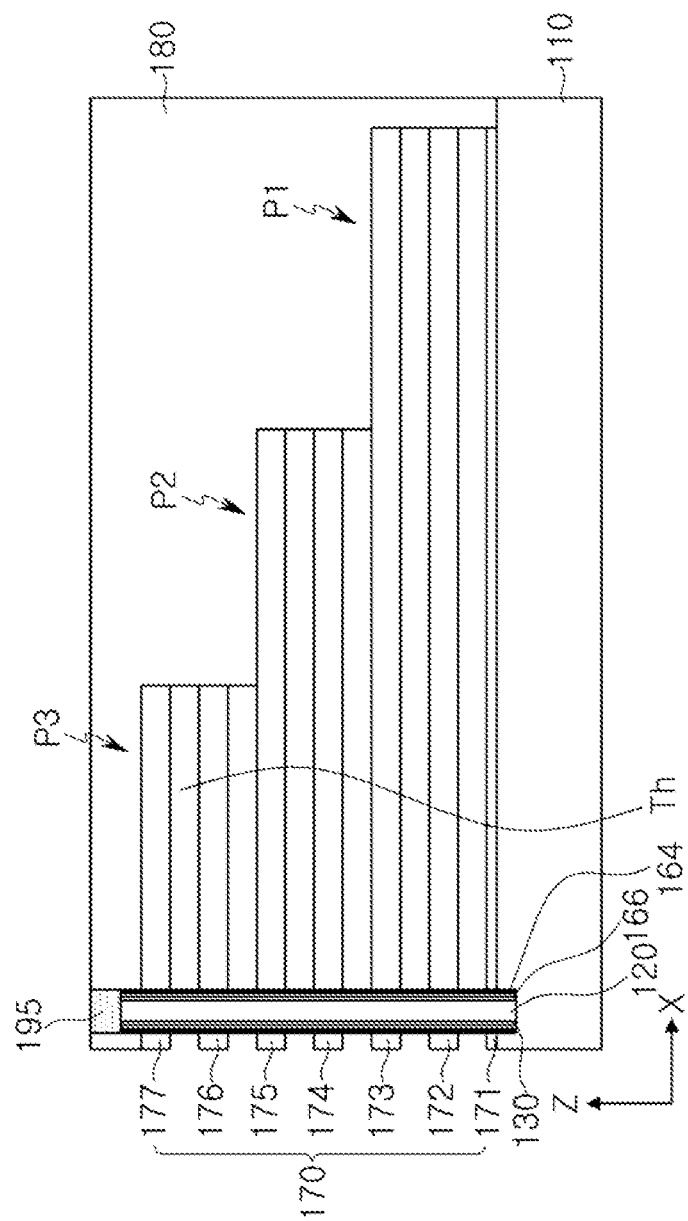

After the channel region 130 is formed, a plurality of sacrificial layers 140 may be removed to form lateral openings Th as illustrated in FIG. 8H. Here, as a plurality of sacrificial layers 140 are removed, a plurality of lateral openings Th may be formed between the plurality of insulating layers 170. A conductive material may be introduced to the interior of the plurality of lateral openings Th to form the gate electrode layers 150.

Figure 8I:
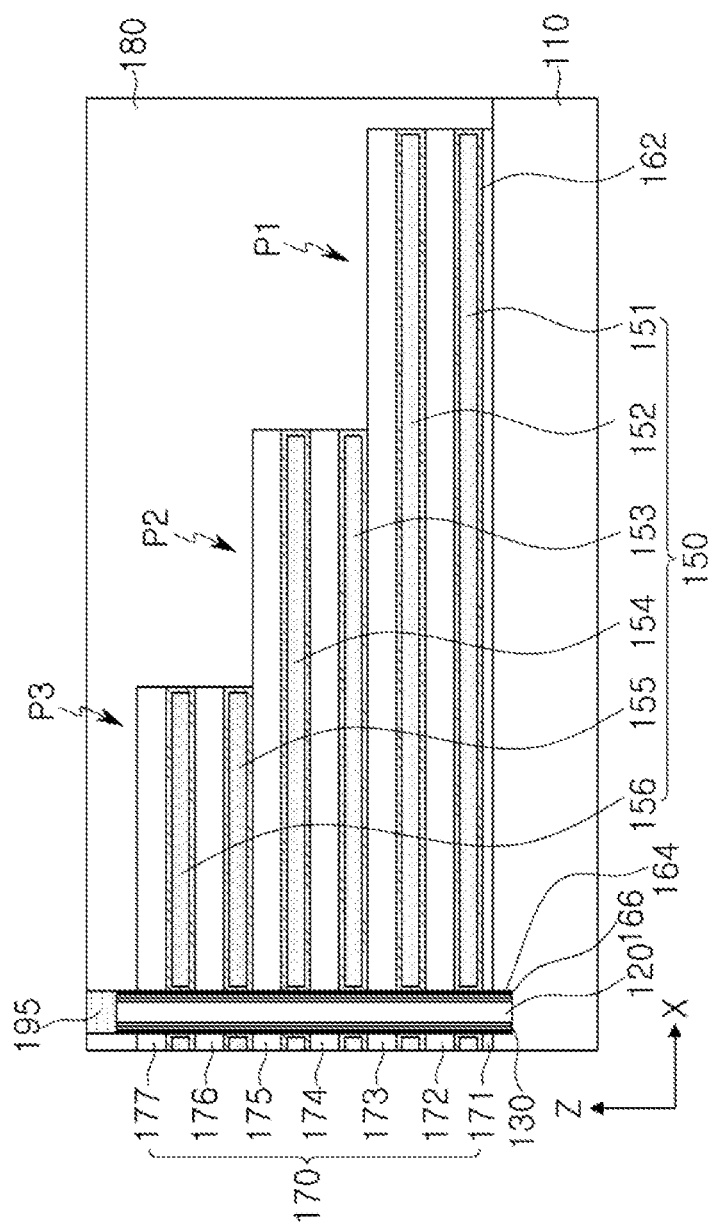
Figure 8J:
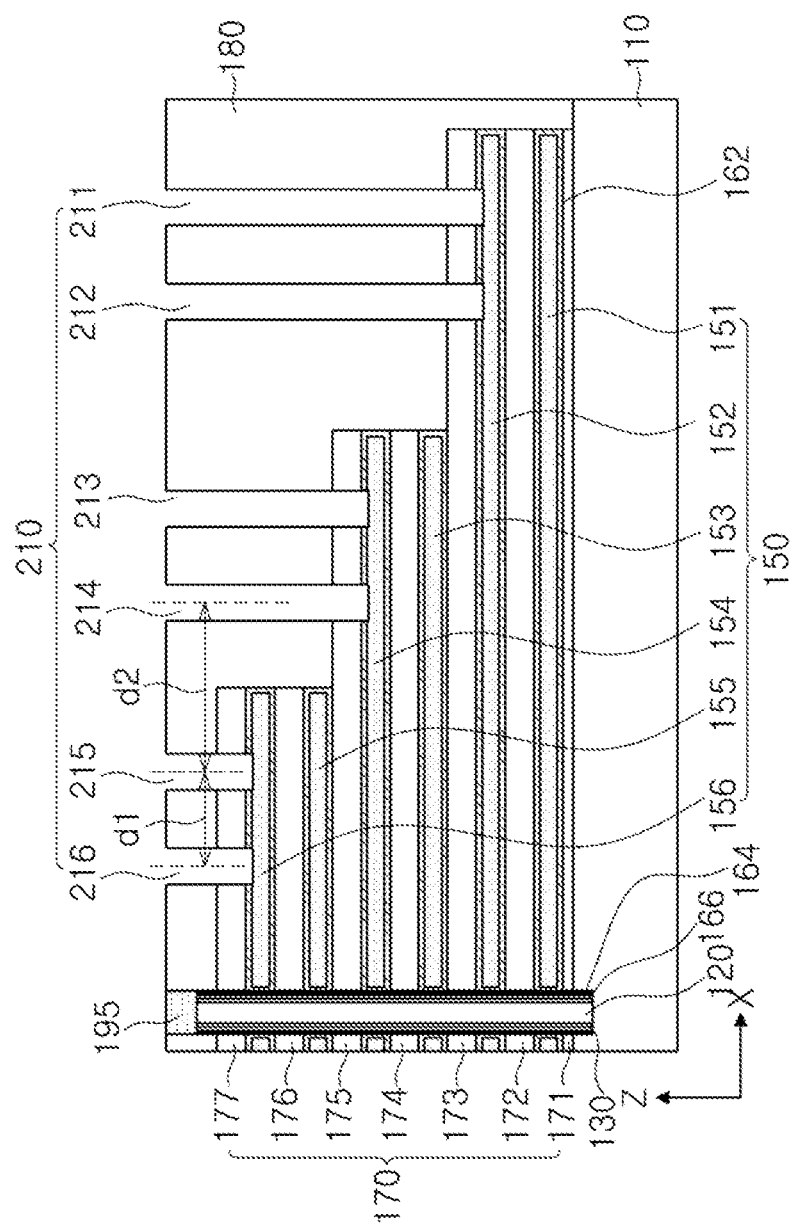

Referring to FIG. 8I, the blocking layers 162 and gate electrode layers 151 to 156 (150) may be formed within the lateral openings Th. In forming the blocking layers 162 and the gate electrode layers 150 sequentially within the lateral openings Th, the blocking layers 162 may be formed through ALD, CVD, or a physical vapor deposition (PVD), similar to the electric charge storage layer 164 and the tunneling layer 166. Before forming the gate electrode layers 150, the blocking layers 162 may first be formed to surround the gate electrode layers 150 as illustrated in FIG. 8I. The gate electrode layers 150 may be formed of a conductive material. For example, the gate electrode layer 150 may be formed of a metal such as tungsten (W), or the like. As shown in FIG. 8I, the first pad region P1 may be defined by end portions of the gate electrode layers 151-152 that extend away from the channel region 130 in the X direction and further in the X direction than the gate electrode layers 153-156. The second pad region P2 may be defined by end portions of the gate electrode layers 153-154 that extend away from the channel region 130 in the X direction and further in the X direction than the gate electrode layers 155-156. The third pad region P3 may be defined by end portions of the gate electrode layer 155-156 that extend away from the channel region 130 in the X direction After the blocking layers 162 and the gate electrode layers 150 are formed, an etching process may be performed in the z-axis direction parallel to the channel region 130 to form a plurality of vertical openings 211 to 216 (210) for forming contact plugs 200, as illustrated in FIG. 8J. The etching process performed to form the plurality of vertical openings 210 may include a process of forming a mask layer having open regions corresponding to the vertical openings 210 and a process of selectively etching the connection region insulating layer 180 and the plurality of insulating layers 170 with respect to the plurality of gate electrode layers 150. By selectively etching only materials included in the connection region insulating layer 180 and the plurality of insulating layers 170 with respect to a material included in the plurality of gate electrode layers 150, vertical openings 210 extending to the gate electrode layers 152, 154, and 156 positioned in upper portions in each of the pad regions P1 to P3 in the z-axis direction may be formed, as illustrated in FIG. 8J. According to example embodiments, the vertical openings 210 may have a sloped lateral surface having a width narrowed toward the substrate 110 due to a high aspect ratio.

Here, a distance d1 between vertical openings connected to the gate electrode layers 150 and adjacent to each other in the x-axis direction in the same pad region may be smaller than a distance d2 between vertical openings 210 connected to the gate electrode layers 150 and adjacent to each other in the x-axis direction in different pad regions. Since the vertical openings 210 connected to two gate electrode layers 150 are formed in each of the pad regions P1 to P3, an area of the entirety of the plurality of pad regions may be reduced, compared to a case in which only a single vertical opening 210 connected to a single gate electrode layer 150 is formed in each of the pad regions P1 to P3. Compared to a case in which the pad regions P1 to P3, the gate electrode layers 150, and the vertical openings 210 are matched in a one-to-one manner, a margin of the pad regions P1 to P3 required for connecting a single gate electrode layer 150 to a single vertical opening 210 may be reduced, reducing an area of the pad regions P1 to P3 and thus increasing a degree of integration.

In example embodiments, in a case in which n number of pad regions are formed with respect to n number of gate electrode layers 150 and n number of vertical openings 210 are formed in each of the n number of pad regions, a pad region having a length of 500 nm in the x-axis direction may be required for a single gate electrode layer 150. However, in FIG. 8J, since two gate electrode layers 150 are connected to two vertical openings 210 in a single pad region, the vertical openings 210 may be formed only with a pad region having a length smaller than 1000 nm in the x-axis direction with respect to two gate electrode layers 150. Thus, since the vertical openings 210 connected to the same number of gate electrode layers 150 may be formed in a smaller pad area or a larger number of vertical openings 210 may be formed in the same pad area, a degree of integration of the device may be improved.

Figure 8K:
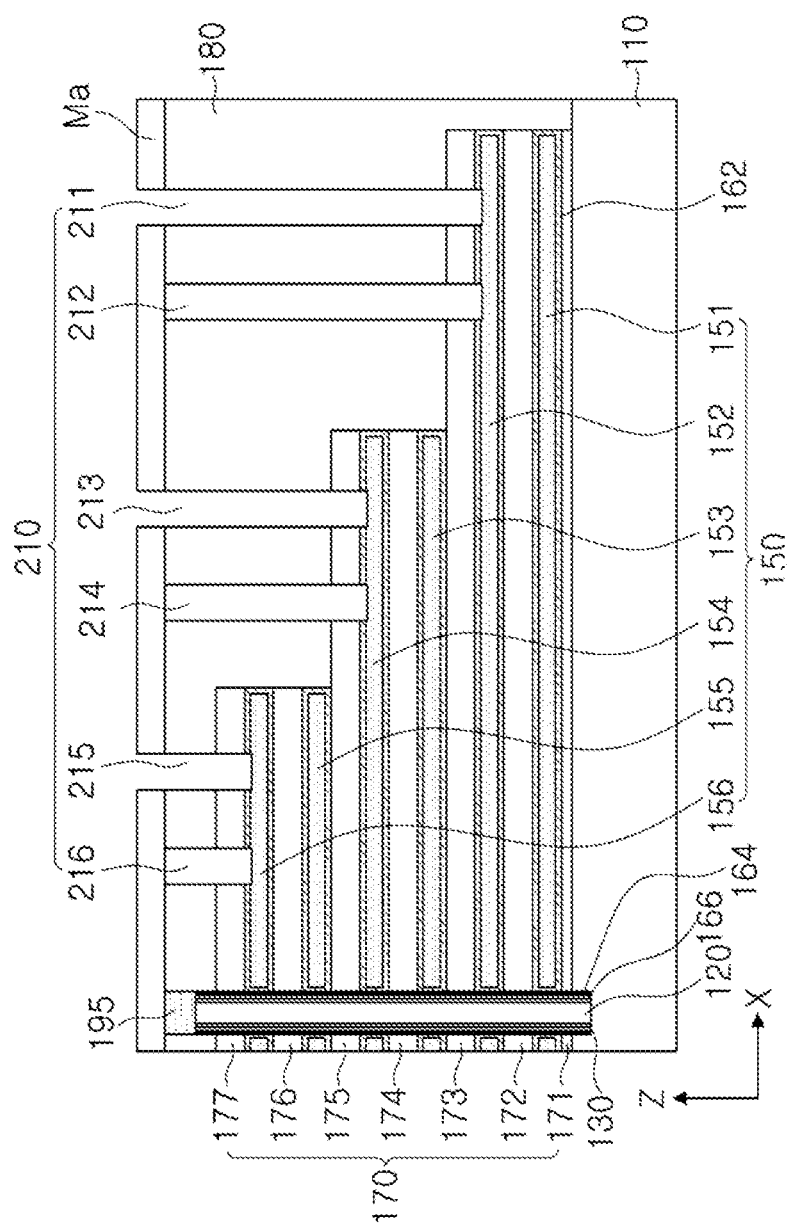
Figure 8L:
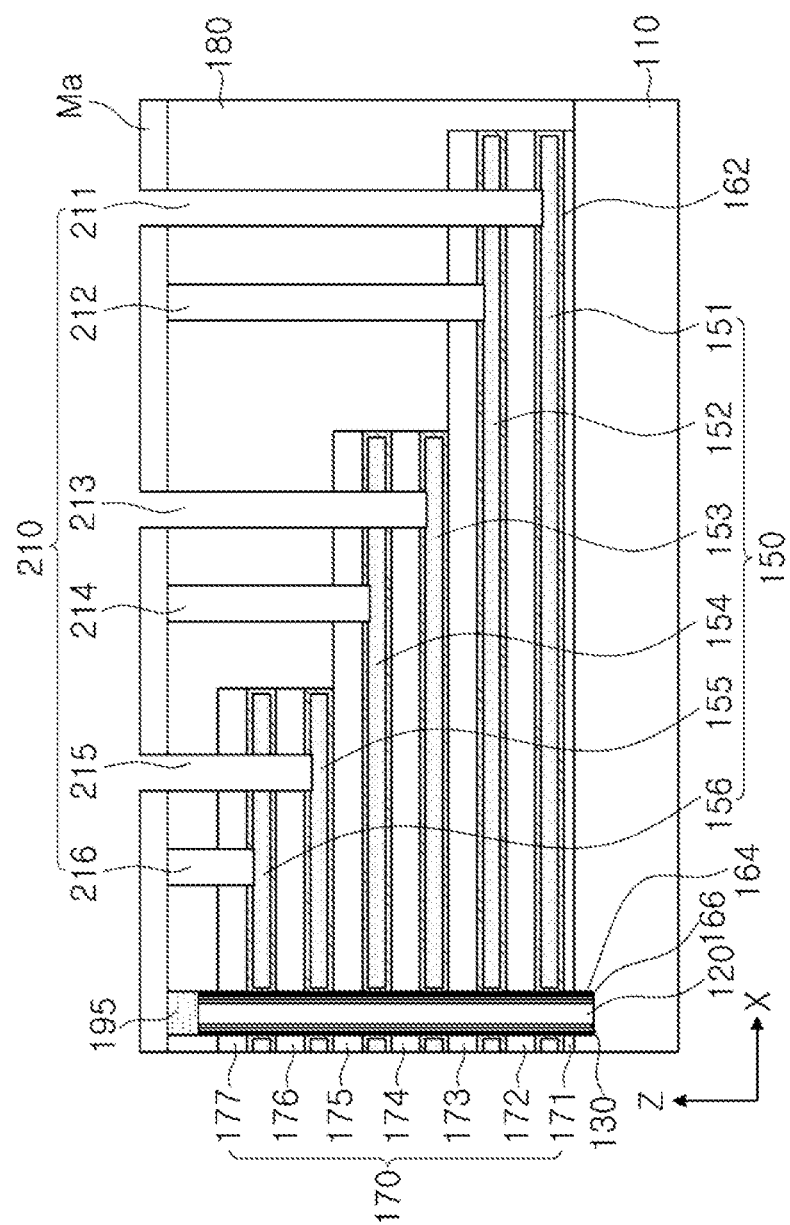

Referring to FIG. 8K, a mask layer Ma for an additional etching process may be provided on the vertical openings 210, and partial regions of the mask layer Ma corresponding to partial vertical openings 211, 213, and 215 may be opened. The mask layer M1 may be an amorphous carbon layer (ACL), and openings 211, 213, and 215 may be additionally etched through the open regions. Thus, as illustrated in FIG. 8L, lengths of the first, third, and fifth vertical openings 211, 213, and 215 may be increased to extend to the first, third, and fifth gate electrode layers 151, 153, and 155.

The etching process to increase the lengths of the first, third, and fifth vertical openings 211, 213, and 215 in the z-axis direction may include an etching process with respect to second, fourth, and sixth gate electrode layers 152, 154, and 156. Thus, by selectively etching the insulating layer 170 and the gate electrode layer 150 by using the mask layer Ma, the lengths of the first, third, and fifth vertical openings 211, 213, and 215 in the z-axis direction may be increased. Through the etching process, the first, third, and fifth openings 211, 213, and 215 may be connected to the first, third, and fifth gate electrode layers 151, 153, and 155, respectively.

Figure 8M:
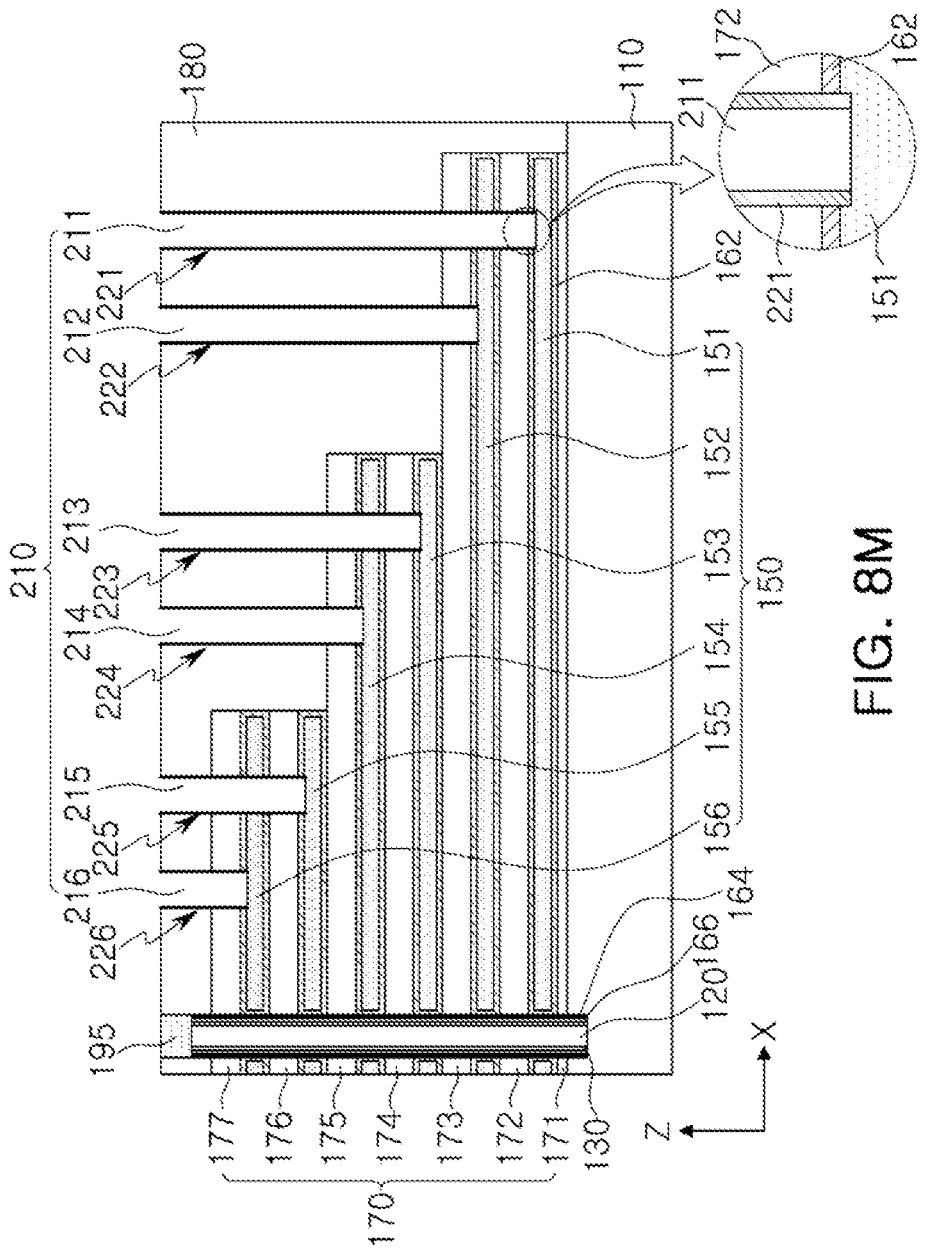

After the mask layer Ma is removed, plug insulating layers 221 to 226 may be formed within the respective vertical opening 210 as illustrated in FIG. 8M. The plug insulating layers 221 to 226 may include a material having excellent step coverage and, in particular, insulating properties. During the process to form the plug insulating layers 220, a portion of a material included in the plug insulating layers 221-226 may be deposited on lower surfaces of the vertical openings 210, and the material deposited on the lower surfaces of the vertical openings 210 may be removed through a spacer etching process.

Referring to a partially enlarged view of FIG. 8M illustrating the first vertical opening 211 and the first plug insulating layer 221, the first plug insulating layer 221 may be formed only on an inner surface of the vertical opening 221. Namely, the plug insulating layer 221 may not be formed on a lower surface of the first vertical opening 211, or the plug insulating layer 221 deposited on a lower surface of the first vertical opening 211 may be removed through a spacer etching process, or the like. Thus, the first contact plug formed by introducing a conductive material to the interior of the first vertical opening 211 may be electrically connected to the first gate electrode layer 151 and be electrically separated from the second gate electrode layer 152.

By removing the mask layer Ma and forming the plug insulating layer 221-226, the plug insulating layers 221-226 may be formed within all of the vertical openings 210. In example embodiments, the plug insulating layers 221 may be formed before the mask layer Ma is removed. In example embodiments, the plug insulating layers 221-226 may be formed only within the first, third, and fifth vertical openings 211, 213, and 215, and thus, contact plugs formed within the first, third, and fifth vertical openings 211, 213, and 215 may be electrically insulated from the second, fourth, and sixth gate electrode layers 152, 154, and 156. Alternatively, plug insulating layers 221, 223, and 225 may be selectively formed only in partial regions in which the contact plugs formed within the first, third, and fifth vertical openings 211, 213, and 215 and the second, fourth, and sixth gate electrode layers 152, 154, and 156 are contiguous.

Figure 8N:
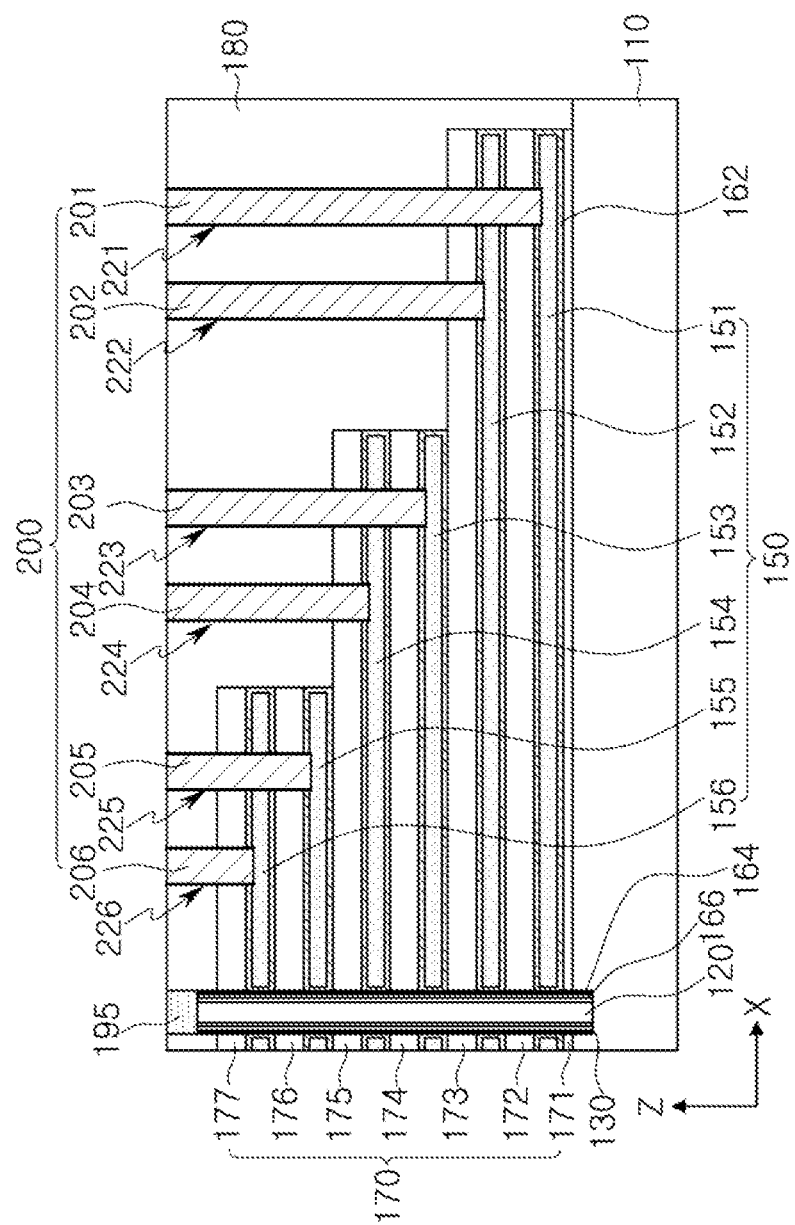
Figure 80:
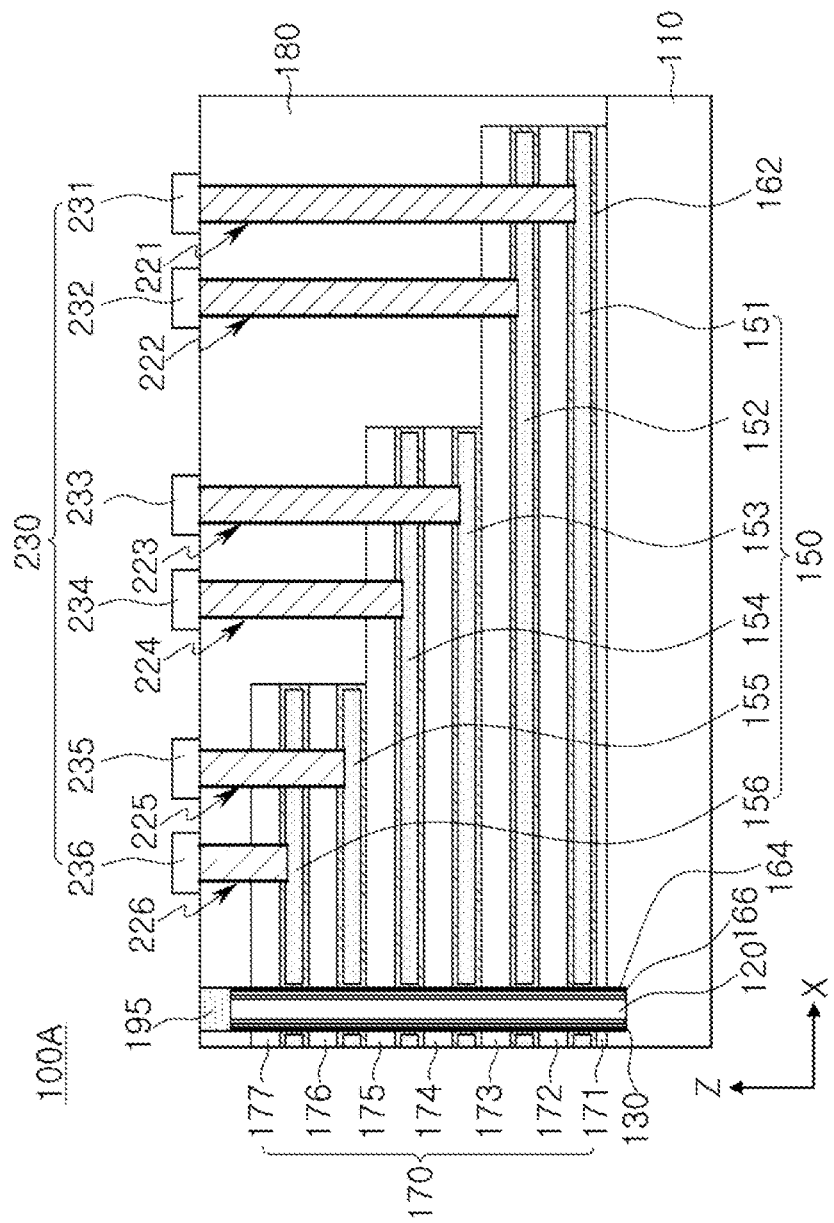

Referring to FIG. 8N, contact plugs 201 to 206 (200) including a conductive material may be formed within the plurality of vertical openings 210 on which the plug insulating layers 221-226 are formed. As described above, since the plug insulating layers 221-226 including an insulating material are formed only within the respective vertical openings 210, not on lower surfaces thereof, the contact plugs 200 may each be electrically connected to the gate electrode layers 150. In particular, partial contact plugs 201, 203, and 205 penetrating through at least one gate electrode layer 150 may be electrically insulated from the partial gate electrode layers 152, 154, and 156, respectively. Namely, the first, third, and fifth contact plugs 201, 203, and 205 may be electrically insulated from the second, fourth, and sixth gate electrode layers 152, 154, and 156, and be electrically connected to the first, third, and fifth gate electrode layers 151, 153, and 155.

Meanwhile, in FIGS. 8M and 8N, it is illustrated that the plug insulating layers 221-226 are formed in lateral surfaces within all of the vertical openings 210, but example embodiments are not limited thereto. Namely, the plug insulating layer 221-226 may be formed only in the vertical opening 210, in which the contact plug 200 required to be electrically insulated from a partial gate electrode layer 150 is formed. For example, the plug insulating layers 221, 223, and 225 may be formed only in the first, third, and fifth vertical openings 211, 213, and 215, and this structure may be formed by applying the plug insulating layers 221, 223, and 225 to only the first, third, and fifth vertical openings 211, 213, and 215 before the mask layer Ma is removed in FIG. 8L, in terms of processing.

Referring to FIG. 8O, a plurality of connection lines 231 to 236 (230) may be formed on the plurality of contact plugs 200. The plurality of connection lines 230 may be formed in a direction parallel to the bit lines 190 (please refer to FIG. 3) or in a direction perpendicular to the direction in which the plurality of gate electrode layers 150 extend, and may electrically connect a portion of the gate electrode layers 150 formed at the same height in the z-axis direction to each other.

Figure 9A:
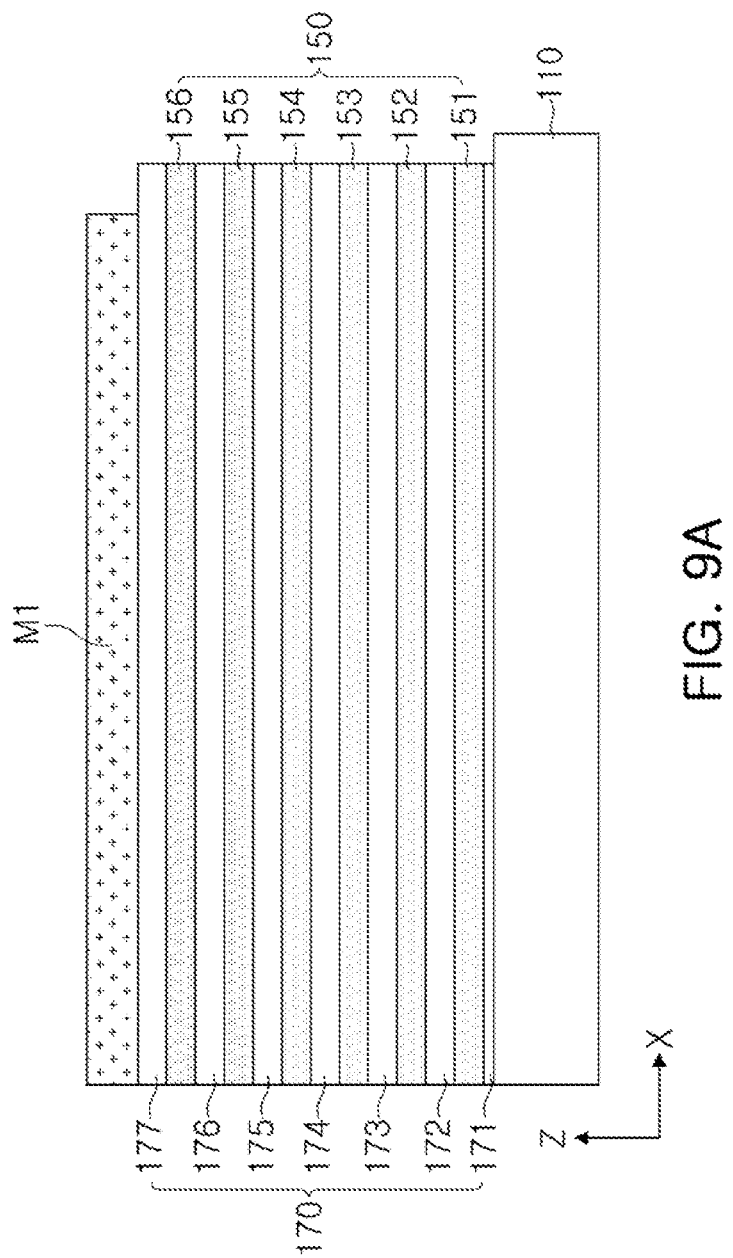
FIGS. 9A through 9N are cross-sectional views illustrating a method of manufacturing the memory device illustrated in FIG. 5 according to example embodiments.
Figure 9B:
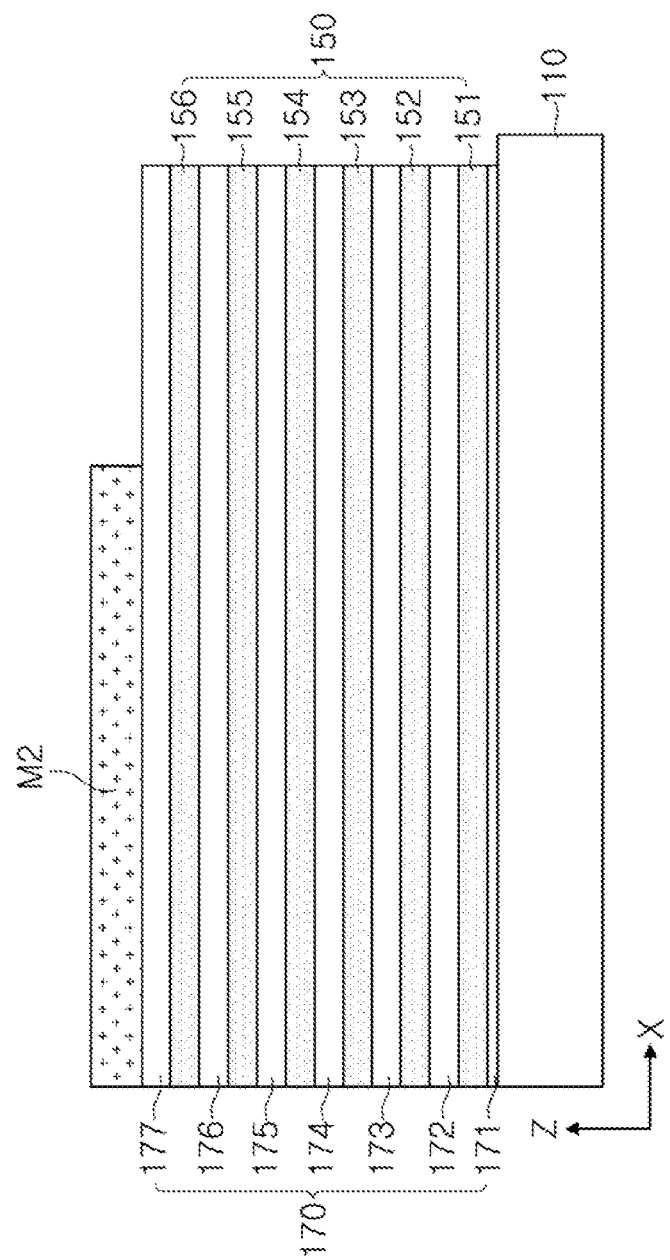
Figure 9C:
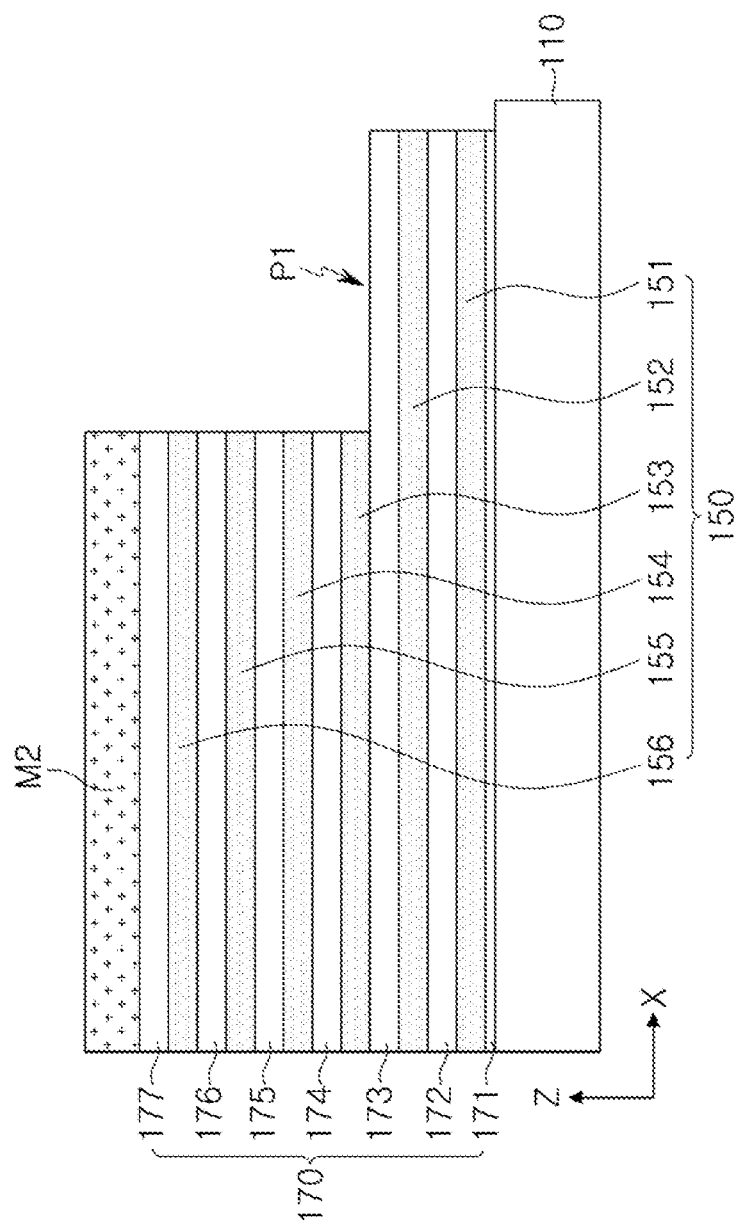
Figure 9D:
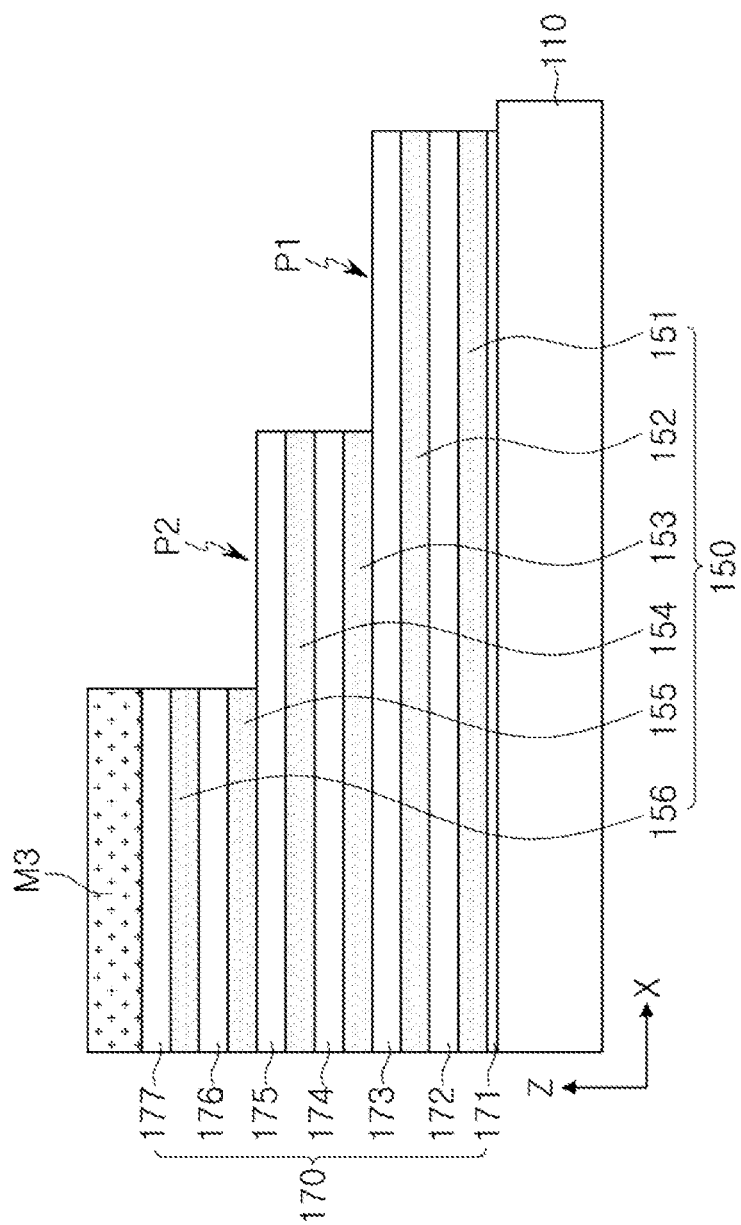
Figure 9E:
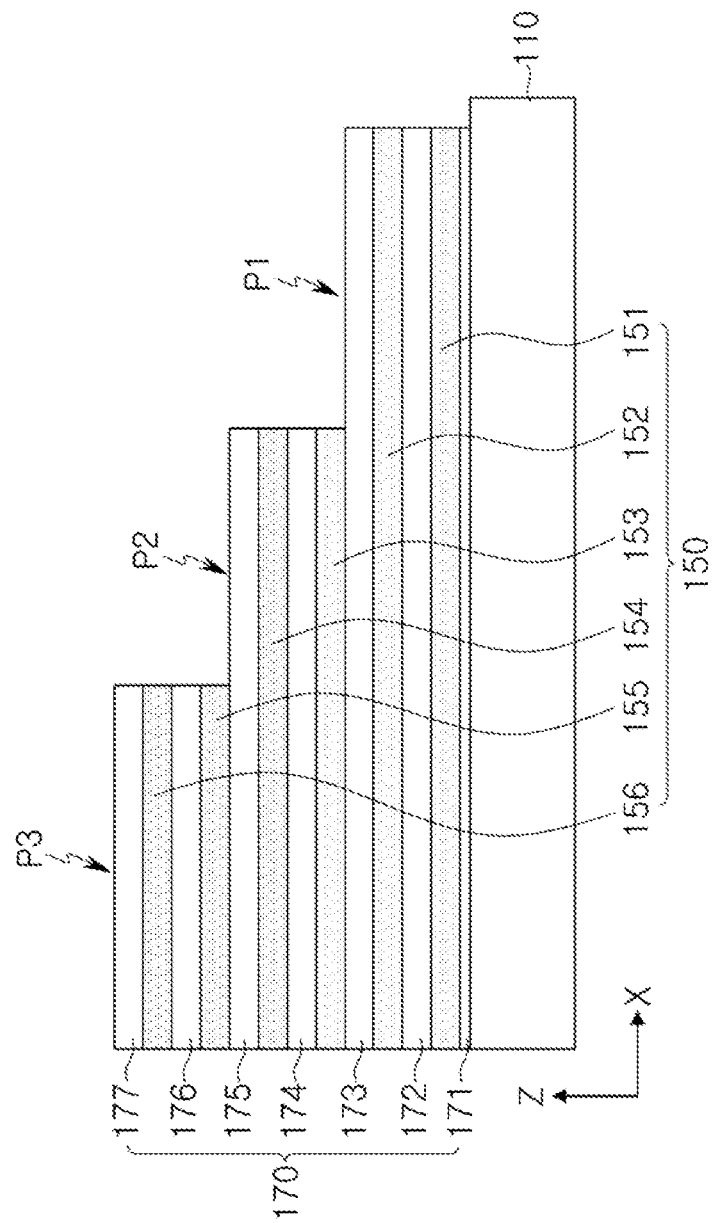
Figure 9F:
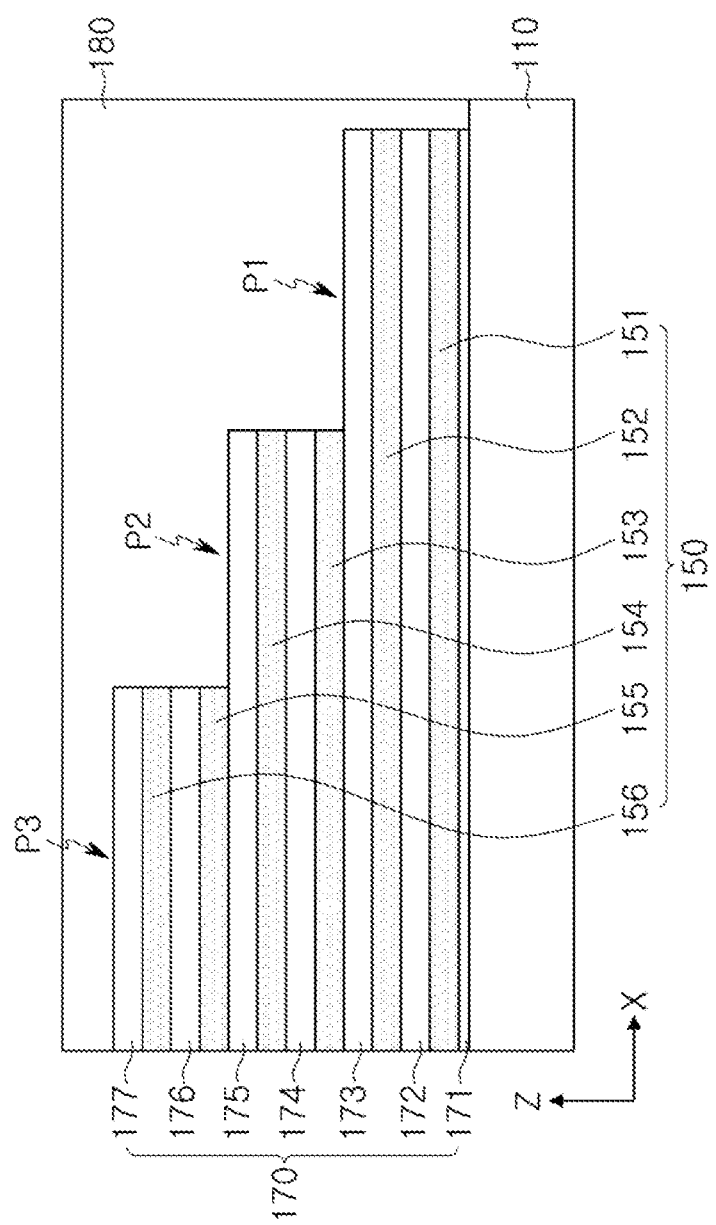
Figure 9G:
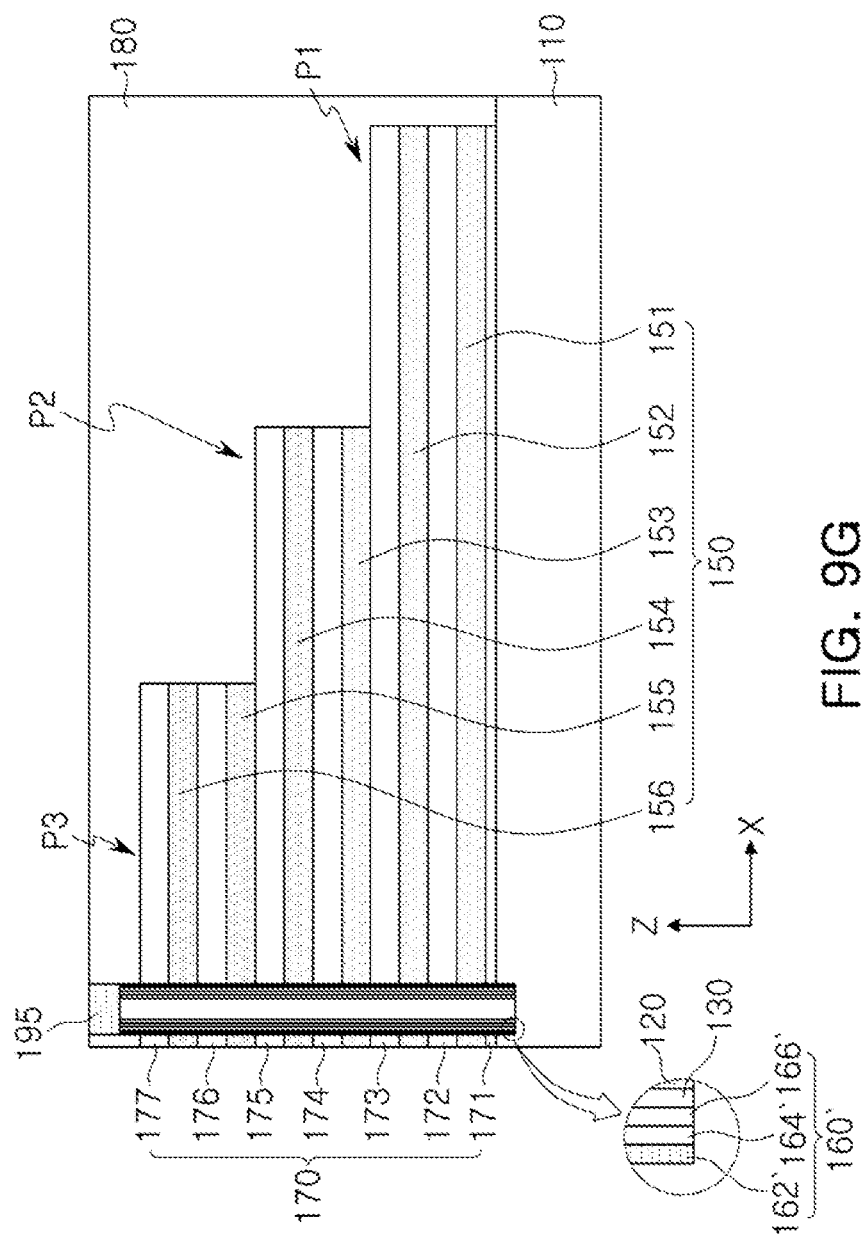
Figure 9I:
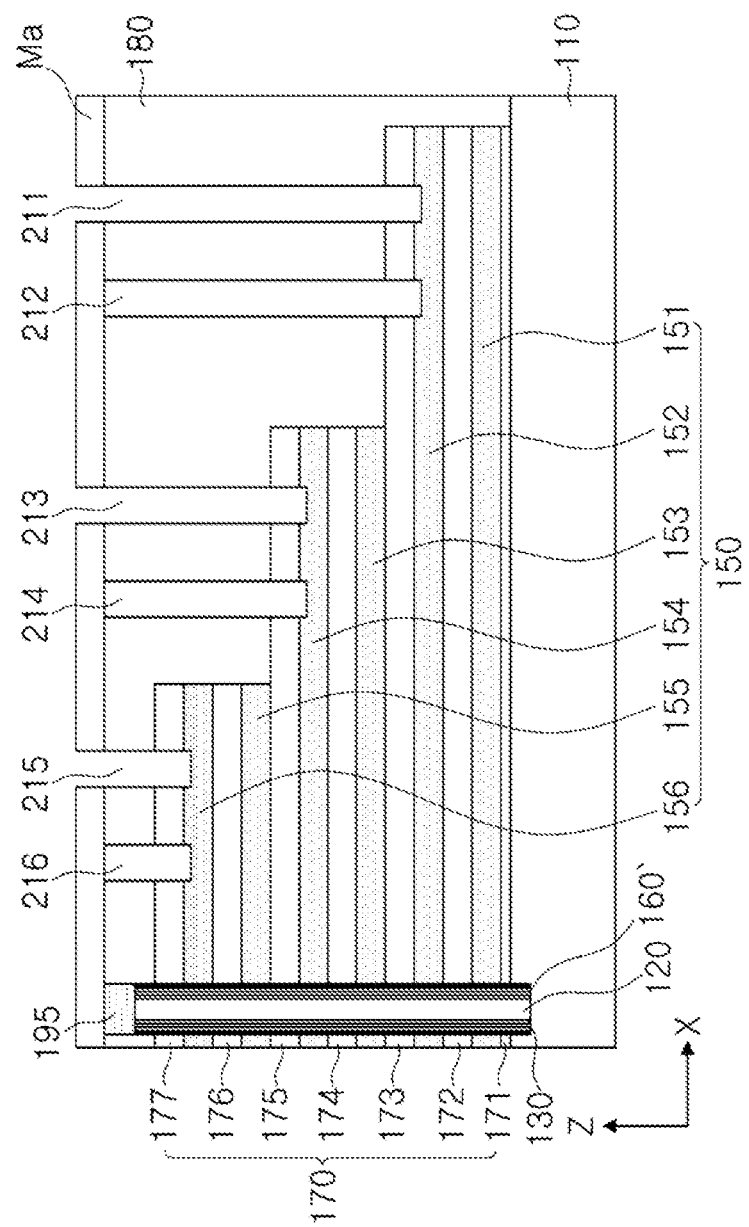
Figure 9J:
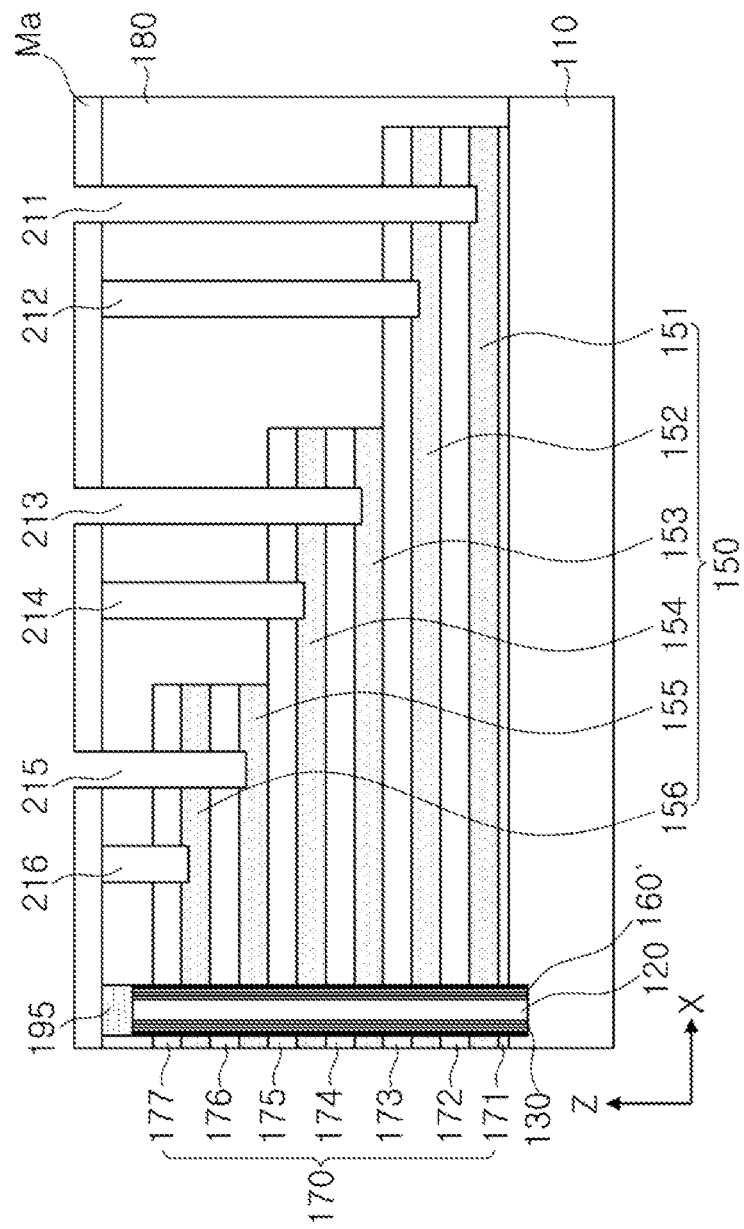
Figure 9L:
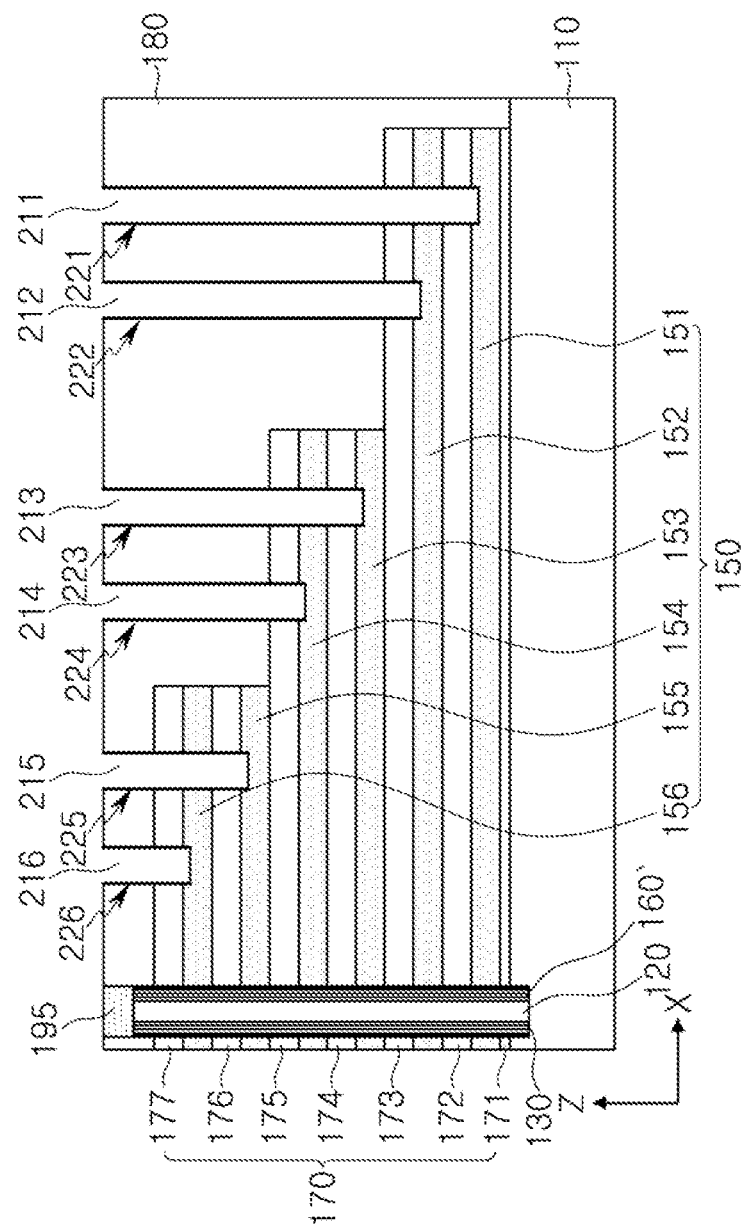
Figure 9M:
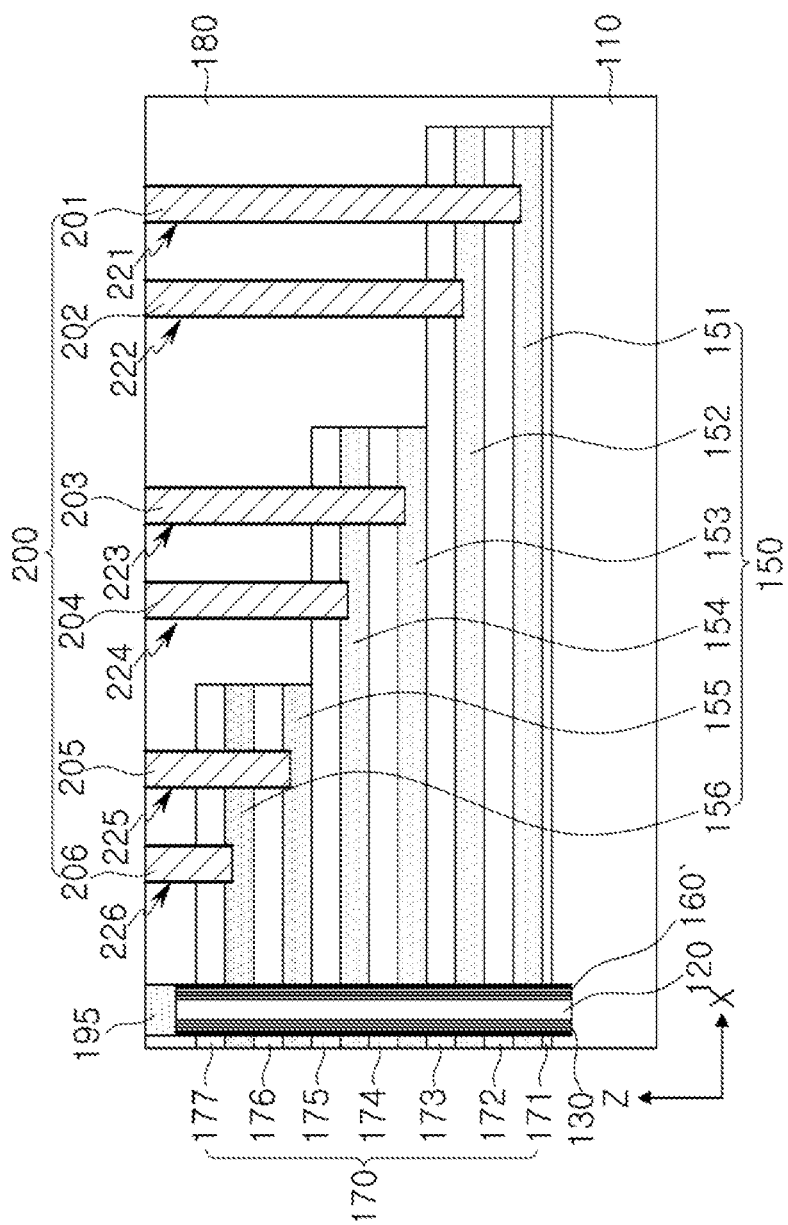
Figure 9N:
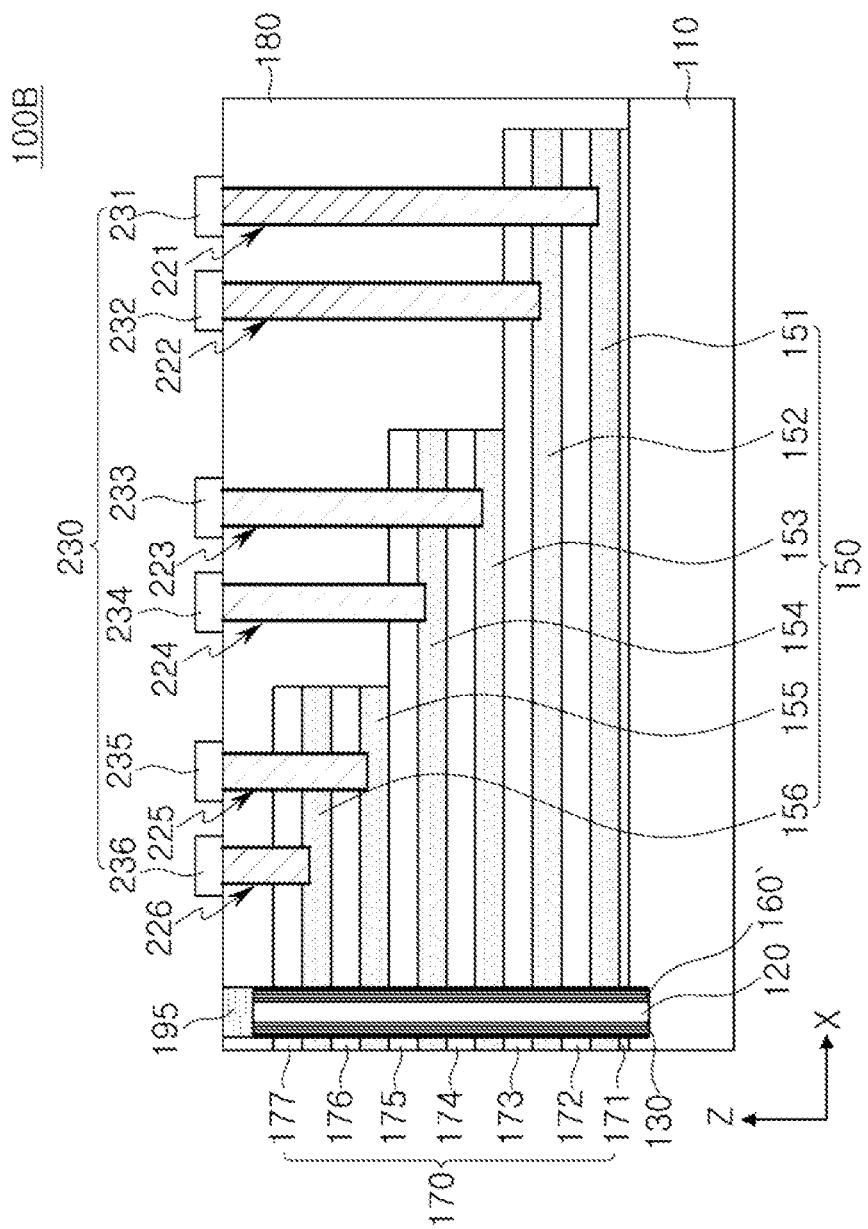

FIGS. 9A through 9N are cross-sectional views illustrating a method of manufacturing the memory device illustrated in FIG. 5 according to example embodiments.

For example, FIGS. 9A through 9N are cross-sectional views of FIG. 5 viewed in the y-axis direction, based on which manufacturing processes in a connection region D will be mainly described.

Referring to FIG. 9A, a plurality of insulating layers 170 and a plurality of gate electrode layers 150 are alternately stacked on an upper surface of a substrate 110, and a first mask layer M1 may be provided on an insulating layer positioned in the uppermost portion. As described above with reference to FIG. 8A, the first mask layer M1 may include a photoresist and may be formed as a composite layer of a photosensitive material and a non-photosensitive material.

In FIG. 9A, a plurality of insulating layers 170 and a plurality of gate electrode layers 150 exposed by the first mask layer M1 are etched, and the first mask layer M1 may be trimmed through a dry etching method or a wet etching method to form a second mask layer M2 as illustrated in FIG. 9B. Among the plurality of insulating layers 170 and the plurality of gate electrode layers 150 exposed by the second mask layer M2, fourth to seventh insulating layers 174 to 177 and third to sixth gate electrode layers 153 to 156 may be etched to provide a first pad region P1 as illustrated in FIG. 9C.

After the first pad region P1 is formed, the second mask layer M2 is trimmed again to form a third mask layer M3, and sixth and seventh insulating layers 176 and 177 and fifth and sixth gate electrode layers 155 and 156 may be etched to provide a second pad region P2 as illustrated in FIG. 9D. The third mask layer M3 may be removed to form the first to third pad regions P1 to P3 in the connection region D of the memory device, as illustrated in FIG. 9E.

Referring to FIG. 9E, like FIG. 8E, the sum of thicknesses of two gate electrode layers 150 and two insulating layers 170 may determine steps between the adjacent pad regions P1 to P3. Namely, a step between the first and second pad regions P1 and P2 may be determined by the sum of thicknesses of the third and fourth gate electrode layers 153 and 154 and the fourth and fifth insulating layers 174 and 175. Thus, if heights of the respective gate electrode layers 150 are equal and heights of the second to seventh insulating layers 172 to 177 are equal, the step between the first and second pad regions P1 and P2 may have a height equal to that of the step between the second and third pad regions P2 and P3

Since the plurality of gate electrode layers 150 and the plurality of insulating layers 170 extend to have the substantially same length in the x-axis direction as illustrated in FIG. 9E, the number of times an etching process required to form the plurality of pad regions P1 to P3 is performed may be reduced. Accordingly, the number of times the mask layers M1 to M3 applied to form the plurality of pad regions P1 to P3 are trimmed may also be reduced, and since a larger number of pad regions P1 to P3 are formed with the mask layer M1 having the same volume, process efficiency may be enhanced.

Referring to FIG. 9F, a connection region insulating layer 180 may be provided on the pad regions P1 to P3. The connection region insulating layer 180 may include a material identical to that of the plurality of insulating layers 170, and in particular, the connection region insulating layer 180 may include a material having etch selectivity with a conductive material included in the gate electrode layers 150. In a manufacturing method according to example embodiments, after a peripheral circuit region is formed, a cell array region C and the connection region D may be formed. In this case, heights of the cell array region C, the connection region D, and the peripheral circuit region may become equal through a process of forming and planarizing the connection region insulating layer 180.

After the connection region insulating layer 180 is formed, a channel region 130 may be formed as illustrated in FIG. 9G. In order to form the channel region 130, an opening may be formed to penetrate through the plurality of insulating layers 170 and the plurality of gate electrode layers 150 in the z-axis direction. The opening may be provided in plural, and the plurality of openings may be disposed in a zigzag form to be spaced apart from one another on the x-y plane. The plurality of openings may be formed by exposing only a region in which a plurality of openings are to be formed by a mask layer, and anisotropic-etching the exposed region, similar to the method of forming the plurality of pad regions P1 to P3. Each of the plurality of openings may expose an upper surface of the substrate 110 or have a desired (and/or alternatively predetermined) depth in the substrate 110.

A blocking layer 162', an electric charge storage layer 164', and a tunneling layer 166' may be formed on inner and lower surfaces of each of the plurality of openings by using ALD or CVD. The blocking layer 162', the electric charge storage layer 164', and the tunneling layer 166' may be sequentially stacked on regions adjacent to the plurality of gate electrode layers 150 and the plurality of insulating layers 170, and the channel region 130 may be formed at an inner side of the tunneling layer 166'. The blocking layer 162', the electric charge storage layer 164', and the tunneling layer 166' may constitute a gate insulating layer 160'.

The channel region 130 may be formed to have a desired (and/or alternatively predetermined) thickness, for example, a thickness ranging from 1/50 to 1/5 of a width of each of the plurality of openings, and may be formed through ALD or CVD in a manner similar to that of the gate insulating layer 160'. Meanwhile, at a bottom of each of the openings, the channel region 130 may be in direct contact with the substrate 110 and be electrically connected thereto.

The interior of the channel region 130 may be filled with a buried insulating layer 120. Optionally, before forming the buried insulating layer 120, hydrogen annealing may be performed to heat-treat the structure of the channel region 130 under a gas atmosphere including hydrogen or heavy hydrogen. A large portion of crystal defects existing in the channel region 130 may be eliminated by the hydrogen annealing process.

A planarization process may be performed to remove an unnecessary semiconductor material and an insulating material covering the connection region insulating layer 180 in the uppermost portion. Then, an upper portion of the buried insulating layer 120 may be removed by using an etching process, or the like, and a material for forming a conductive layer 195 may be deposited in a position corresponding to the upper portion of the buried insulating layer 120 which has been removed. A planarization process may be performed again to form the conductive layer 195.

This structure is based on FIG. 5, which may be different from FIGS. 4 and 8A through 8O. Namely, in the example embodiments illustrated in FIGS. 4 and 8A through 8O, the plurality of insulating layers 170 and the sacrificial layers 140 are stacked on the substrate 110, and the sacrificial layers 140 may be removed to form the horizontal openings Th. Then, the gate electrode layers 150 are formed within the horizontal openings Th, and thus, the blocking layers 162 are formed within the horizontal openings Th to surround the gate electrode layers 150. In comparison thereto, in FIG. 5, since the channel region 130 is formed in a state in which the plurality of gate electrode layers 150 and the plurality of insulating layers 170 are stacked, all of the blocking layer 162', the electric charge storage layer 164', and the tunneling layer 166' included in the gate insulating layer 160' may have a cylindrical shape extending in the z-axis direction, similar to the channel region 130.

After the channel region 130 is formed, an etching process may be performed in the z-axis direction parallel to the channel region 130 to form a plurality of vertical openings 211 to 216 (210) for forming contact plugs 200, as illustrated in FIG. 9H. The etching process performed to form the plurality of vertical openings 210 may include a process of forming a mask layer having open regions corresponding to the vertical openings 210 and a process of selectively etching the connection region insulating layer 180 and the plurality of insulating layers 170 with respect to the plurality of gate electrode layers 150. By selectively etching only materials included in the connection region insulating layer 180 and the plurality of insulating layers 170 with respect to a material included in the plurality of gate electrode layers 150, the plurality of vertical openings 210 extending to the gate electrode layers 152, 154, and 156 positioned in upper portions in each of the pad regions P1 to P3 in the z-axis direction may be formed, as illustrated in FIG. 9H.

Similar to the case of FIG. 8J, a distance between vertical openings connected to the gate electrode layers 150 and adjacent to each other in the x-axis direction in the same pad region may be smaller than a distance between vertical openings 210 connected to the gate electrode layers 150 and adjacent to each other in the x-axis direction in different pad regions. For example, a distance between the first and second vertical openings 211 and 212 may be smaller than a distance between the second and third vertical openings 212 and 213.

Since the vertical openings 210 connected to two gate electrode layers 150 are formed in each of the pad regions P1 to P3, an area of the entirety of the plurality of pad regions may be reduced, compared to a case in which only a single vertical opening 150 connected to a single gate electrode layer 150 is formed in each of the pad regions P1 to P3. Compared to a case in which the pad regions P1 to P3, the gate electrode layers 150, and the vertical openings 210 are generally matched in a one-to-one manner, a margin of the pad regions P1 to P3 required for connecting a single gate electrode layer 150 to a single vertical opening 210 may be reduced, reducing an area of the pad regions P1 to P3 and thus increasing a degree of integration.

Referring to FIG. 9I, a mask layer Ma for an additional etching process may be provided on the vertical openings 210, and partial regions of the mask layer Ma corresponding to partial vertical openings 211, 213, and 215 may be opened. The mask layer Ma may be an amorphous carbon layer (ACL), and openings 211, 213, and 215 may be additionally etched through the open regions. Thus, as illustrated in FIG. 9J, lengths of the first, third, and fifth vertical openings 211, 213, and 215 may be increased to extend to the first, third, and fifth gate electrode layers 151, 153, and 155. The additional etching process may include a process of selectively etching the gate electrode layers 150 and the insulating layers 170 by using the mask layer Ma.

After the mask layer Ma is removed, plug insulating layers 221 to 226 may be formed within the respective vertical opening 210, as illustrated in FIG. 9K. The plug insulating layers 221-226 may include a material having excellent step coverage and, in particular, insulating properties. During the process of forming the plug insulating layers 221-226, a portion of a material included in the plug insulating layers 221-226 may be deposited on lower surfaces of the vertical openings 210, and the material deposited on the lower surfaces of the vertical openings 210 may be removed through a spacer etching process. Thus, as illustrated in FIG. 9L, the plug insulating layers 221-226 may be formed only on the inner lateral surfaces of the vertical openings 210. As described above with reference to FIGS. 8M and 8N, the plug insulating layers 221-226 may be formed only on the inner lateral surfaces of the first, third, and fifth vertical openings 211, 213, and 215.

Referring to FIG. 9M, contact plugs 201 to 206 (200) including a conductive material may be formed within the plurality of vertical openings 210 on which the plug insulating layers 221-226 are formed. As described above, since the plug insulating layers 221-226 including an insulating material are formed only within the respective vertical openings 210, not on lower surfaces thereof, the contact plugs 200 may each be electrically connected to the gate electrode layers 150. In particular, partial contact plugs 201, 203, and 205 penetrating through partial gate electrode layers 150 may be electrically insulated from the partial gate electrode layers 152, 154, and 156, respectively. Namely, the first, third, and fifth contact plugs 201, 203, and 205 may be electrically insulated from the second, fourth, and sixth gate electrode layers 152, 154, and 156 by the plug insulating layers 221, 223, and 225, and may be electrically connected to the first, third, and fifth gate electrode layers 151, 153, and 155.

Referring to FIG. 9N, a plurality of connection lines 231 to 236 (230) may be formed on the plurality of contact plugs 200. The plurality of connection lines 230 may be formed in a direction parallel to the bit lines 190 or in a direction perpendicular to the direction in which the plurality of gate electrode layers 150 extend, and may electrically connect a portion of the gate electrode layers 150 formed at the same height in the z-axis direction.

FIGS. 10A through 10J are cross-sectional views illustrating a method of manufacturing the memory device illustrated in FIG. 6 according to example embodiments.

For example, FIGS. 10A through 10J are cross-sectional views of FIG. 6 viewed in the y-axis direction, based on which manufacturing processes in a connection region D will be mainly described.

Referring to FIG. 10A, a plurality of insulating layers 171 to 177 (170) and a plurality of sacrificial layers may be alternately stacked on an upper surface of a substrate 110 and subsequently etched to form pad regions P1 and P2. Also, after a connection region insulating layer 180 is formed on the pad regions P1 and P2, a cylindrical opening penetrating the plurality of insulating layers 170 and the plurality of sacrificial layers may be prepared to form a channel region 130. A tunneling layer 166 and an electric charge storage layer 164 may be disposed outside of the channel region 130. The sacrificial layers may be removed to form horizontal openings Th, as illustrated in FIG. 10A.

Referring to FIG. 10A, in a memory device 100C according to example embodiments, a step between the pad regions P1 and P2 may be determined by the sum of thicknesses of the plurality of insulating layers 170 and the vertical openings Th. Namely, in a case in which thicknesses of the respective vertical openings are equal, a height of the step between the first and second pad regions P1 and P2 may be determined by adding the sum of thicknesses of the fifth to seventh insulating layers 175 to 177 to three times the thickness of each vertical opening Th.

Figure 10B:
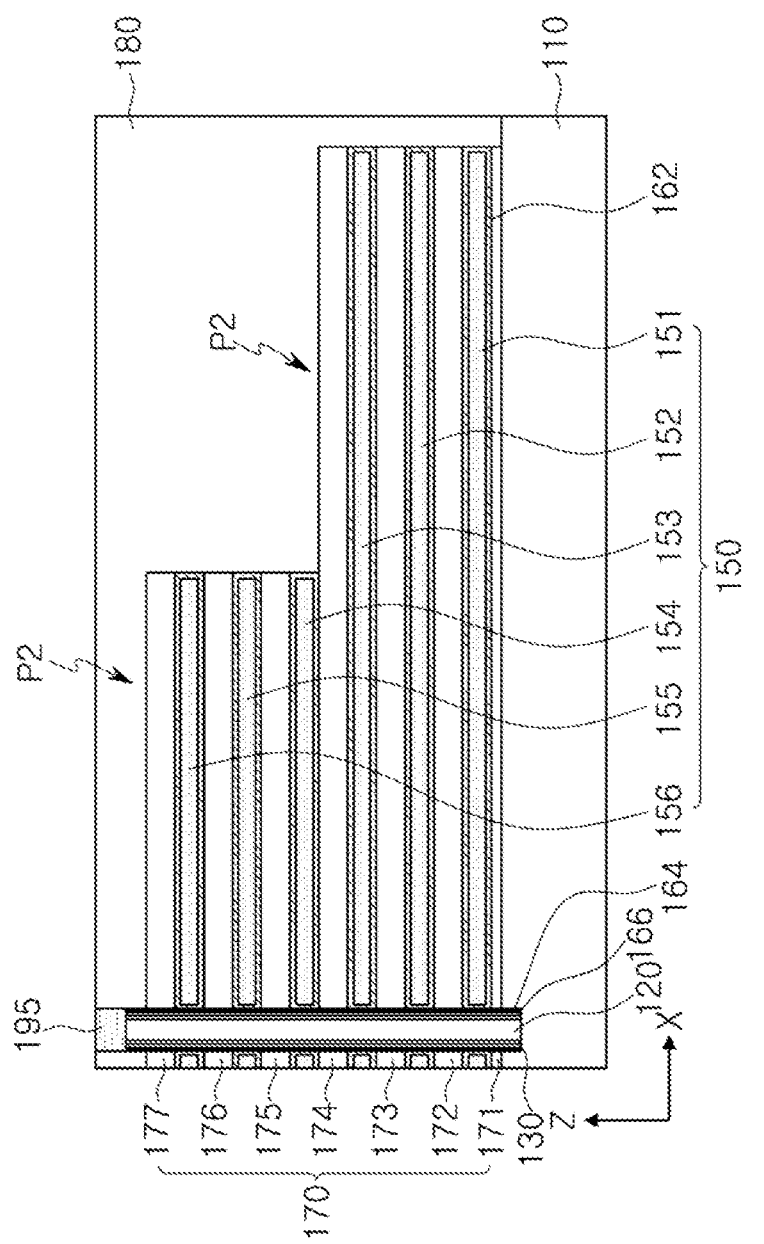
Figure 10C:
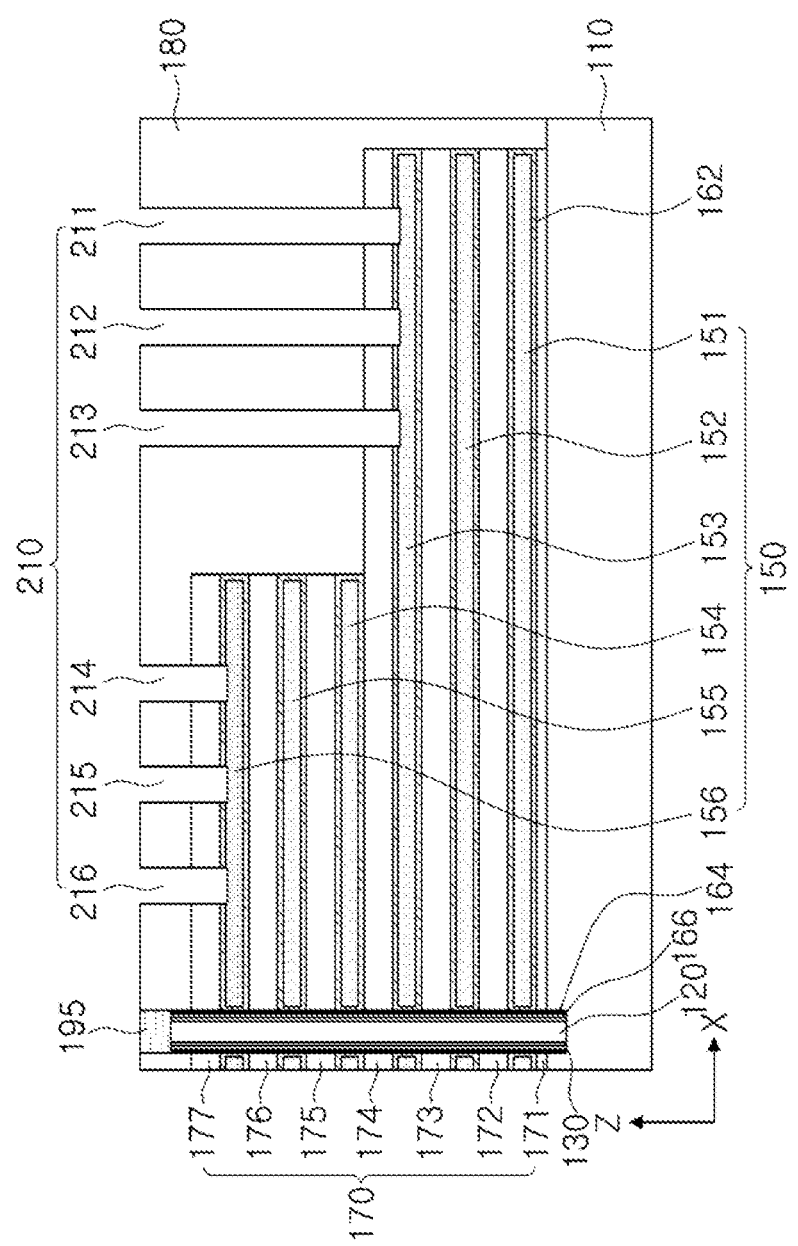

Referring to FIG. 10B, blocking layers 162 and gate electrode layers 150 may be formed within the vertical openings Th. The blocking layers 162 may be deposited through ALD, CVD, or the like, prior to the formation of the gate electrode layers 150. The blocking layers 162 may constitute a gate insulating layer 160 together with an electric charge storage layer 164 and a tunneling layer 166 provided outside of the channel region 130. The gate electrode layers 160 may include a conductive material, for example, tungsten (W).

After the gate electrode layers 150 are formed, an etching process may be performed in the z-axis direction to form a plurality of vertical openings 211 to 216 (210). The etching process performed to form the plurality of vertical openings 210 may include a process of forming a mask layer having open regions corresponding to the vertical openings 210 and a process of selectively etching the connection region insulating layer 180 and the plurality of insulating layers 170 with respect to the plurality of gate electrode layers 150. The first to third vertical openings 211 to 213 may be etched by a depth to reach the third gate electrode layer 153, and the fourth to sixth vertical openings 214 to 216 may be etched by a depth to reach the sixth gate electrode layer 156.

Figure 10D:
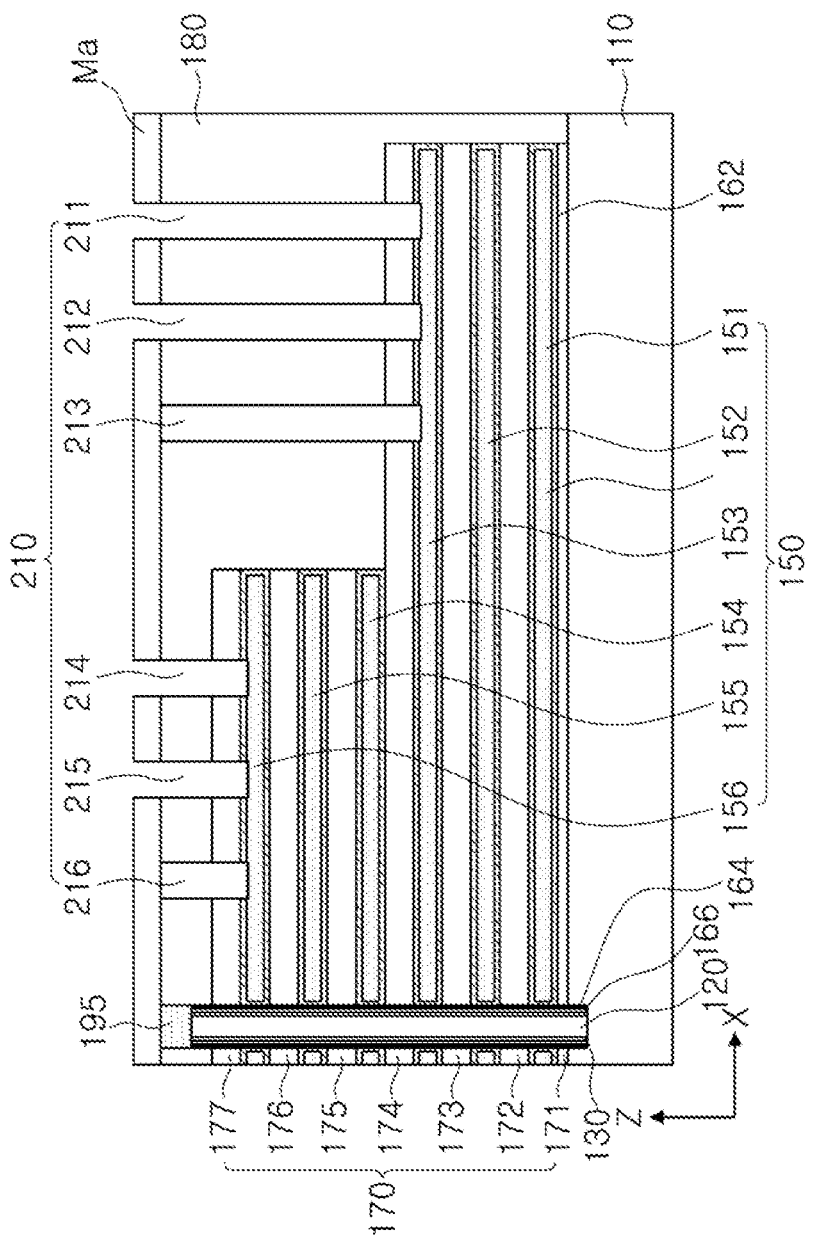
Figure 10E:
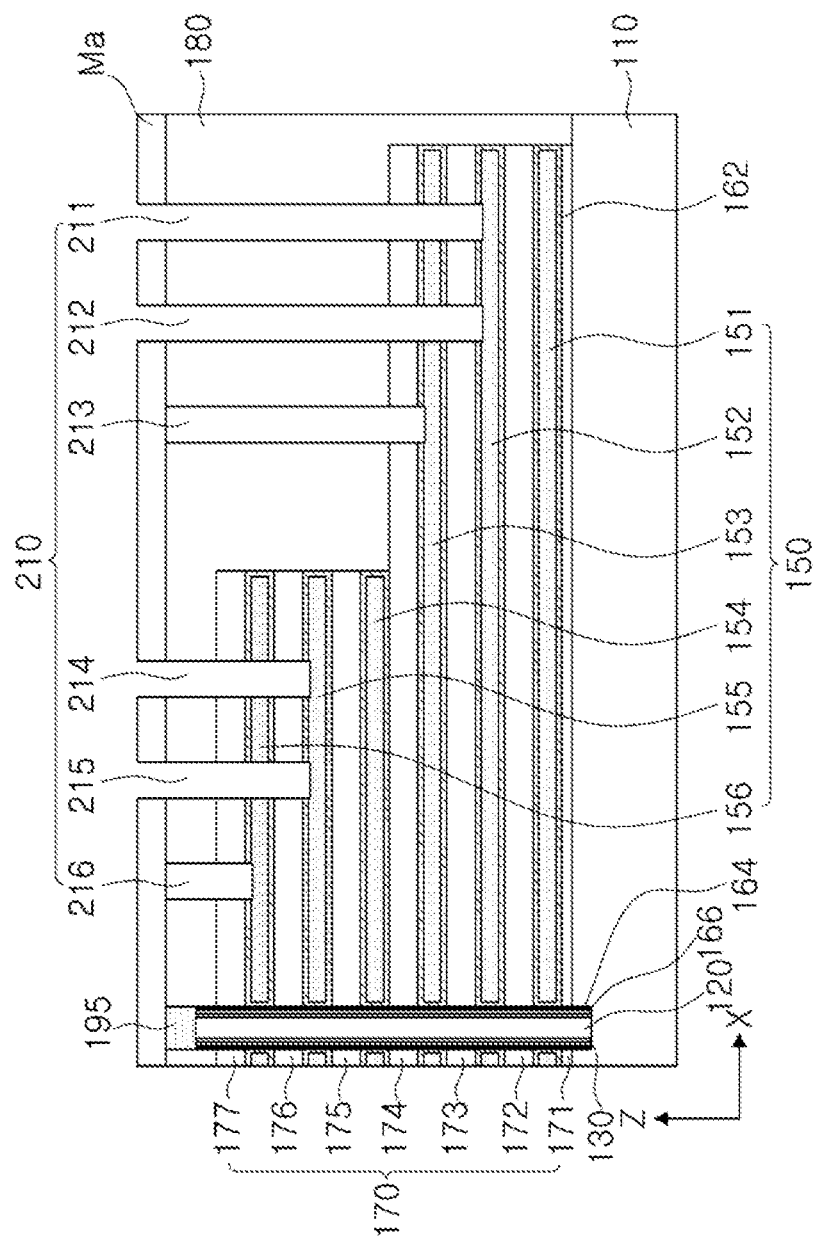

Referring to FIG. 10D, a mask layer Ma may be additionally disposed on the vertical openings 210, and regions corresponding to partial vertical openings 211, 212, 214, and 215 may be opened. A conductive material may later be introduced to the interior of the vertical openings 210 to form contact plugs, and here, since the contact plugs need to be connected to the gate electrode layers in a one-to-one manner, depths of partial vertical openings 211, 212, 214, and 215 may be increased through an additional etching process. Referring to FIG. 10E, the first, second, fourth, and fifth vertical openings 211, 212, 214, and 215 may be additionally etched, the first and second vertical openings 211 and 212 may be etched to reach the second gate electrode layer 152, and the fourth and fifth vertical openings 214 and 215 may be etched to reach the fifth vertical opening 155.

Figure 10F:
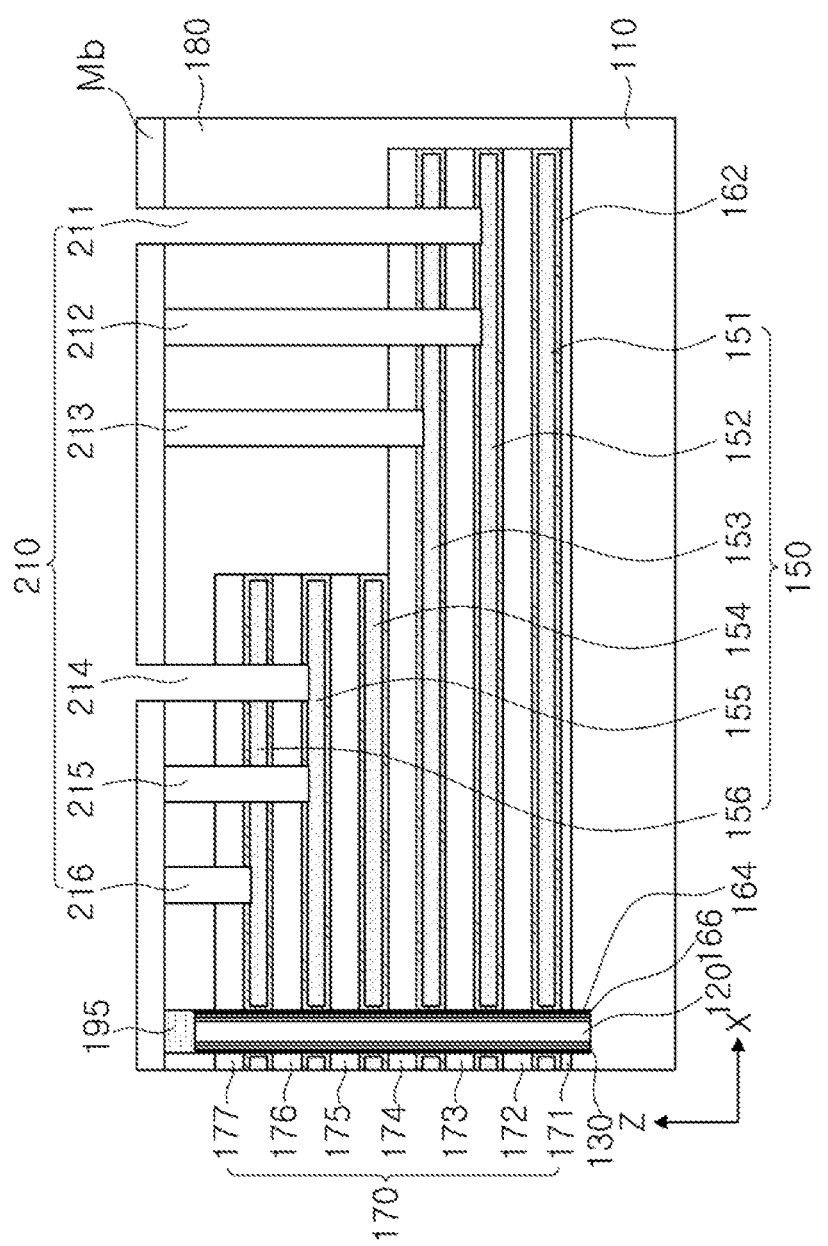
Figure 10G:
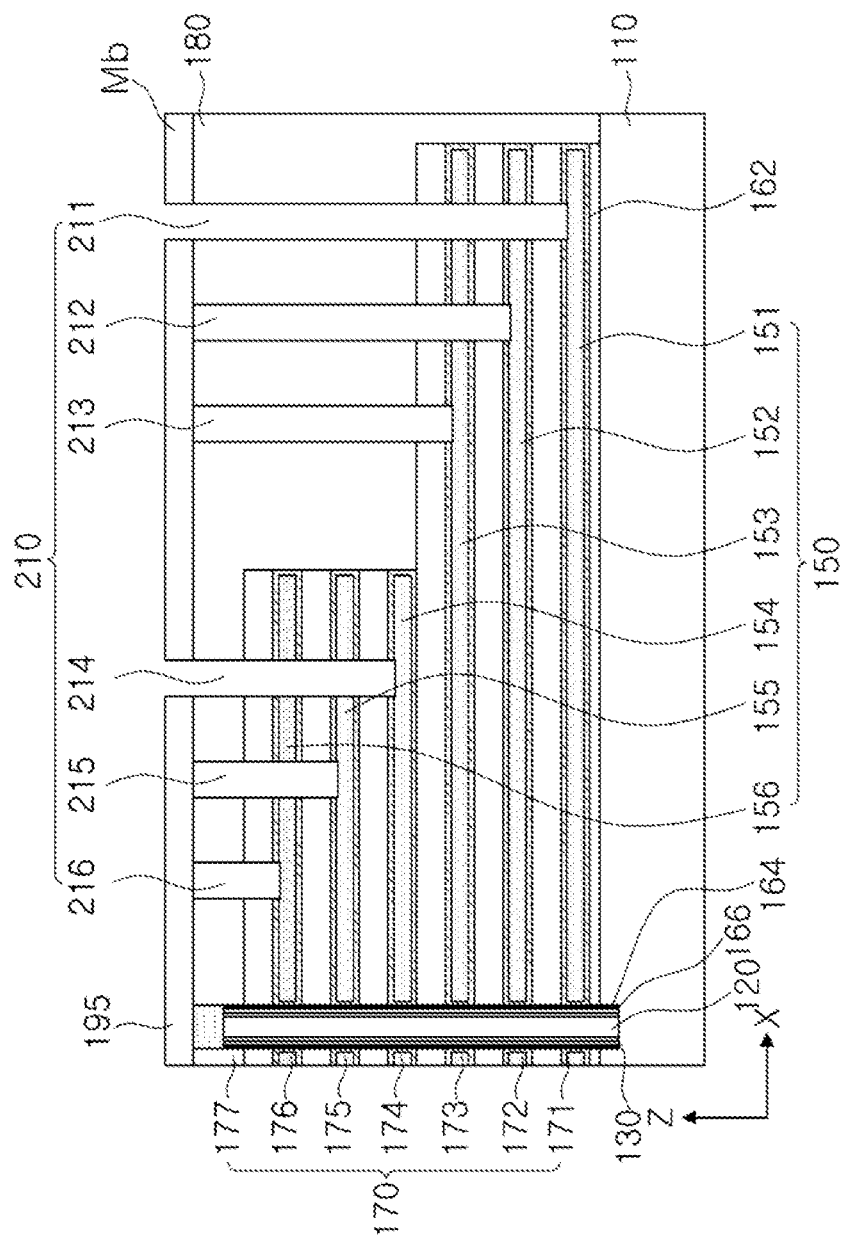

As illustrated in FIG. 10F, partial open regions corresponding to the second and fifth vertical openings 212 and 215 may be covered to form a mask layer Mb only opening regions corresponding to the first and fourth vertical openings 211 and 214. The first and fourth vertical openings 211 and 214 may be additionally etched to reach the first to fourth gate electrode layers 151 and 154, and thus, each of the plurality of vertical openings 210 may have a depth reaching the plurality of gate electrode layer 150.

Figure 10H:
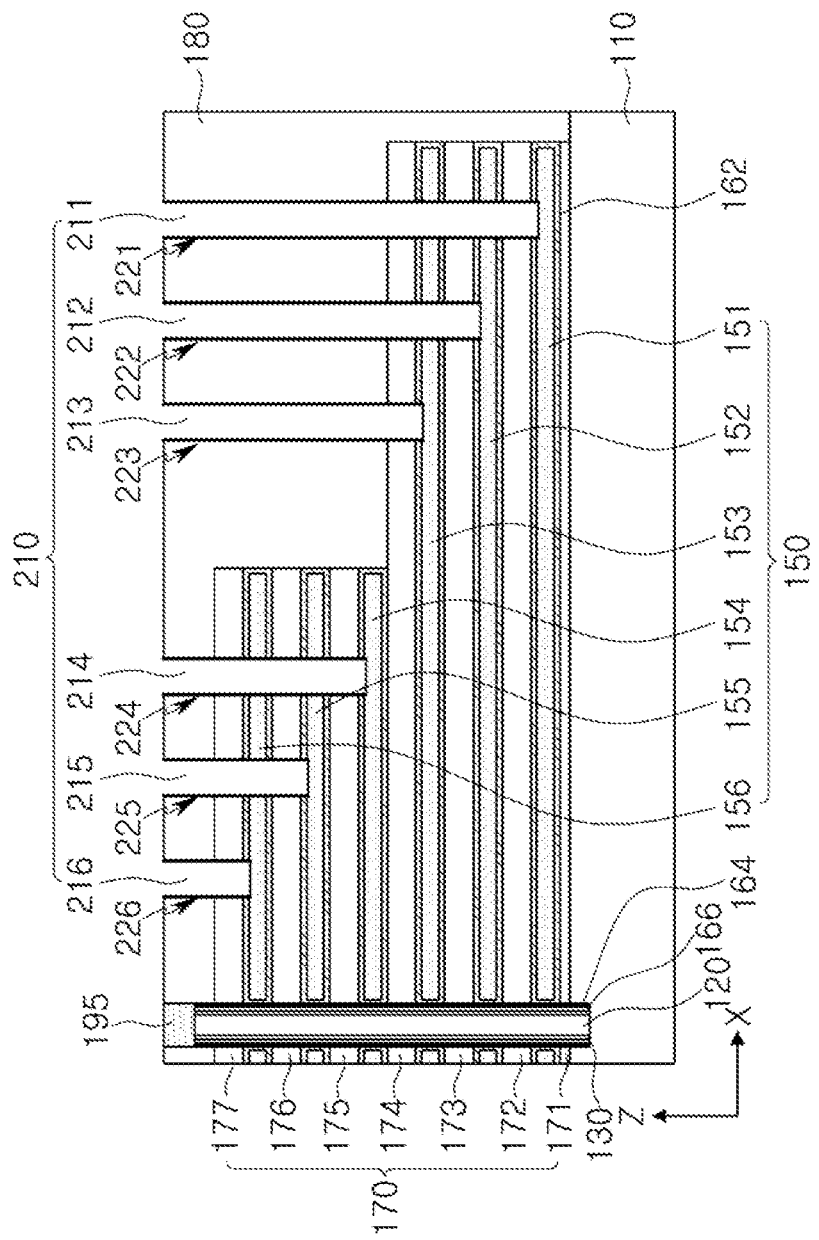

Referring to FIG. 10H, plug insulating layers 221 to 226 may be formed in inner lateral surfaces of the plurality of vertical openings 210. The plug insulating layers 221-226 may include a material having excellent step coverage and, in particular, insulating properties. During the process of forming the plug insulating layers 221-226, a portion of a material included in the plug insulating layers 221-226 may be deposited on lower surfaces of the vertical openings 210, and the material deposited on the lower surfaces of the vertical openings 210 may be removed through a spacer etching process.

Figure 10I:
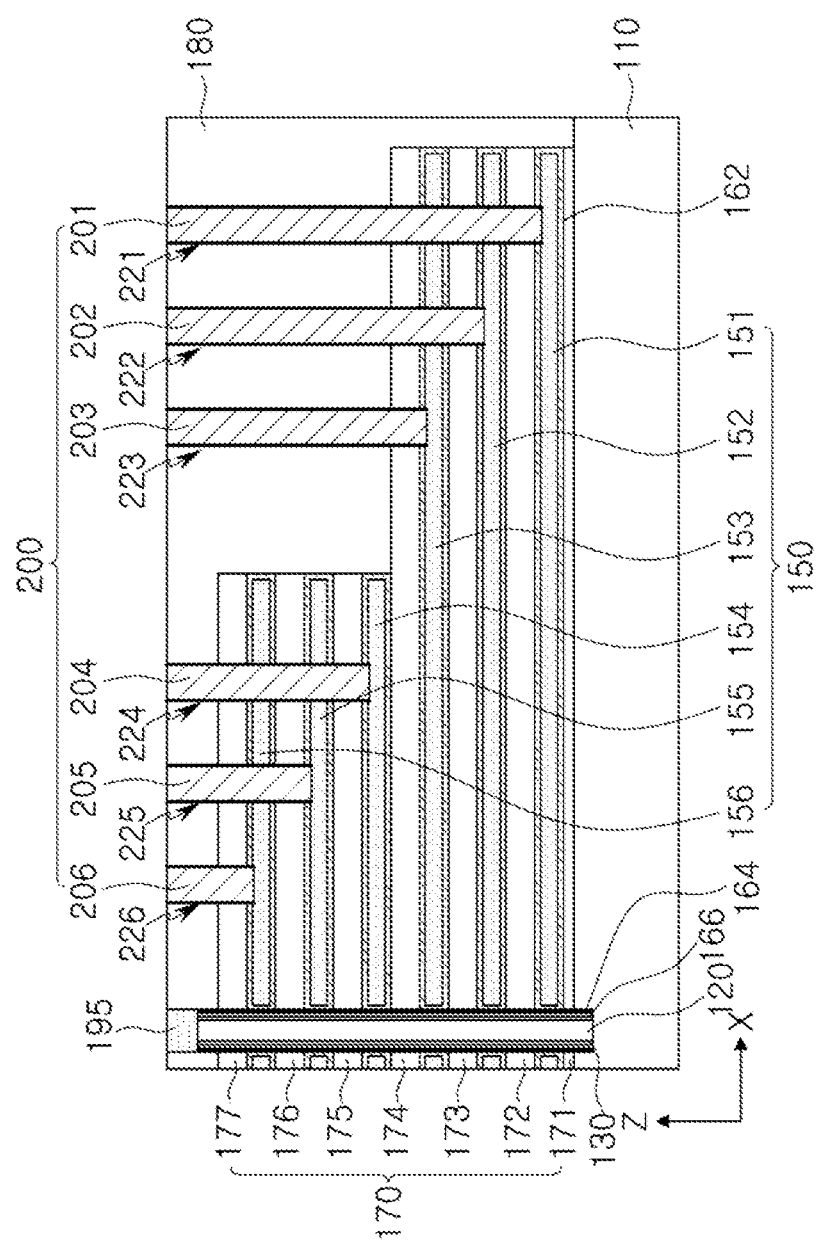

After the formation of the plug insulating layers 221-226, a conductive material is injected into the plurality of vertical openings 200 to form a plurality of contact plugs 201 to 206 (200), as illustrated in FIG. 10I. Each of the plurality of contact plugs 200 may be connected only to a single gate insulating layer 150 by means of the plug insulating layers 221-226. For example, the fourth contact plug 204 may be electrically separated from the fifth and sixth gate electrodes 155 and 156 by means of the plug insulating layer 224 and electrically connected only to the fourth gate electrode 154. Similarly, the second contact plug 202 may be electrically separated from the third gate electrode layer 153 by means of the plug insulating layer 222 and electrically connected to the second gate electrode layer 152.

Figure 10J:
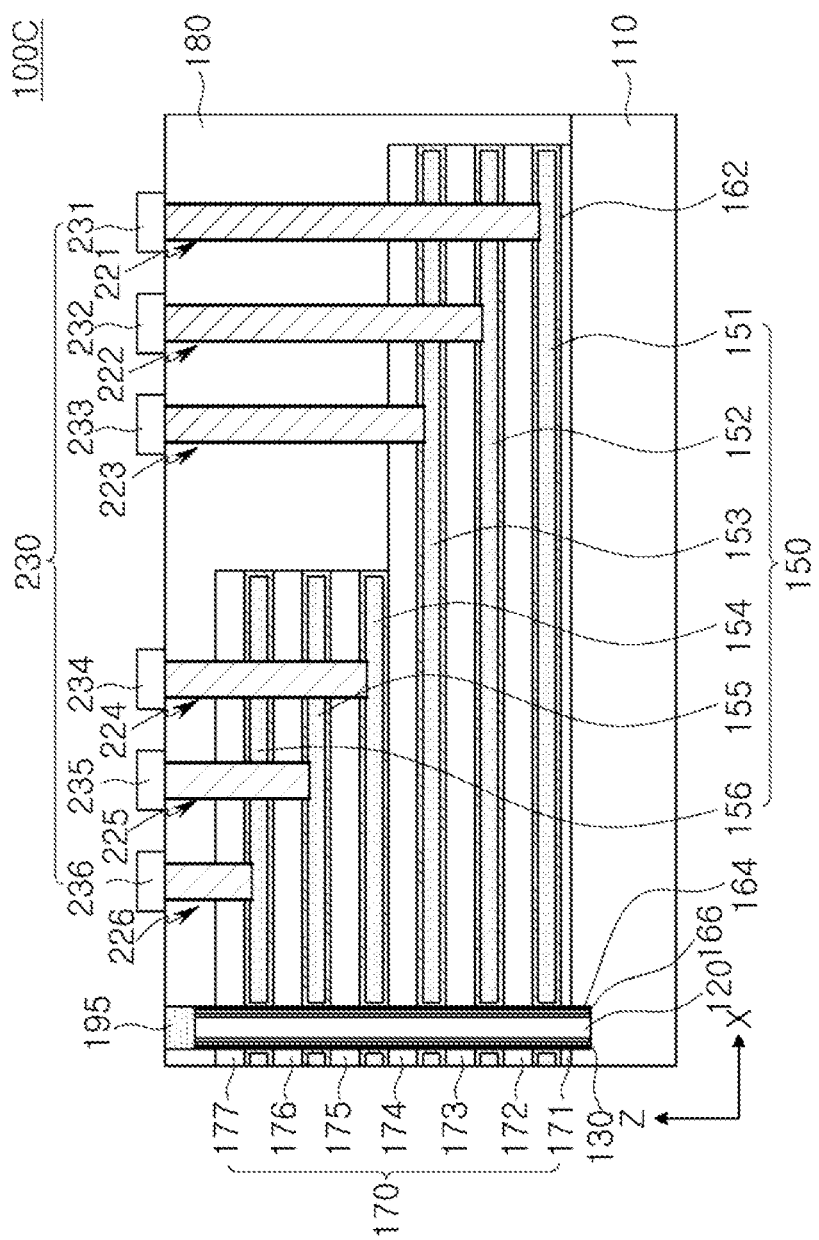

Referring to FIG. 10J, a plurality of connection lines 231 to 236 (230) may be formed on the plurality of contact plugs 200. The plurality of connection lines 230 may be formed in a direction parallel to the bit lines 190 or in a direction perpendicular to the direction in which the plurality of gate electrode layers 150 extend, and may electrically connect a portion of the gate electrode layers 150 formed at the same height in the z-axis direction.

In FIGS. 10A through 10J, the step between the adjacent pad regions P1 and P2 may be formed by three gate electrode layers 150 extending by the same length in the x-axis direction, and thus, the number of times an etching process to form the pad regions P1 and P2 is performed by using a mask layer may be further reduced, compared to FIGS. 8 and 9. The contact plugs 200 connected to the same number of gate electrode layers 150 may be formed with the pad regions P1 and P2 having an area smaller than that of FIGS. 8 and 9.

Figure 11:
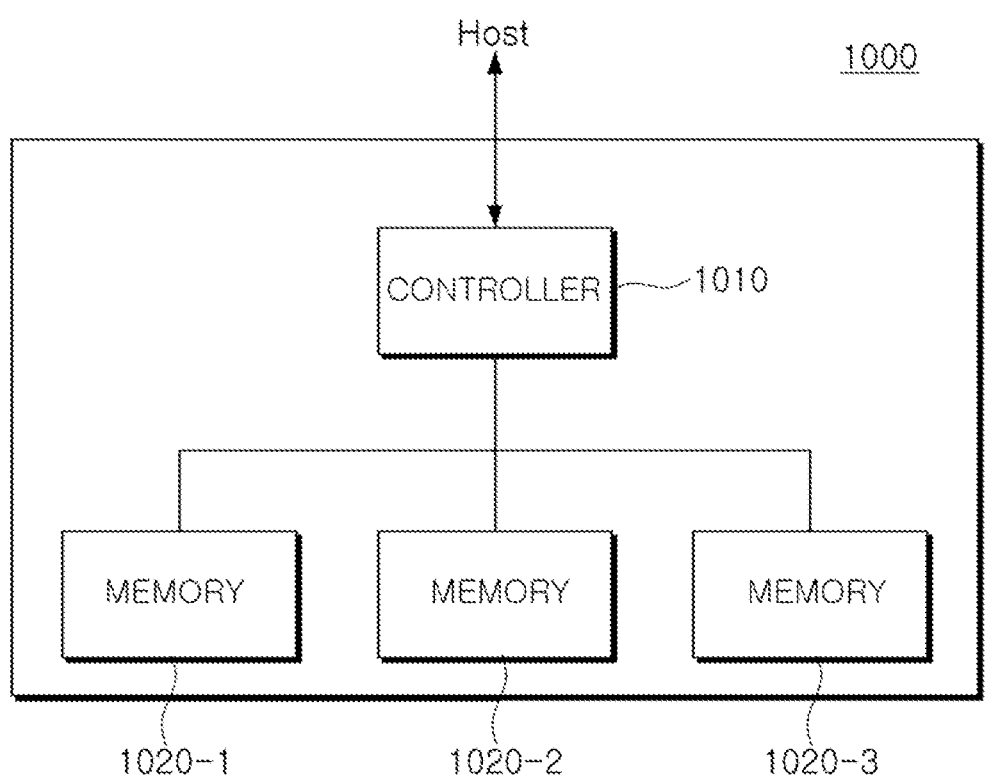
FIGS. 11 and 12 are block diagrams illustrating electronic devices including a memory device according to example embodiments.

FIG. 11 is a block diagram illustrating a storage device including a memory device according to example embodiments.

Referring to FIG. 11, a storage device 1000 may include a controller 1010 communicating with a host HOST and memories 1020-1, 1020-2, and 1020-3 configured to store data. Each of the memories 1020-1, 1020-2, and 1020-3 may include the memory devices according to example embodiments described above with reference to FIGS. 1 through 7.

The host HOST communicating with the controller 1010 may be various electronic devices in which the storage device 100 is installed. For example, the host HOST may be a smartphone, a digital camera, a desktop computer, a laptop computer, a media player, or the like. When a data write or read request is received from the host HOST, the controller 1010 may store data in the memories 1020-1, 1020-2, and 1020-3 or generate a command CMD to retrieve data from the memories 1020-1, 1020-2, and 1020-3.

As illustrated in FIG. 11, one or more memories 1020-1, 1020-2, and 1020-3 may be connected to the controller 1010 in parallel within the storage device 1000. By connecting the plurality of memories 1020-1, 1020-2, and 1020-3 to the controller 1010 in parallel, the storage device 1000 having large capacity, such as a solid state drive (SSD), may be implemented.

Figure 12:
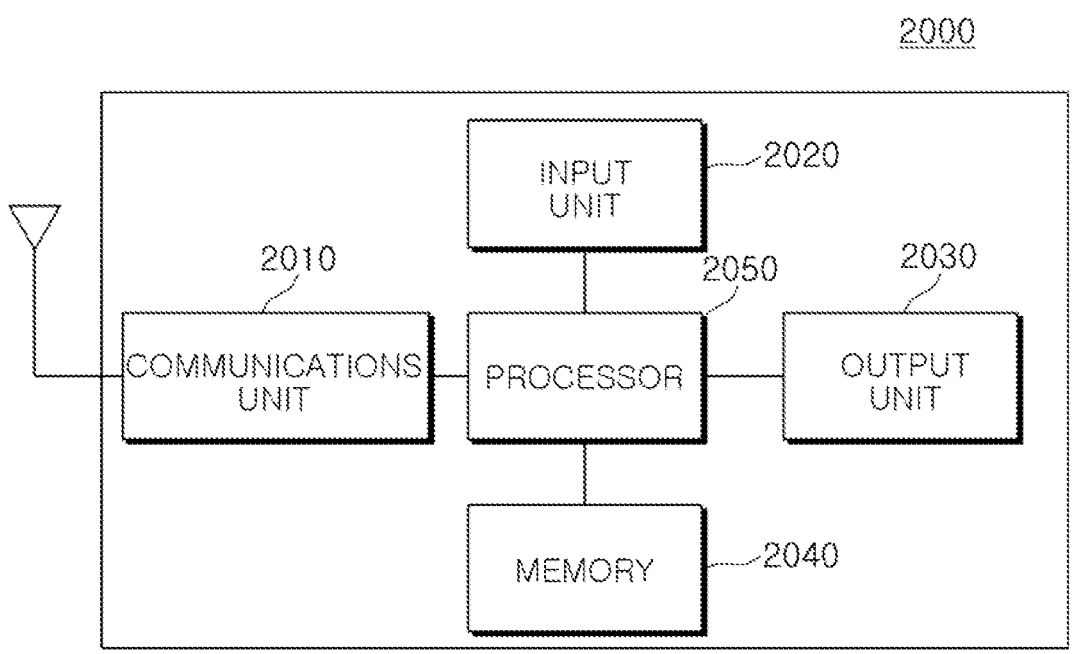

FIG. 12 is a block diagram illustrating an electronic device including a memory device according to example embodiments.

Referring to FIG. 12, an electronic device 2000 according to example embodiments may include a communications unit 2010, an input unit 2020, an output unit 2030, at least one memory 2040, and a processor 2050.

The communications unit 2010 may include a wired/wireless communications module, and may include a wireless Internet module, a short-range communications module, a global positioning system (GPS) module, a mobile communications module, and the like. A wired/wireless communications module included in the communications unit 2010 may be connected to an external communication network based on various communication standards to transmit and receive data.

The input unit 2010, provided to allow a user to control an operation of the electronic device 2000, may include a mechanical switch, a touchscreen, a voice recognition module, and the like. Also, the input unit 2010 may include a mouse operating in a track ball or a laser pointer manner, or the like, or a finger mouse device. In addition, the input unit 2020 may further include various sensor modules allowing the user to input data.

The output unit 2030 outputs information processed in the electronic device 2000 in an audio or video format, and the memory 2040 may store a program for processing and controlling the processor 2050, data, or the like. The memory 2040 may include at least one of the memory devices according to example embodiments as described above with reference to FIGS. 1 through 7. The processor 2050 may deliver a command to the memory 2040 according to a necessary operation in order to store data to the memory 2040 or retrieve data therefrom.

The memory 2040 may be installed in the electronic device 2000 or communicate with the processor 2050 through a separate interface. In the case in which the memory 2040 communicates with the processor 2050 through a separate interface, the processor 2050 may store data to the memory 2040 or retrieve data therefrom through various interface standards such as SD, SDHC, SDXC, MICRO SD, USB, or the like.

The processor 2050 controls operations of respective components included in the electronic device 2000. The processor 2050 may perform controlling and processing related to an audio call, a video call, data communication, and the like, or may perform controlling and processing for multimedia playback and management. Also, the processor 2050 may process an input delivered from the user through the input unit 2020 and output corresponding results through the output unit 2030. Further, the processor 2050 may store data required for controlling an operation of the electronic device 2000 to the memory 2040 or retrieve such data therefrom.

As set forth above, according to example embodiments, in forming a pad region in which contact plugs are connected to gate electrode layers based on a step structure, a single pad region may be formed by simultaneously etching a plurality of gate electrode layers, whereby the number of times a mask layer having the same volume is used may be increased and intervals between the contact plugs may be reduced in forming the pad region. Thus, a memory device having an improved degree of integration and process efficiency may be provided.

While some example embodiments have been particularly shown and described, it will be understood by one of ordinary skill in the art that variations in form and detail may be made therein without departing from the spirit and scope of the claims.

What is claimed is:
1. A memory device, comprising:
a substrate;
a channel region on the substrate, the channel region extending in a direction perpendicular to an upper surface of the substrate;
a plurality of gate electrode layers stacked on each other on the substrate, the plurality of gate electrode layers being adjacent to the channel region and extending in one direction to define a pad region, and the plurality of gate electrode layers including first and second gate electrode layers; and
a plurality of contact plugs connected to the plurality of gate electrode layers in the pad region, at least one of the plurality of contact plugs being electrically insulated from the first gate electrode layer and electrically connected to the second gate electrode layer by penetrating through the first gate electrode layer.

2. The memory device of claim 1, wherein the first gate electrode layer is on the second gate electrode layer.

3. The memory device of claim 1, wherein the first and second gate electrode layers extend substantially a same length in the one direction to define the pad region.

4. The memory device of claim 3, wherein the first and second gate electrode layers define a single pad region.

5. The memory device of claim 1, wherein the pad region includes a plurality of pad regions having a stepped structure.

6. The memory device of claim 5, wherein
each of the plurality of pad regions is defined by a same number of the plurality of gate electrode layers,
the plurality of gate electrode layers in a same pad region extend substantially a same length in the one direction, and
the plurality of gate electrode layers in different pad regions extend different lengths in the one direction.

7. The memory device of claim 5, wherein
an interval between two adjacent contact plugs among the contact plugs connected to the gate electrode layers in a same pad region among the plurality of pad regions is smaller than an interval between two adjacent contact plugs among the contact plugs connected to the gate electrode layers in different pad regions among the plurality of pad regions.

8. The memory device of claim 1, further comprising:
plug insulating layers surrounding the plurality of contact plugs.

9. The memory device of claim 8, wherein one of the plug insulating layers is between the at least one of the plurality of contact plugs and the first gate electrode layer penetrated by the at least one of the plurality of contact plugs.

10. The memory device of claim 8, wherein each one of the plug insulating layers only surrounds a lateral surface of a corresponding one of the plurality of contact plugs.

11. A memory device, comprising:
a substrate;
a channel region on a cell array region of the substrate, the channel region extending in a direction perpendicular to an upper surface of a substrate;
a plurality of gate electrode layers stacked on each other on the substrate, the plurality of gate electrode layers being adjacent to the channel region, the plurality of gate electrode layers extending one direction over the cell array region to above a connection region of the substrate; and
a plurality of pad regions having a stepped structure, the plurality of pad regions being defined by end portions of the plurality of gate electrode layers that extend in the one direction above the connection region, each one of the plurality of pad regions being defined by the end portions of gate electrode layers that are adjacent to each other in the direction perpendicular to the upper surface of the substrate and extend substantially a same length in the one direction; and
a plurality of contact plugs connected to the plurality of pad regions of the plurality of gate electrode layers.

12. The memory device of claim 11, wherein at least two steps in the stepped structure of the plurality of pad regions have substantially a same height.

13. The memory device of claim 12, wherein each of the plurality of pad regions is defined by a same number of the end portions of the plurality of gate electrode layers extending in the one direction.

14. The memory device of claim 11, wherein steps in the stepped structure of the plurality of pad regions have different heights.

15. The memory device of claim 14, wherein each of the plurality of pad regions is defined by a different number of the end portions of the plurality of gate electrode layers extending in the one direction.

16. A memory device comprising:
a substrate;
channel regions extending vertically on the substrate gate electrode layers stacked on top of each other on the substrate,
the gate electrode layers insulated from each other, the gate electrode layers defining openings through which the channel regions extend, the gate electrode layers including a first gate electrode layer and a second gate electrode layer that have portions extending a first distance from a same one of the channel regions;
conductive plugs on the substrate, the conductive plugs including a first conductive plug electrically connected to the portion of the first gate electrode layer, the first conductive plug extending vertically through the portion of the second gate electrode layer and being insulated from the second gate electrode layer.

17. The memory device of claim 16, further comprising:
bit lines connected to the channel regions and crossing over the gate electrode layers;
connection lines connected to the conductive plugs and crossing over the gate electrode layers;
tunneling layers surrounding the channel regions;
electric charge storage layers surrounding the tunneling layers in the openings defined by the gate electrode layers; and
blocking layers surrounding the electric charge storage layers or the gate electrode layers.

18. The memory device of claim 16, wherein
the gate electrode layers further include a third gate electrode layer on the second gate electrode layer and a fourth gate electrode layer on the third gate electrode layer,
a portion of the fourth gate electrode layer extends a second distance from the same one of the channel regions,
a portion the third gate electrode layer extends one of the first and second distances from the same one of the channel regions,
the second distance is less than the first distance, and
the conductive plugs include second to fourth conductive plugs electrically connected to the portions of the second to fourth gate electrode layers, respectively.

19. The memory device of claim 18, wherein
the portion of the third gate electrode layer extends the second distance from the same one of the channel regions,
the third conductive plug extends vertically through the portion of the fourth gate electrode layer, and
the third conductive plug is electrically insulated from the fourth gate electrode layer.

20. The memory device of claim 16, wherein
the gate electrode layers include a lowermost gate electrode layer between the first gate electrode layer and the substrate, and
the lowermost gate electrode layer extends further from the same one of the channel regions than the first distance.

* * * * *